(12) United States Patent
Krähmer et al.

(10) Patent No.: US 7,180,667 B2
(45) Date of Patent: Feb. 20, 2007

(54) OBJECTIVE WITH FLUORIDE CRYSTAL LENSES

(75) Inventors: Daniel Krähmer, Aalen (DE); Toralf Gruner, Aalen-Hofen (DE); Wilhelm Ulrich, Aalen (DE); Birgit Enkisch, Aalen (DE); Michael Gerhard, Aalen (DE); Martin Brunotte, Aalen (DE); Christian Wagner, KS Eersel (NL); Winfried Kaiser, Aalen (DE); Manfred Maul, Aalen (DE); Christof Zaczek, Heubach (DE)

(73) Assignee: Carl Zeiss SMT AG (DE)

( * ) Notice: Subject to any disclaimer, the term of this patent is extended or adjusted under 35 U.S.C. 154(b) by 98 days.

(21) Appl. No.: 10/817,527

(22) Filed: Apr. 1, 2004

(65) Prior Publication Data

US 2004/0190151 A1  Sep. 30, 2004

Related U.S. Application Data

(60) Division of application No. 10/367,989, filed on Feb. 12, 2003, which is a continuation of application No. PCT/EP02/05050, filed on May 8, 2002.

(30) Foreign Application Priority Data

| May 15, 2001 | (DE) | ................................ 101 23 725 |
| May 15, 2001 | (DE) | ................................ 101 23 727 |
| May 23, 2001 | (DE) | ................................ 101 25 487 |
| Jun. 6, 2001  | (DE) | ................................ 101 27 320 |
| Mar. 12, 2002 | (DE) | ................................ 102 10 782 |

(51) Int. Cl.
G02B 5/30 (2006.01)

(52) U.S. Cl. .................... 359/497; 359/499; 359/900; 355/53

(58) Field of Classification Search ................ 359/499, 359/497, 355, 720, 724, 726, 900
See application file for complete search history.

(56) References Cited

U.S. PATENT DOCUMENTS 1,332,410 A   3/1920   Potts (Continued)

FOREIGN PATENT DOCUMENTS

DE   40 22 904   1/1992

(Continued)

OTHER PUBLICATIONS

Burnett, J.H., et al., "Intrinsic birefringence in calcium fluoride and barium fluoride", Physical Review B, vol. 64, No. 24, Dec. 15, 2001, pp. 241102-1-241102-4, XP-002218846.

(Continued)

Primary Examiner—Drew A. Dunn
Assistant Examiner—Derek S. Chapel
(74) Attorney, Agent, or Firm—Fish & Richardson P.C.

(57) ABSTRACT

An objective for a microlithography projection system has at least one fluoride crystal lens. The effects of birefringence, which are detrimental to the image quality, are reduced if the lens axis of the crystal lens is oriented substantially perpendicular to the {100}-planes or {100}-equivalent crystallographic planes of the fluoride crystal. If two or more fluoride crystal lenses are used, they should have lens axes oriented in the (100)-, (111)-, or (110)-direction of the crystallographic structure, and they should be oriented at rotated positions relative to each other. The birefringence-related effects are further reduced by using groups of mutually rotated (100)-lenses in combination with groups of mutually rotated (111)- or (110)-lenses. A further improvement is also achieved by applying a compensation coating to at least one optical element of the objective.

56 Claims, 16 Drawing Sheets

U.S. PATENT DOCUMENTS

| | | | |
|---|---|---|---|
| 2,934,933 A | 5/1960 | Chromy | |
| 4,215,288 A | 7/1980 | Kato et al. | |
| 4,701,606 A | 10/1987 | Tanimoto et al. | |
| 4,993,823 A | 2/1991 | Schaffer, Jr. et al. | |
| 5,042,922 A | 8/1991 | Pepper | |
| 5,625,453 A | 4/1997 | Matsumoto et al. | |
| 5,652,745 A | 7/1997 | Noguchi et al. | |
| 5,677,757 A | 10/1997 | Taniguchi et al. | |
| 5,867,315 A | 2/1999 | Koike et al. | |
| 6,057,970 A | 5/2000 | Kim et al. | |
| 6,201,634 B1 | 3/2001 | Sakuma et al. | |
| 6,324,003 B1 | 11/2001 | Martin | |
| 6,683,710 B2 | 1/2004 | Hoffman et al. | |
| 6,765,717 B2 | 7/2004 | Allan et al. | |
| 6,775,063 B2 | 8/2004 | Shiraishi | |
| 6,782,074 B2 | 8/2004 | Sakuma | |
| 6,782,075 B2 | 8/2004 | Pell | |
| 6,785,051 B2 | 8/2004 | Allan | |
| 6,788,389 B2 | 9/2004 | Fujishima et al. | |
| 6,829,041 B2 | 12/2004 | Unno | |
| 6,879,379 B2 | 4/2005 | Brunotte et al. | |
| 6,963,449 B2 | 11/2005 | Mecking et al. | |
| 7,027,237 B2 | 4/2006 | Mecking et al. | |
| 2003/0000453 A1 | 1/2003 | Unno et al. | |
| 2003/0011893 A1 | 1/2003 | Shiraishi et al. | |
| 2003/0011896 A1 | 1/2003 | Shiraishi | |
| 2003/0012724 A1 | 1/2003 | Burnett et al. | |
| 2003/0021026 A1 | 1/2003 | Allan et al. | |
| 2003/0025894 A1 | 2/2003 | Owa et al. | |
| 2003/0053036 A1 | 3/2003 | Fujishima et al. | |
| 2003/0058421 A1 | 3/2003 | Omura et al. | |
| 2003/0086071 A1 | 5/2003 | McGuire, Jr. | |
| 2003/0086156 A1 | 5/2003 | McGuire, Jr. | |
| 2003/0086157 A1 | 5/2003 | McGuire, Jr. | |
| 2003/0086171 A1 | 5/2003 | McGuire, Jr. | |
| 2003/0099047 A1 | 5/2003 | Hoffman et al. | |
| 2003/0128349 A1 | 7/2003 | Unno | |
| 2003/0168597 A1 | 9/2003 | Webb et al. | |
| 2003/0197946 A1 | 10/2003 | Omura | |
| 2003/0234981 A1 | 12/2003 | Hoffman et al. | |
| 2004/0001244 A1 | 1/2004 | Hoffman et al. | |
| 2004/0008348 A1 | 1/2004 | Kishikawa et al. | |
| 2004/0036961 A1 | 2/2004 | McGuire, Jr. | |
| 2004/0036971 A1 | 2/2004 | McGuire, Jr. | |
| 2004/0036985 A1 | 2/2004 | McGuire, Jr. | |
| 2004/0050318 A1 | 3/2004 | Sakai | |
| 2004/0089023 A1 | 5/2004 | Hiraiwa et al. | |
| 2004/0105170 A1* | 6/2004 | Krahmer et al. | 359/726 |
| 2004/0136084 A1 | 7/2004 | Unno et al. | |
| 2004/0145806 A1 | 7/2004 | McGuire, Jr. | |
| 2004/0156051 A1 | 8/2004 | Takeuchi et al. | |
| 2005/0134967 A1 | 6/2005 | Brunotte et al. | |
| 2005/0157401 A1 | 7/2005 | Goehnermeler et al. | |

FOREIGN PATENT DOCUMENTS

| | | |
|---|---|---|
| DE | 40 22 904 A1 | 1/1992 |
| DE | 19535392 | 3/1997 |
| DE | 19637563 | 3/1998 |
| DE | 19807120 | 8/1999 |
| EP | 0103485 | 3/1984 |
| EP | 0480616 | 4/1992 |
| EP | 0678768 | 10/1995 |
| EP | 0857985 | 8/1998 |
| EP | 0 942 297 A2 | 9/1999 |
| EP | 0952490 | 10/1999 |
| EP | 0961149 | 12/1999 |
| EP | 1014139 | 6/2000 |
| EP | 1063551 | 12/2000 |
| EP | 1063684 | 12/2000 |
| EP | 1115030 | 7/2001 |
| EP | 1 139 138 A1 * | 10/2001 |
| EP | 1139138 | 10/2001 |
| JP | 05-27200 | 2/1993 |
| JP | 09166710 | 6/1997 |
| JP | 11054411 | 9/1997 |
| JP | 11-106296 | 4/1999 |
| JP | 11-106296 A1 | 4/1999 |
| JP | 2000-86394 | 3/2000 |
| JP | 2000331927 | 11/2000 |
| JP | 2001108801 | 4/2001 |
| WO | WO91/14189 | 9/1991 |
| WO | WO/0031592 | 6/2000 |
| WO | WO00/70407 | 11/2000 |
| WO | 01/02799 | 1/2001 |
| WO | WO 01/01182 | 1/2001 |
| WO | WO-01/01182 A1 | 1/2001 |
| WO | WO 01/50171 | 7/2001 |
| WO | WO-01/50171 A1 | 7/2001 |
| WO | WO02/093201 | 11/2002 |
| WO | WO 02/093209 | 11/2002 |
| WO | WO-02/093209 A2 | 11/2002 |
| WO | WO 02/097508 | 12/2002 |
| WO | WO 02/099500 | 12/2002 |
| WO | WO-02/099500 A2 | 12/2002 |
| WO | WO03/003072 | 1/2003 |
| WO | WO03/003429 | 1/2003 |
| WO | WO03/007045 | 1/2003 |
| WO | WO 03/009017 | 1/2003 |
| WO | WO-03/009017 A1 | 1/2003 |
| WO | WO 03/023481 | 3/2003 |
| WO | WO-03/023481 A1 | 3/2003 |
| WO | WO 03/038479 | 5/2003 |
| WO | WO 03/046634 | 6/2003 |
| WO | WO 04/019077 | 3/2004 |

OTHER PUBLICATIONS

Pastmak, J, et al., "Optical anisotropy of Silicon Single Crystals", Pysical Review B (Solid State), Apr. 15, 1971, vol. 3, No. 8, pp. 2567-2571, XP-001109107.

Van Peski, Chris; Memo to PAG Members, "Re: Birefringence of calcium fluoride", May 7, 2001, XP-002218847.

Van Peski, Chris; Memo to Exposure Tool Manufactures and Lens Designers, "Re: Birefringence of Calcium Fluoride", May 7, 2001, XP-002218848.

Burnett, J.H., et al., "Intrinsic Birefringence in 157nm Materials" at 2nd International Symposium on 157nm Lithography in Dana Point, California, May 15, 2001, XP-002218849.

Burnett, J.H., et al., " Symmetry of spatial-dispersion-induced birefringence and its implications for CaF2 ultraviolet optics", J. Microlith., Microfab., Micosyste., vol. 1, No. 3, Oct. 3, 2002, pp. 213-224.

Relation between US20030011893 A1, US20030011896 A1 and WO 02093209.

Burnett et al. "Intrinsic Birefringence in 157 nm Materials." 2nd International Symposium on 157 nm Lithography in Dana Point, CA, May 15, 2001.

Burnett et al. "Intrinsic Birefringence in Calcium Fluoride and Barium Fluoride." Physical Review, B. Condensed Matter, American Institute of Physics. New York, US, Bd. 64, Nr. 24, pp. 241102-1-241102-4, XP002218846, Dec. 15, 2001.

Pastrnak et al. "Optical Anisotropy of Silicon Single Crystals." Physical Review B (Solid State). US, Bd. 3, Nr. 8, pp. 2567-2571, XP-001109107, Apr. 15, 1971.

Van Peski. Memo to Exposure Tool Manufactures and Lens Designers re: Birefringence of Calcium Fluoride. XP-002218848, May 7, 2001.

Van Peski. Memo to PAG Members re: Birefringence of Calcium Fluoride. XS-002218847, May 7, 2001.

Burnett, J. H. et al., "Intrinsic Birefringence in calcium fluoride" Preprint handed out at 2nd International Symposium on 157nm Lithography in Dana Point, California, May 15, 2001.

Mulkens, J. et al. "157-nm technology: Where are we today?" Optical Microlithography XV. 2002. vol. 4691, 613-625. Proceedings of the SPIE-Int. Soc. Opt. Eng., Santa Clara, CA, US, Mar. 5-8, 2002.

Nogawa H., et al. "System design of a 157 nm scanner". Optical Microlithography XV. 2002. vol. 4691, 602-612 Proceedings of the SPIE-Int. Soc. Opt. Eng., Santa Clara, CA, US, Mar. 5-8, 2002.

Shiraishi, N. et al. "Progress of Nikon's F2 Exposure Tool Development" Proceedings of the SPIE, SPIE, Bellingham, VA, US Mar. 5, 2002 vol. 4691. Mar. 5, 2002. 594-601.

Burnett et al., "Preliminary Determination of an Intrinsic Birefringence in $CaF_2$", dated May 7, 2001, 2nd International Symposium on 157nm Lithography in Dana Point, California, May 15, 2001.

Wang et al. "Polarized Phase Shift Mask: Concept, Design, and Potential Advantages to Photolithography Process and Physical Design." Proceedings of SPIE vol. 4562, 21st Annual BACUS Symposium on Photomask Technology, Mar. 2002, p. 406-417.

Hodgkinson, Ian. "Review of birefringent and chiral optical interference coatings." Optical Interference Coatings, Trends in Optics and Photonics vol. 63, 2001, p. FA1-FA3.

Band, Erster. Lexikon der Optik. 1999, p. 380-387. and certified copy of translation.

Burnett et al. "The Trouble with Calcium Fluoride." SPIE's OEMagazine, pp. 23-25, Mar. 2002.

Matsuyama et al. "High NA and low residual aberration projection lens for DUV scanner." Optical Microlithography XV, Proceedings of SPIE, 4691, pp. 687-695, 2002, Conf. Mar. 5, 2002.

Matsuyama et al. "Microlithographic lens for DUV scanner." International Optical Design Conference, Proceedings of SPIE 4832, pp. 170174, 2002, Conf. Jun. 3, 2002.

Matsumoto, et al. "Analysis of Imaging Performance Degradation." Optical Microlithography XVI, Proceedings of SPIE, 5040, pp. 131-138, 2003, Conf. Feb. 25, 2003.

Owa et al. "Nikon F2 exposure tool development." Optical Microlithography XVI, Proceedings of SPIE, 5040, pp. 772-780, 2003, Conf. Feb. 25, 2003.

Chiba et al. "New generation projection optics for ArF lithography." Optical Microlithogrpahy XVI, Proceedings of SPIE, 4691, pp. 679686, 2002, Conf. Mar. 5, 2002.

Merkel et al., "The development of microlithographic high-performance optics," *International Journal of Optoelectronics,* 4(6):545-562 (1989).

* cited by examiner

OBJECTIVE WITH FLUORIDE CRYSTAL LENSES

CROSS-REFERENCE TO RELATED APPLICATIONS

This application is a division of the co-pending U.S. patent application Ser. No. 10/367,989 filed Feb. 12, 2003, which is a continuation of International Patent Application Serial No. PCT/EP02/05050 filed May 8, 2002. Both of the aforementioned applications are hereby incorporated by reference in the present application in their entirety.

BACKGROUND OF THE INVENTION

The present invention relates to an objective, in particular for a projection apparatus used in microlithography, with a plurality of lenses including at least one fluoride crystal lens.

Projection objectives of this kind are known from U.S. Pat. No. 6,201,634, which discloses the concept of aligning the lens axes orthogonally to the {111} planes of the fluoride crystals in order to minimize stress-induced birefringence. The aforementioned U.S. Patent is based on the assumption that fluoride crystals have no intrinsic birefringence.

However, as described in the Internet publication "Preliminary Determination of an Intrinsic Birefringence in $CaF_2$" by John H. Burnett, Eric L. Shirley, and Zachary H. Levine of the National Institute of Standards and Technology (NIST), Gaithersburg, Md. (posted on May 7, 2001), single crystal ingots of calcium fluoride also exhibit birefringence that is not stress-induced, i.e., intrinsic birefringence. According to the measurements presented in that study, a light ray traveling in the <110> direction of a calcium fluoride crystal is subject to a birefringence that amounts to 6.5±0.4 nm/cm at a wavelength of λ=156.1 nm, to 3.6±0.2 nm/cm at a wavelength of λ=193.09 nm, and to 1.2±0.1 nm/cm at a wavelength of λ=253.65 nm. On the other hand, if the light propagation is oriented in the <100> direction or in the <111> direction of the crystal, no intrinsic birefringence occurs in calcium fluoride, as is also predicted by theory. Thus, the intrinsic birefringence has a strong directional dependence and increases significantly for shorter wavelengths.

The indices for the crystallographic directions will hereinafter be bracketed between the symbols "<" and ">", and the indices for the crystallographic planes will be bracketed between the symbols "{" and "}". The crystallographic directions are perpendicular to the correspondingly indexed crystallographic planes. For example, the crystallographic direction <100> is perpendicular to the crystallographic plane {100}. Crystals with a cubic lattice structure, which includes the fluoride crystals that are of interest in the present context, have the principal crystallographic directions <110>, <$\bar{1}$10>, <1$\bar{1}$0>, <$\bar{1}\bar{1}$0>, <101>, <10$\bar{1}$>, <$\bar{1}$01>, <$\bar{1}$0$\bar{1}$>, <011>, <0$\bar{1}$1>, <01$\bar{1}$>, <0$\bar{1}\bar{1}$>, <111>, <$\bar{1}\bar{1}\bar{1}$>, <$\bar{1}\bar{1}$1>, <$\bar{1}$1$\bar{1}$>, <$\bar{1}$11>, <1$\bar{1}\bar{1}$>, <1$\bar{1}$1>, <11$\bar{1}$>, <100>, <010>, <001>, <$\bar{1}$00>, <0$\bar{1}$0>, and <00$\bar{1}$>. Because of the symmetries of cubic crystals, the principal crystallographic directions <100>, <010>, <001>, <$\bar{1}$00>, <0$\bar{1}$0>, and <00$\bar{1}$> are equivalent to each other. Therefore, those crystallographic directions that are oriented along one of the principal directions <100>, <010>, <001>, <$\bar{1}$00>, <0$\bar{1}$0>, and <00$\bar{1}$> will hereinafter be identified by the prefix "(100)-", and crystallographic planes that are perpendicular to these directions will also be identified by the same prefix "(100)-". Furthermore, the principal directions <110>, <$\bar{1}$10>, <1$\bar{1}$0>, <$\bar{1}\bar{1}$0>, <101>, <10$\bar{1}$>, <$\bar{1}$01>, <$\bar{1}$0$\bar{1}$>, <011>, <0$\bar{1}$1>, <01$\bar{1}$>, and <0$\bar{1}\bar{1}$> are likewise equivalent to each other. Therefore, those crystallographic directions that are oriented along one of the latter group of principal directions will hereinafter be identified by the prefix "(110)-", and crystallographic planes that are perpendicular to these directions will also be identified by the same prefix "(110)-". Finally, the principal directions <111>, <$\bar{1}\bar{1}\bar{1}$>, <$\bar{1}\bar{1}$1>, <$\bar{1}$1$\bar{1}$>, <1$\bar{1}\bar{1}$>, <$\bar{1}$11>, <1$\bar{1}$1>, <11$\bar{1}$> are also equivalent to each other. Therefore, those crystallographic directions that are oriented along one of the latter group of principal directions will hereinafter be identified by the prefix "(111)-", and crystallographic planes that are perpendicular to these directions will also be identified by the same prefix "(111)-". Any statements made hereinafter in regard to one of the aforementioned principal crystallographic directions should be understood to be equally applicable to the equivalent principal crystallographic directions.

Objectives and projection systems for use in microlithography are known for example from the patent application PCT/EP 00/13148 (WO 150171 A1), which has the same assignee as the present application, and from the references cited in that earlier application. The embodiments discussed in PCT/EP 00/13148 illustrate suitable projection objectives of purely refractive as well as catadioptric types with numerical apertures of 0.8 and 0.9 at operating wavelengths of 193 nm as well as 157 nm.

The concept of rotating the orientation of lens elements in order to compensate for the effects of birefringence is also described in the patent application DE 101 23 725.1, "Projektionsbelichtungsanlage der Mikrolithographie, Optisches System und Herstellverfahren" (Projection Apparatus for Microlithography, Optical System and Manufacturing Method), which has the same assignee as the present invention, is identified by assignee's file reference 01055P and was filed on May 15, 2001. The content of DE 101 23 725.1 is hereby incorporated by reference in the present application.

OBJECT OF THE INVENTION

The present invention aims to provide objectives for use in a microlithography projection apparatus, in which the influence of birefringence, in particular intrinsic birefringence, is significantly reduced.

SUMMARY OF THE INVENTION

To meet the foregoing requirement, the invention provides an objective, in particular for a projection apparatus used in microlithography, with a plurality of lenses, including at least one fluoride crystal lens of a crystallographic orientation where the lens axis is approximately perpendicular to the {100}-plane of the fluoride crystal or to one of the planes that are equivalent to the {100}-plane.

The foregoing concept of orienting the lens axis in a fluoride crystal lens in the <100>-direction of the crystallographic structure serves to minimize the effect of intrinsic birefringence. A lens axis is considered to be aligned in a principal crystallographic direction if the lens axis deviates by an angle of no more than 5° from the principal crystallographic direction. It should be noted that the objective can have other fluoride crystal lenses that do not necessarily have to share the aforedescribed orientation of the crystallographic planes. Those lenses in which the lens axis is perpendicular to the {100}-plane of the crystallographic structure will hereinafter also be referred to as (100)-lenses. The orientation of the lens axis in the <100>-direction has the advantage that the undesirable influence of the intrinsic birefringence phenomenon that affects light rays traveling in the <110>-direction becomes noticeable only at much larger aperture angles than would be the case with a lens whose axis is oriented in the <111>-direction. The term "aperture angle" as used herein means the angle of a light ray relative to the direction of the optical axis outside of a lens and also the angle of the light ray relative to the direction of the lens axis inside a lens. Light rays are affected by the birefringence phenomenon only if the aperture angle of a light ray enters significantly into the angular range between the <100>-direction and the <110>-direction of the crystallographic structure. The angle between the <100>-direction and the <110>-direction is 45°. If on the other hand, the lens axis were aligned in the <111>-direction of the crystallographic structure, the undesirable influence of intrinsic birefringence would become noticeable already at smaller aperture angles, because the angle between the <110>-direction and the <111>-direction is only 35°.

Of course, the inventive concepts disclosed herein are likewise applicable to lessen the undesirable effect of birefringence in cases where the angular dependency of the birefringent behavior is caused, e.g., by the manufacturing process of the fluoride crystal or by mechanical stress on the lens (stress-induced birefringence).

The lens axis may be defined, e.g., by the symmetry axis of a rotationally symmetric lens. If the lens does not have a symmetry axis, the lens axis may be defined as the centerline of an incident bundle of light rays, or as that line in respect to which the mean ray angle of all light rays within the lens is minimal. The lenses may be, e.g., refractive or diffractive lenses as well as correction plates with free-form corrective surfaces. Planar-parallel plates are likewise considered as lenses if they are arranged in the light path of the objective. In a planar-parallel plate, the lens axis is perpendicular to the planes forming the lens surfaces. Preferably, the lenses are rotationally symmetric.

An advantageous application of the invention is in projection objectives for a microlithography projection system, because these objectives must meet extremely stringent requirements in regard to their optical resolution. But the birefringence phenomenon also has a detrimental effect on lens-testing objectives that are used to test lenses for projection objectives by measuring wave fronts of large aperture.

In objectives with a large aperture on the image side, particularly an aperture of more than 0.7, there will be aperture angles inside a (100)-lens that exceed 25° or even 30°. The inventive concept of orienting the lens axis in the <100>-direction is used to particular advantage with such large aperture angles. If the lens axes were oriented in the <111>-direction, the light rays with aperture angles exceeding 25°, and in particular exceeding 30°, would be more noticeably affected by the detrimental influence of birefringence unless one of the corrective measures is used that are described farther below.

On the other hand, the detrimental effect of intrinsic birefringence can reach a maximum at an aperture angle of 45°, and it is therefore advantageous if the projection objective is designed so that all aperture angles of the light rays are smaller than 45° and, more specifically, no larger than $$\arcsin\left(\frac{NA}{n_{FK}}\right),$$

where NA stands for the numerical aperture on the image side and $n_{FK}$ stands for the refractive index of the fluoride crystal material. The expression $$\arcsin\left(\frac{NA}{n_{FK}}\right)$$

indicates the aperture angle that corresponds to the image-side numerical aperture inside a fluoride crystal lens if the light ray is refracted at a planar surface of the lens. This condition is met if the lenses that are arranged near the image plane have surfaces that converge the light rays, planar surfaces, or surfaces that diverge the passing light rays only slightly, provided that the light-diverging surface is followed in the light path by a lens surface that converges the light rays more strongly.

Large aperture angles occur primarily with lenses that are arranged near a field plane, in particular near the image plane. The (100)-lenses should therefore preferably be used in the areas near the field planes. The range along the light path where the (100)-lenses should be used can be determined based on the ratio between the lens diameter of the (100)-lens in relation to the diameter of the diaphragm. Preferably, the lens diameter of the (100)-lenses should not exceed 85% of the diaphragm diameter, with even higher preference for ratios of 80% or less.

As a rule, the largest aperture angles in projection objectives occur in the lens closest to the image plane. This is therefore the preferred lens in which to orient the lens axis in the <100>-direction of the crystal.

In addition to its dependence on the aperture angle of a light ray, the intrinsic birefringent property of a fluoride crystal lens is also dependent on the azimuth angle of the light ray. Thus the birefringence of a fluoride crystal lens can be described by a distribution function $\Delta n(\alpha_L, \theta_L)$ in which the independent variables are the aperture angle $\theta_L$ and the azimuth angle $\alpha_L$. For a given light-ray direction that is defined in terms of the aperture angle $\theta_L$ and the azimuth angle $\alpha_L$, the numerical value of the birefringence $\Delta n$ (expressed in nanometers per centimeter) indicates the optical path difference for two mutually orthogonal states of linear polarization in relation to the physical path length traveled by the light ray inside the fluoride crystal. The intrinsic birefringent property is thus independent of the path lengths and of the shape of the lens. The optical path difference for a ray is obtained by multiplying the value of the birefringence function with the optical path length. The aperture angle $\theta_L$ represents the angle that a light ray encloses with the lens axis, while the azimuth angle $\alpha_L$ represents the angle between the projection of the light ray into a plane perpendicular to the lens axis and a fixed reference direction that runs in the same perpendicular plane and is tied to the lens.

Because the birefringence distributions of the individual fluoride crystal lenses are angle-dependent, the rays of a bundle that converges in an image point in the image plane of the objective have angle-dependent optical path differences $\Delta OPL(\alpha_R, \theta_R)$ for two mutually orthogonal states of linear polarization. The function $\Delta OPL$ describes the optical path difference as a function of the aperture angle $\theta_R$ and the azimuth angle $\alpha_R$, wherein the aperture angle $\theta_R$ of a light ray is defined as the angle between the direction of the light ray and the optical axis in the image plane, and the azimuth angle $\alpha_R$ is defined as the angle between the projection of the light ray into the image plane and a fixed reference direction within the image plane. If the objective has at least two lenses or two lens parts consisting of fluoride crystal material, it is advantageous if the lens axes of the fluoride crystal lenses or lens parts are oriented in a principal crystallographic direction and the lenses or lens parts are arranged in relation to each other at such angles of rotation about their lens axes that the distribution function $\Delta OPL(\alpha_R, \theta_R)$ of the optical path differences is significantly reduced in magnitude compared to an arrangement of lenses in which the lens axes are oriented in the same principal crystallographic direction but the lenses or lens parts are installed with uniform orientation, i.e., not rotated relative to each other about their lens axes. As the birefringence distribution functions of the lenses are dependent on the azimuth angle, the rotated arrangement can reduce the maximum value of the optical path differences $\Delta OPL(\alpha_R, \theta_R)$ by up to 20%, and in some cases even 25%, in comparison to the non-rotated-arrangement of the lenses.

The term "lens parts" as used herein means, e.g., individual lenses that are joined together in an optically seamless manner to form one lens through a technique known as "wringing". In the most general sense, the term "lens parts" is used for the components of an individual lens in which the lens axes of the lens parts are oriented in the direction of the lens axis of the individual lens.

By installing the fluoride crystal lenses with mutually rotated orientations, the variation of the distribution function $\Delta OPL(\alpha_R, \theta_R)$ can be reduced in particular with regard to the azimuth angle $\alpha_R$, so that the distribution function $\Delta OPL(\alpha_R, \theta_R)$ is close to rotationally symmetric. For a given fixed aperture angle $\theta_R$, the optical path difference as a function of the azimuth angle $\alpha_R$ should vary by no more than 30%, and with particular preference no more than 20%, of the maximum value of the distribution function $\Delta OPL(\alpha_R, \theta_R)$ If the lens axis is oriented in a principal crystallographic direction, the birefringence distribution $\Delta n(\alpha_L, \theta_L)$ of the lens will have a k-fold azimuthal symmetry. For example, the birefringence distribution of a (100)-lens, i.e., a lens whose lens axis runs in the <100>-direction of the crystallographic structure, has a fourfold azimuthal symmetry, while the birefringence distribution of a (111)-lens, i.e., a lens whose lens axis runs in the <111>-direction of the crystallographic structure, has a threefold azimuthal symmetry, and the birefringence distribution of a (110)-lens, i.e., a lens whose lens axis runs in the <110>-direction of the crystallographic structure, has a twofold azimuthal symmetry. Depending on the order of the azimuthal symmetry, the individual lenses or lens parts of a group are arranged with specific angles $\gamma$ at which they are rotated relative to one another about the lens axes. The angles of rotation $\gamma$ are defined or measured as angles between respective reference directions of any two lenses or lens parts. The lens axes for the lenses of a group are oriented in the same principal crystallographic direction or in equivalent principal crystallographic directions. The reference directions of the lenses in a group are tied to the respective lenses in such a manner that the birefringence distributions $\Delta n(\alpha_L, \theta_0)$ for a given fixed aperture angle $\theta_0$ have the same azimuthal profile for all of the lenses in the group. Thus, the azimuthal locations of maximum birefringence occur at the same azimuth angles for all of the lenses in the group. With n lenses in a group, the angles of rotation between any two lenses are $$\gamma = \frac{360°}{k \cdot n} + m \cdot \frac{360°}{k} \pm 10°$$

In this equation, k stands for the degree of azimuthal symmetry, n for the number of lenses in a group, and m for an arbitrary integer number. The tolerance of ±10° allows for the fact that the angles of rotation may deviate from the theoretically ideal angles, so that other constraints can be taken into account in the fine adjustment of the objective. A deviation from the ideal angle of rotation leads to non-optimized azimuthal compensation of the optical path differences of the lenses in a group. This can, however, be tolerated within certain limits.

Thus, according to the foregoing equation, the angles of rotation for (100)-lenses are determined as:

$$\gamma = \frac{90°}{n} + m \cdot 90° \pm 10°$$

If the group is made up of two (100)-lenses, the angle of rotation between the two lenses will ideally be 45° or 135°, 225°, . . . etc.

Analogously, the angles of rotation for (111)-lenses are determined as:

$$\gamma = \frac{120°}{n} + m \cdot 120° \pm 10°$$

For (110)-lenses the angles of rotation are determined as:

$$\gamma = \frac{180°}{n} + m \cdot 180° \pm 10°$$

The distribution function for the optical path differences $\Delta OPL_G(\alpha_R, \theta_R)$ can also be stated for the influence of an individual group of lenses, if only the lenses of the group are considered in the evaluation of the birefringent behavior and the rest of the lenses are assumed to have no birefringence.

The lenses may be assigned to a group, e.g., based on the criterion that an outermost aperture ray of a bundle of rays has similar aperture angles within the lenses of the group. It is advantageous if the aperture angles vary by no more than 30%, and preferably no more than 20%, in relation to the largest aperture angle within the lenses of the group. It is further advantageous if the aperture angle of the outermost aperture ray within these lenses is larger than 15°, in particular larger than 200. The term "outermost aperture ray" in the present context means a light ray that originates from an object point and whose height in the diaphragm plane equals the radius of the diaphragm, so that the outermost aperture ray falls on the image plane at an angle corresponding to the numerical aperture towards the image side. The outermost aperture rays are used to define a group because they normally have the largest aperture angles inside the lenses and are therefore most affected by birefringence. The statement of the optical path difference for two mutually orthogonal states of linear polarization for the outermost aperture rays thus provides information about the maximum extent to which a wave front is affected by the birefringent phenomenon.

It is further advantageous if the path lengths traveled by the outermost aperture ray are similar in each of these lenses. It is advantageous if the path lengths vary by a maximum of 30%, in particular by a maximum of 20%, in relation to the maximum path length occurring within the lenses of the group. Observance of this rule assures a good degree of compensation between the azimuthal contributions to the overall profile of the optical path differences that are caused by the individual lenses of a group, so that the resulting distribution of the optical path differences comes close to being rotationally symmetric.

It is further of advantage if the outermost aperture ray has approximately equal optical path differences between two mutually orthogonal states of linear polarization in each lens of a group if the lenses are arranged with the same orientation. It is advantageous if the optical path differences vary by no more than 30%, in particular no more than 20%, in relation to the largest optical path difference occurring within the lenses of the group. If this condition is met, the mutually rotated arrangement of the lenses will provide an optimized compensation of the azimuthal contributions of the lenses.

In the case of planar-parallel adjacent (100)- or (111)-lenses of equal thickness or of four planar-parallel adjacent (110)-lenses of equal thickness, one obtains a rotationally symmetric distribution of the optical path differences $\Delta$OPL by rotating the lenses in accordance with the forgoing formulas. If the lenses have curved surfaces, it is likewise possible to achieve approximate rotational symmetry of the optical path differences even by rotating only two lenses relative to each other, if the lenses of a group or the thicknesses and radii of the lenses are appropriately selected. With (100)-lenses or (111)-lenses, it is advantageous if a group has two lenses. With (110)-lenses, approximate rotational symmetry of the distribution of optical path differences is achieved with four lenses in a group.

The measure of rotating the lenses is particularly effective if the lenses are arranged adjacent to each other. It is especially advantageous to use a lens consisting of two parts, in which the lens parts are joined together with mutually rotated orientation in an optically seamless manner, for example by the aforementioned technique of wringing.

In order to achieve approximate rotational symmetry in the distribution of optical path differences for two mutually orthogonal states of linear polarization for an individual group of lenses whose lens axes are oriented in the same or equivalent principal crystallographic directions, it is advantageous to divide the group into a number n of subgroups. A subgroup has, for example, one, two or three lenses. The lenses of a subgroup are not rotated relative to each other except for a possible offset angle corresponding to the azimuthal symmetry, so that the offset angle is of no consequence. Thus, the angles of rotation $\gamma$ between lenses of a subgroup conform to the equation $$\gamma = l \cdot \frac{180°}{k} \pm 10°,$$

where l is an integer and k represents the order of azimuthal symmetry of the birefringence distribution $\Delta n(\alpha_L, \theta_L)$ of a lens. For two lenses that belong to two different subgroups, on the other hand, the angle of rotation is defined by the equation $$\gamma = \frac{360°}{k \cdot n} + m \cdot \frac{360°}{k} \pm 10°$$

where m represents an integer number. If each of the subgroups has only one lens, the relationships that have already been described above apply to the selection of the lenses that form a group. If the desired state of approximate rotational symmetry in the optical path differences cannot be achieved by rotating, e.g., two lenses in relation to each other, it is possible to obtain the desired distribution by assigning an additional lens to a subgroup. A rotationally symmetric distribution is possible if the distributions of the optical path differences produced by the individual subgroups have nearly identical maxima and profile shapes. Finally, i.e., after this condition has been met, the approximate rotational symmetry in the distribution of the optical path differences is obtained by rotating the lenses of one subgroup in relation to the lenses of another subgroup. However, a group formed of subgroups according to the foregoing discussion always has n lenses whose angles of rotation in relation to each other conform to the equation $$\gamma = \frac{360°}{k \cdot n} + m \cdot \frac{360°}{k} \pm 10°.$$

The n lenses do not necessarily have to result in a distribution of, the optical path differences with approximate rotational symmetry.

In a projection objective with a multitude of lenses, it is beneficial to form several groups of lenses, where the lenses within each group are arranged in such mutually rotated positions that the resulting distribution $\Delta$OPL $(\alpha_R, \theta_R)$ is nearly independent of the azimuth angle.

While the mutual rotation of the lenses of a group makes the distribution $\Delta$OPL$_G(\alpha_R, \theta_R)$ caused by each of the groups nearly independent of the azimuth angle, the maximum value of the overall distribution function $\Delta$OPL$(\alpha_R, \theta_R)$ for the entire objective can be significantly reduced if the objective has at the same time at least one group with (100)-lenses and at least one group with (111)-lenses. A good degree of compensation is also possible if a group of (110)-lenses is arranged within the objective in addition to a group of (100)-lenses.

The reason why a compensation is possible is that the birefringent property is characterized not only by an absolute magnitude but also by a direction. The detrimental effect of birefringence is optimally compensated if the distribution of the optical path differences $\Delta$OPL$_1(\alpha_R, \theta_R)$ caused by the lenses or lens parts of all of the groups with (100)-lenses has maximum absolute values of similar magnitude as the distribution of the optical path differences $\Delta$OPL$_2(\alpha_R, \theta_R)$ caused by the lenses or lens parts of all of the groups with (111)- or (110)-lenses.

As a further advantageous possibility to reduce the unwanted effect of birefringence, an optical element of the projection objective can be given a compensation coating. This is based on the known fact that every optical coating, e.g., an anti-reflex coating or a mirror coating, is characterized not only by reflection or transmission but also introduces optical path differences for two mutually orthogonal states of linear polarization. The effect is different depending on whether the light is s-polarized or p-polarized and depends furthermore on the angle of incidence at which a light ray meets the coating. Thus, the birefringence in this case depends on the angle of incidence. For a bundle of rays whose central ray meets the compensation coating at an angle of incidence of 0°, the values and directions of the birefringence are rotationally symmetric in relation to the central ray. In this case, the angle of incidence indicates the angle between a light ray and the normal vector of the surface at the intersection of the light ray with the surface. The compensation coating is designed to produce a specific amount of birefringence as a function of the aperture angle of the light rays of a light bundle.

As a first step to determine an appropriate compensation coating, one determines the distribution of the optical path differences $\Delta OPL(\alpha_R, \theta_R)$ for two mutually orthogonal states of linear polarization for a bundle of rays in the image plane of the projection objective. The aperture angle $\theta_R$ of a light ray is defined as the angle between the direction of the ray and the optical axis in the image plane. The azimuth angle $\alpha_R$ is defined as the angle between the projection of the ray into the image plane and a fixed reference direction in the image plane. In this case, the distribution function $\Delta OPL(\alpha_R, \theta_R)$ of the optical path differences for two mutually orthogonal states of linear polarization describes the overall result of all birefringence effects taking place in the objective, i.e., intrinsic birefringence of fluoride crystal lenses, stress-induced birefringence, anti-reflex coatings on optical elements, or mirror coatings.

Based on the distribution function $\Delta OPL(\alpha_R, \theta_R)$ that has been determined for the objective, one determines the effective birefringence distribution for the compensation coating that needs to be applied to an optical element with a defined element axis. Appropriate optical elements include, e.g., refractive or diffractive lenses, planar-parallel plates, or mirrors. The optical surfaces of the optical element are defined as the areas that perform an optical function, normally the front and back surfaces of the element. The element axis may be, e.g., a symmetry axis of a rotationally symmetric lens. In a lens that has no symmetry axis, the element axis can be defined by the central ray of an incident light bundle or by a straight line in relation to which the mean ray angle of all light rays within the lens is minimal. The effective birefringence values depend on azimuth angles $\alpha_F$ that are measured relative to a reference direction in a plane perpendicular to the element axis, and they also depend on aperture angles $\theta_F$ that are measured relative to the element axis.

A value pair $(\alpha_F, \theta_F)$ relating to the optical element has its corresponding counterpart in a value pair $(\alpha_R, \theta_R)$ of a ray in the image plane.

The distribution function for the effective birefringence of the compensation coating is now determined in such a manner that the distribution of the optical path differences for two mutually orthogonal states of linear polarization has significantly reduced values for the overall system including the compensation coating when compared to the same system without the coating. In an objective that includes an optical element with a compensation coating, the maximum value of the distribution function $\Delta OPL(\alpha_R, \theta_R)$ is reduced by up to 20%, and in particular cases up to 25%, in comparison to an objective without a compensation coating.

It is possible to influence the effective birefringence distribution through the selection of the coating material, the thickness profiles and the vapor-deposition angles of the individual layers of the compensation coating. The design of the coating and the process parameters are determined by means of computer programs for coating-design applications that determine the thickness profiles of the individual coatings and the process parameters based on the given quantities of the effective birefringence distribution, the selection of coating materials and the geometry of the optical element.

The compensation coating can also be applied to more than one optical element. This increases the degrees of freedom available for the design specification of the compensation layers which, in addition to their compensating function, should also have a high degree of transmissivity.

In typical distributions $\Delta OPL(\alpha_R, \theta_R)$ of the optical path differences for two mutually orthogonal states of linear polarization, the path differences are small at an aperture angle of 0°. It is therefore advantageous if the birefringent effect of the compensation coating is close to zero at the aperture angle $\theta_F=0°$. This can be achieved if no large vapor-deposition angles are used in producing the compensation coating. It is therefore advantageous if the surface of the optical element to which the compensation coating is applied has preferably only a small amount of surface curvature.

As described above, by rotating lenses of (100)- or (111)-orientation relative to each other, one obtains approximate rotational symmetry in the distribution $\Delta OPL(\alpha_R, \theta_R)$ of the optical path differences in the image plane, so that the distribution function depends only on the aperture angle $\theta_R$. The optical path differences can be further reduced by an optical element with a compensation coating that has an effective birefringence distribution depending in a primary approximation only on the aperture angle $\theta_F$. This is achieved through a homogenous thickness of the individual layers of the compensation coating over the optical element without variable thickness profiles of the layers.

In applying the invention, it is advantageous if the optical element with the compensation coating is an interchangeable element.

As an advantageous choice, the optical element nearest to the image plane is used as the interchangeable element.

In the process of realizing this concept, a first step consists of determining the distribution function $\Delta OPL(\alpha_R, \theta_R)$ of the optical path differences for two mutually orthogonal states of linear polarization for a bundle of rays in the image plane. In this step, the effects of all optical elements of the objective, including the coatings of the elements, are taken into account. The optical element to which the compensation coating will be applied in a subsequent step is at its place in the light path of the bundle of rays during the first step.

In a second step, the method described above is used to determine the effective birefringence distribution that the compensation coating will need to have and, as a result, the thickness profiles of the individual coating layers as well as the process parameters for producing the individual layers.

In a third step, the optical element is removed from the light path and the compensation coating is applied to it. If the optical surface of the optical element already has a coating, the existing coating is removed before the new coating is applied.

In a fourth step, the optical element with the compensation coating is returned to its original location in the objective.

The preferred material for the lenses in projection objectives is calcium fluoride, because calcium fluoride used together with quartz is particularly well suited for the color correction at a working wavelength of 193 nm and has an adequate transmissivity at a working wavelength of 157 nm. But the same can also be said for the fluoride crystals strontium fluoride or barium fluoride, because they are crystals of the same cubic structure.

The unwanted effect of the intrinsic birefringence is particularly noticeable if the light rays have large aperture angles within the lenses. This is the case in projection objectives with an image-side numerical aperture exceeding 0.7 or in particular exceeding 0.8.

The magnitude of the intrinsic birefringence increases significantly towards shorter working wavelengths. Thus, in comparison to a wavelength of 248 nm, the intrinsic birefringence is more than twice as large at a wavelength of 193 nm and more than five times as large at a wavelength of 157 nm. The invention is therefore used to particular advantage if the light rays have wavelengths shorter than 200 nm, in particular shorter than 160 nm.

The objective can be a purely refractive projection objective consisting of a multitude of lenses arranged with rotational symmetry relative to the optical axis, or the objective may be a projection objective of the catadioptric type of objectives.

Projection objectives of this kind can be used advantageously in microlithography projection systems in which the light source is followed by an illumination system, a mask-positioning system, a mask carrying a structure, a projection objective, an object-positioning system, and a light-sensitive substrate.

This microlithography projection system serves to produce micro-structured semiconductor components.

The invention also provides a suitable method for the manufacture of objectives. According to the method, lenses or lens parts of fluoride crystal whose lens axes are oriented in a principal crystallographic direction are arranged in mutually rotated positions relative to the lens axis so that the distribution $\Delta OPL(\alpha_R, \theta_R)$ of the optical path differences has significantly reduced values in comparison to a lens arrangement in which the lens axes of the fluoride crystal lenses are likewise oriented in the same principal crystallographic direction but where the lenses have the same, i.e. non-rotated orientation.

According to the inventive method, it is further proposed to form groups with (100)-lenses and groups with (111)-lenses or (110)-lenses and to use the groups in parallel. This concept is used, e.g., in a projection objective that includes at least two fluoride crystal lenses in <100>-orientation and at least two lenses in <111>-orientation. In addition to the lens-axis orientation, the orientation of the reference direction is known for these lenses. The method makes use of the inventive concept that the maxima of the distribution function $\Delta OPL(\alpha_R, \theta_R)$ of the optical path differences can be significantly reduced by rotating the fluoride crystal lenses about their optical axis. Using suitable simulation methods, a bundle of rays originating from an object point is propagated through a projection objective and, based on the known optical properties of the fluoride crystal lenses, the distribution $\Delta OPL(\alpha_R, \theta_R)$ in the image plane is determined. In an optimizing step, the angles of rotation between the fluoride crystal lenses are varied until the birefringence effect has been reduced to a tolerable level. The optimizing step can also be adapted to satisfy additional conditions such as a simultaneous compensation of non-rotationally symmetric lens errors by the measure of rotating the lenses relative to each other. This optimizing step allows the maximum value of the distribution function $\Delta OPL(\alpha_R, \theta_R)$ to be lowered by up to 30%, in specific cases even 50%, in comparison to a projection objective in which the fluoride crystal lenses are arranged with the same, i.e. non-rotated, orientation. The optimization can also include an intermediate step. In the intermediate step, the fluoride crystal lenses are assigned to groups in such a manner that with equal orientation of the lenses of a group, each lens of the group produces an optical path difference of similar magnitude for two mutually orthogonal states of linear polarization. In the subsequent optimizing step, the lenses are rotated only within the groups in order to reduce the optical path differences. Thus, the (100)-lenses may be rotated first, so that the optical path differences caused by the (100)-lenses are reduced. Next, the (111)-lenses are rotated, so that the optical path differences caused by the (111)-lenses are reduced. The assignment of the fluoride crystal lenses to groups with (100)-orientation and (111)-orientation during the optimization step has to be made with the aim that the resulting (100)-distribution function $\Delta OPL_{100}(\alpha_R, \theta_R)$ and the resulting (111)-distribution function $\Delta OPL_{111}(\alpha_R, \theta_R)$ compensate each other to a large extent. An analogous rule also applies to the parallel use of (100)-lenses and (110)-lenses.

The invention further relates to a method of manufacturing a lens. In a first step, a plurality of plates of fluoride crystal are seamlessly joined to form a blank, and in a second step, the lens is produced from the blank through known manufacturing methods. The seamlessly joined plates are arranged with a mutual rotation about their normal axes in the same manner as described above for lenses and lens parts.

It is advantageous if plates whose normal vectors are oriented in the same principal crystallographic direction have the same axial thickness.

If (100)-plates are seamlessly joined with (111)-plates, the ratio between the sum of the thicknesses of the (111)-plates and the sum of the thicknesses of the (100)-plates should be 1.5±0.2.

If (100)-plates are seamlessly joined with (110)-plates, the ratio between the sum of the thicknesses of the (110)-plates and the sum of the thicknesses of the (100)-plates should be 4.0±0.4.

The invention further provides a method for manufacturing lenses or lens parts of a crystal material with a cubic crystallographic structure that can be advantageously used in the objectives of the foregoing description in order to reduce the detrimental effect of birefringence.

The reduction of the harmful effect of birefringence is based on the concept of mutually rotating the lenses within a group in which the lens axes of the lenses are oriented in the same crystallographic direction, preferably in the same principal crystallographic direction. In order to set the angularly rotated mutual positions between the lenses of a group, the reference direction of each lens needs to be known. Following is a description of a method to determine a suitable reference direction and to mark the reference direction on the lens or lens part.

A multitude of shaping and surface-finishing steps are necessary before a lens or lens part ends up in its final form. As the lenses or lens parts consist of a crystal material, the raw material as a rule is a mono-crystalline block from which an optical blank is produced in a first step, e.g., by sawing and grinding. The term "optical" blank refers to a preliminary stage in the manufacture of a lens or lens part. It is possible to manufacture either a single lens or a plurality of lenses or lens parts from one optical blank. If a blank is made into more than one lens or lens part, the blank is subdivided into individual optical blanks by sawing, and the individual optical blanks are ground and/or polished in a further processing step, so that optical measurements can be performed at the pre-finished optical surfaces. The optical blanks that have been prepared in this manner have the shape of cylindrical discs.

It is advantageous if the optical blank is processed in such a manner that it has a preliminary optical surface with a normal vector oriented in a defined first crystallographic direction within the crystallographic structure of the material. It is advantageous if the first crystallographic direction is a principal crystallographic direction, for example the <100>-, <111>-, or <110>-direction. To achieve this result, it is first necessary to determine the first crystallographic direction in the optical blank. This determination can be made on the optical blank before it is subdivided into individual optical blanks. It is also possible to perform the subdividing operation first and to perform the determination of the first crystallographic direction on the individual optical blanks. The optical blank is processed by sawing and grinding, so that the first crystallographic direction runs approximately perpendicular to the preliminary optical surface. A deviation of ±5° is considered to be within tolerance. The term "preliminary optical surface" represents the front and rear side of the material disc.

In a next-following step, a reference direction is determined that is perpendicular to the first crystallographic direction. The reference direction represents the projection of a second crystallographic direction into a plane whose normal vector points in the first crystallographic direction. The angle between the first crystallographic direction and the second crystallographic direction has a value other than 0°. The second crystallographic direction can likewise be a principal crystallographic direction or a direction that is defined within the crystal structure, e.g., the <331>-direction.

After the reference direction has been determined, it is marked on the optical blank, for example by engraving on the cylindrical circumference. It is also possible that the optical blank is firmly connected to a mounting element and the mark for the reference direction is applied to the mounting element.

For the determination of the first crystallographic direction, the optical blank can be illuminated from a defined direction with an optical test radiation. The test radiation is reflected at the crystallographic planes associated with the first crystallographic direction, e.g., the {111}-planes, and generates a corresponding Bragg reflection. As the angle of incidence of the test radiation and the material of the optical blank are known, the theoretically predicted Bragg angle based on Bragg's law of reflection is likewise known. The reflected test radiation will be detected under the theoretically predicted angle only if the normal vector of the preliminary optical surfaces coincides with the first crystallographic direction. If necessary, the optical blank is processed further, e.g., by grinding, so that the normal vector of the preliminary optical surface coincides with the first crystallographic direction.

In an advantageous embodiment, the optical blank is supported so that it can be rotated about an axis that is perpendicular to the preliminary optical surface of the optical blank. With this arrangement, the Bragg reflections are determined for different angles of rotation, in the simplest case at 0° and 90°.

The reference direction can likewise be determined by evaluating a Bragg reflection, where the test radiation is reflected on the crystallographic planes associated with the second crystallographic direction.

Alternatively, the reference direction can be determined according to the Laue method.

It is of advantage to select the reference direction so that the birefringence will cause, e.g., a maximal optical path difference for two mutually orthogonal states of linear polarization in a light ray traversing the lens, if the projection of the light ray into a plane that is perpendicular to the first crystallographic direction runs parallel to the reference direction. If the compensation methods of the foregoing description are used, i.e., the concept of rotating lenses relative to each other, the prescribed angles of rotation can easily be set based on this rule for selecting and marking the reference direction. It is also possible to select and mark the reference direction so that the optical path difference is minimized in a light ray traversing the lens, if the projection of the light ray into a plane that is perpendicular to the first crystallographic direction runs parallel to the reference direction.

If the first crystallographic direction runs in the <100>-direction or in the <111>-direction or a direction that is equivalent to either of these crystallographic directions, it is advantageous if the projection of the second crystallographic direction into a plane that is orthogonal to the first crystallographic direction runs parallel to the projection of the <110>-direction or a <110>-equivalent direction into the same plane. What makes this choice of orientation advantageous is the fact that the optical path difference is maximal for light rays that run parallel to the <110>-direction or a <110>-equivalent direction.

If the first crystallographic axis is oriented in the <111>-direction or a <111>-equivalent crystallographic direction, it is advantageous if the second crystallographic direction is oriented in the <331>-direction or a <331>-equivalent crystallographic direction.

Because the test radiation that is used for the determination of the Bragg reflections can damage the material at the preliminary optical surfaces, it is advantageous if the parts of the optical blank that have been traversed by the test radiation are removed by grinding or polishing.

The foregoing method is advantageously used to produce an optical blank as the initial product stage from which a lens or a lens part for an objective is manufactured.

In the production of a lens or lens part from a blank that has been prepared according to the foregoing description, the optical surfaces of the lens or lens part are machined in such a way that the lens axis ends up aligned approximately parallel to the first crystallographic axis, i.e., approximately parallel to the normal vector of the preliminary optical blank surface. The deviation should be less than ±5°. The curved lens surfaces of the lens are produced by grinding and polishing the preliminary optical surfaces of the optical blank. If the lens surfaces are rotationally symmetric, the lens axis is represented by the symmetry axis.

As an alternative, the reference direction can also be determined and marked on the lens or lens part. The lens is made, e.g., by grinding and polishing, from a blank of a crystal material with a cubic crystallographic structure. In this process, the surfaces are formed in such a manner that the lens axis ends up parallel to a first crystallographic direction that preferably coincides with a principal crystallographic direction. In lenses with rotationally symmetric lens surfaces, the symmetry axis represents the lens axis. Next, a reference direction is determined for the lens or lens part. The reference direction is perpendicular to the first crystallographic direction and represents the projection of a second crystallographic direction into a plane that is orthogonal to the first crystallographic direction. The first and second crystallographic directions cannot be parallel to each other. A mark is applied to the lens or lens part to indicate the reference direction. If the lens is solidly connected to a mounting element, the mark can also be applied to the mounting element.

The same methods as were proposed above for an optical blank can also be used for determining the reference direction in a lens or lens part. For the measurement of the Bragg reflection it is advantageous if the position of the lens is adjustable so that the test radiation meets the curved lens surface at a defined point of incidence. Particularly if measurements are made at different rotated positions of the lens, it is advantageous if the test radiation meets the lens in the area of the lens vertex.

In order to avoid self-shading in the case of concave lens surfaces, it is advantageous to select the second crystallographic direction in such a manner that the incident test radiation and the reflected radiation that is used for the determination of the first crystallographic direction and of the reference direction is not disturbed by the lens geometry.

Lenses and lens parts that carry a marking of a reference direction are used with preference for objectives in which the detrimental effect of birefringence is to be reduced by rotating the lenses in relation to each other. The marking significantly simplifies the setting of a targeted angle of rotation between two individual lenses.

BRIEF DESCRIPTION OF THE DRAWINGS

The detailed description of the invention, which follows below, refers to examples that are illustrated in the attached drawings, wherein.

DETAILED DESCRIPTION OF PREFERRED EMBODIMENTS

Figure 1:
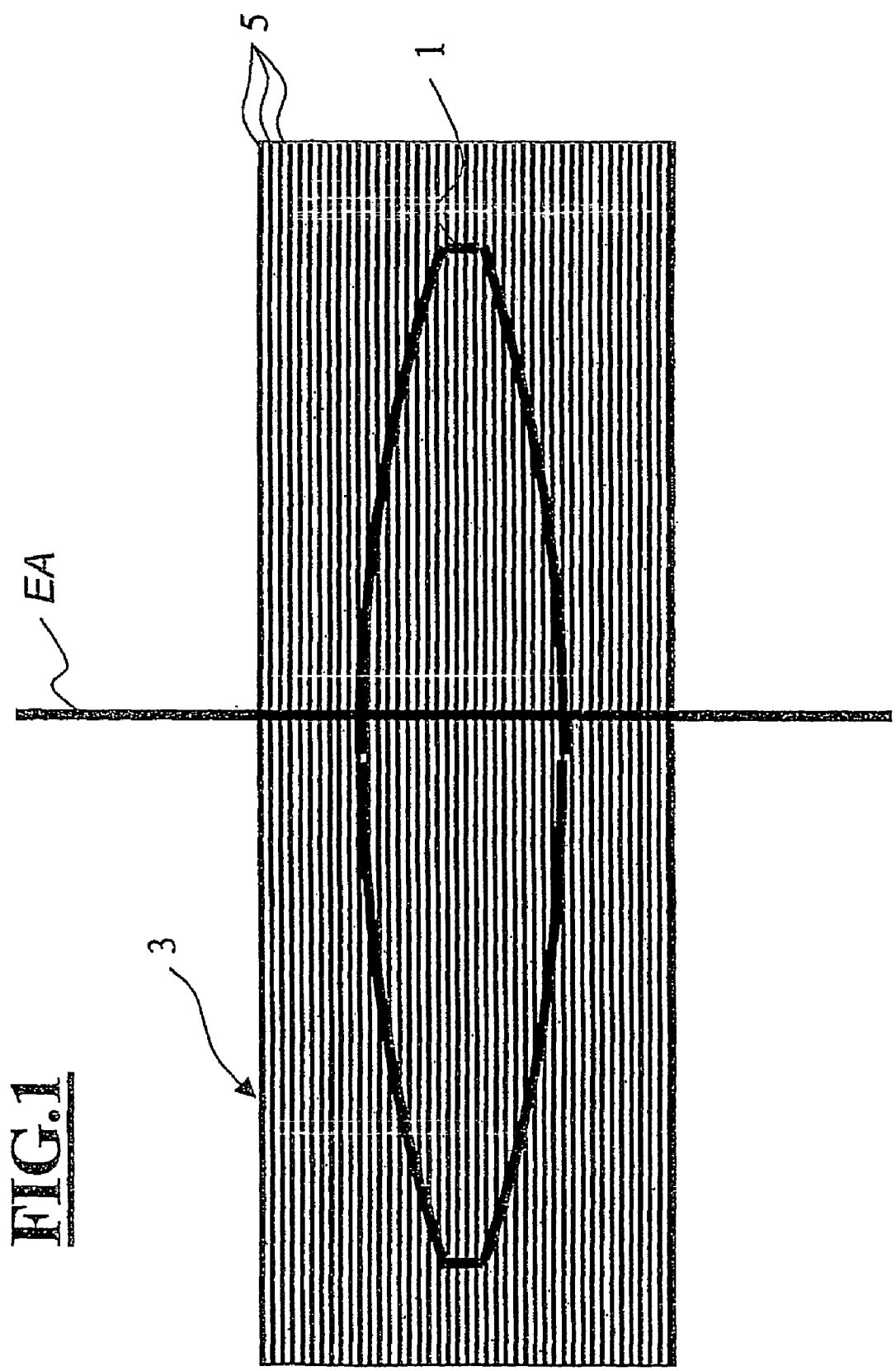
FIG. 1 represents a section through a fluoride crystal block perpendicular to the {100}-planes, wherein a lens of a projection objective is schematically outlined.

FIG. 1 gives a schematic view of a section through a fluoride crystal block 3. The orientation of the cut is selected so that the {100}-planes 5 of the crystal structure appear as individual lines, i.e., the {100} planes 5 are perpendicular to the plane of the drawing. The fluoride crystal block 3 is used as a blank or initial product stage for the (100)-lens 1. In the illustrated example, the (100)-lens 1 is a bi-convex lens with the lens axis EA coinciding with the symmetry axis of the lens. The lens 1 is formed out of the fluoride crystal block in such a manner that the lens axis EA ends up perpendicular to the {100}-planes.

Figure 2A:
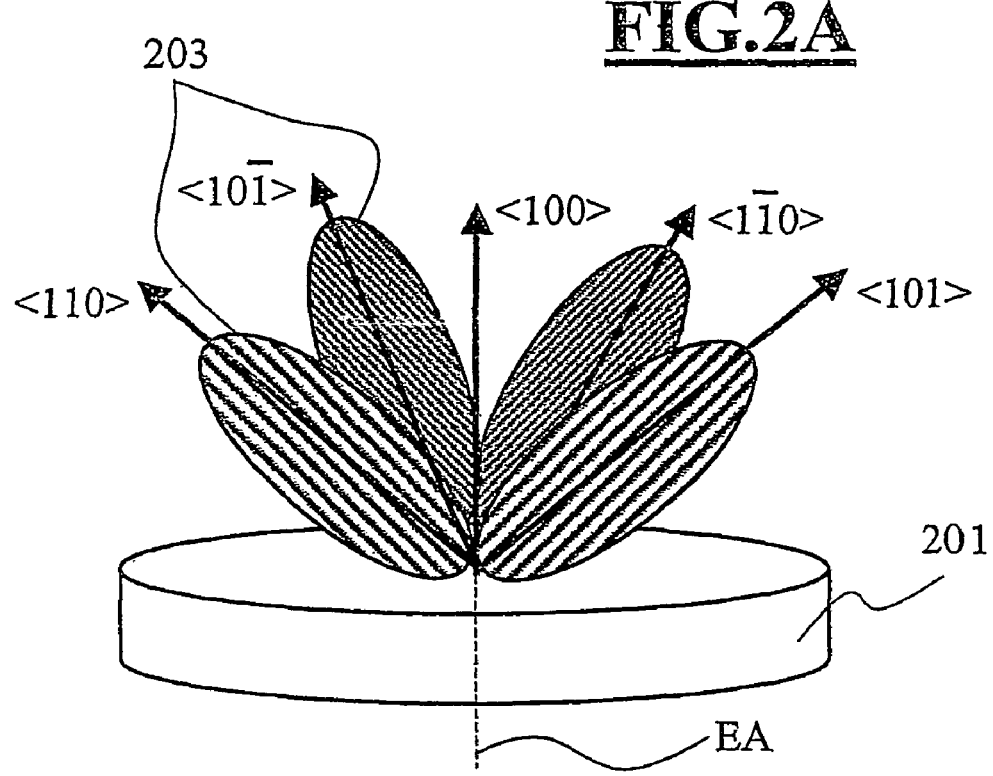
FIGS. 2A–C represent schematic three-dimensional views of a planar-parallel (100)-, (111)-, and (110)-lens, respectively.

FIG. 2A illustrates in a three-dimensional view how the intrinsic birefringence property is connected to the crystallographic directions in the case where the lens axis EA is oriented in the <100>-direction of the crystal structure. The lens in FIG. 2A is a planar-parallel circular plate 201 of calcium fluoride. The lens axis EA points in the <100>-direction. In addition to the <100>-direction, the crystallographic directions <101>, <1$\bar{1}$0>, <10$\bar{1}$> and <110> are likewise represented by arrows. The intrinsic birefringence is indicated schematically by the four "paddles" 203, whose surface areas indicate the amounts of intrinsic birefringence for the respective directions of incidence of a light ray. The maximum amounts of intrinsic birefringence occur in the crystallographic directions <101>, <1$\bar{1}$0>, <10$\bar{1}$> and <110>, i.e., for light rays which have inside the lens an aperture angle of 45° and azimuth angles of 0°, 90°, 180° and 270°, respectively. The minima of the intrinsic birefringence distribution occur at azimuth angles of 45°, 135°, 225° and 315°. The intrinsic birefringence vanishes at the aperture angle of 0°.

Figure 2B:
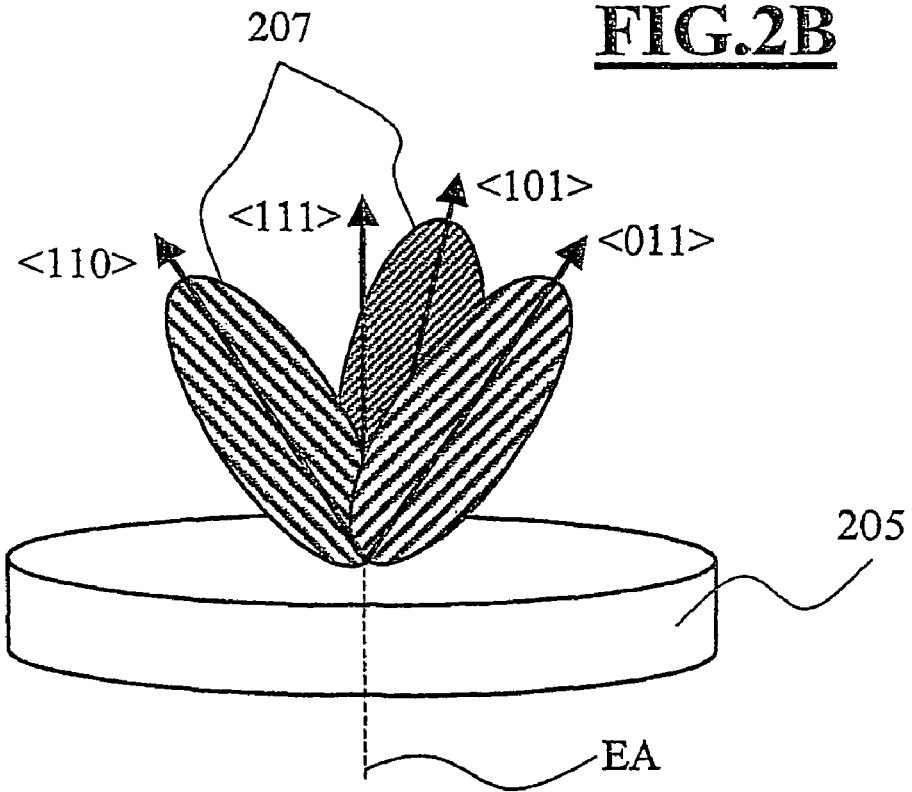

FIG. 2B serves to visualize in a three-dimensional view how the intrinsic birefringence property is connected to the crystallographic directions in the case where the lens axis EA is oriented in the <111>-direction of the crystal structure. The lens in FIG. 2B is a planar-parallel circular plate 205 of calcium fluoride. The lens axis EA points in the <111>-direction. In addition to the <111>-direction, the crystallographic directions <011>, <101>, and <110> are likewise represented by arrows. The intrinsic birefringence is indicated schematically by the three "paddles" 207, whose surface areas indicate the amounts of intrinsic birefringence for the respective directions of incidence of a light ray. The maximum amounts of intrinsic birefringence occur in the crystallographic directions <011>, <101>, and <110>, i.e., for light rays which have inside the lens an aperture angle of 35° and azimuth angles of 0°, 120°, and 240°, respectively. The minima of the intrinsic birefringence distribution occur at azimuth angles of 60°, 180°, and 300°. The intrinsic birefringence vanishes at the aperture angle of 0°.

Figure 2C:
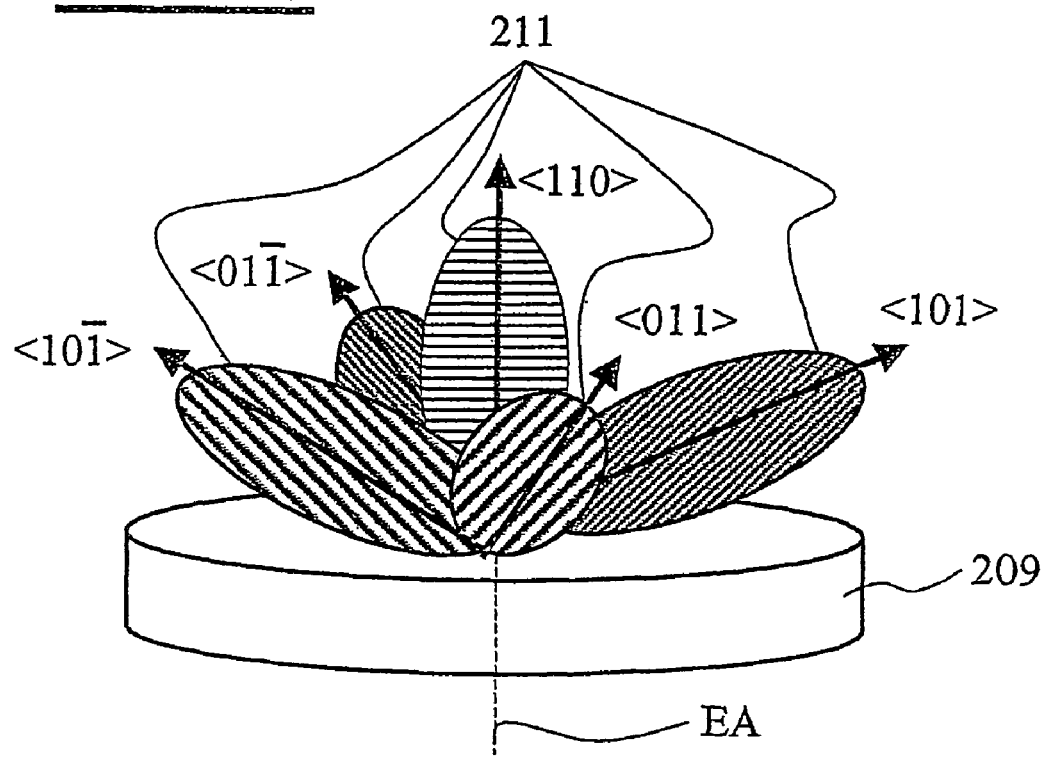

FIG. 2C provides a three-dimensional visualization of how the intrinsic birefringence property is connected to the crystallographic directions in the case where the lens axis EA is oriented in the <110>-direction of the crystal structure. The lens in FIG. 2C is a planar-parallel circular plate 209 of calcium fluoride. The lens axis EA points in the <110>-direction. In addition to the <110>-direction, the crystallographic directions <01$\bar{1}$>, <10$\bar{1}$>, <101>, and <011> are likewise represented by arrows. The intrinsic birefringence is indicated schematically by the five "paddles" 211, whose surface areas indicate the amounts of intrinsic birefringence for the respective directions of incidence of a light ray. The maximum amounts of intrinsic birefringence occur on the one hand in the direction of the lens axis EA, and on the other hand in the crystallographic directions <01$\bar{1}$>, <10$\bar{1}$>, <101>, and <011>, i.e., for a light ray with an aperture angle of 0° and for light rays which have inside the lens an aperture angle of 60° azimuth angles of the four azimuth angles corresponding to the respective projections of the <01$\bar{1}$>-, <10$\bar{1}$>-, <101>-, and <011>-direction into the {110}-plane. However, aperture angles of this magnitude cannot occur in crystal material, because the maximum possible aperture angle is limited to less than 45°, based on the refractive index of the crystal material.

Figure 3:
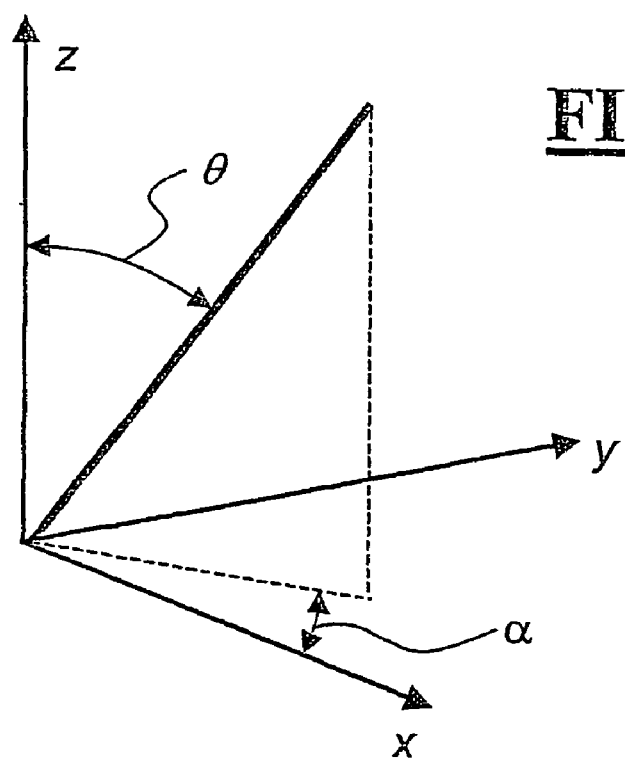
FIG. 3 shows a coordinate system illustrating the definition of the terms aperture angle and azimuth angle.

FIG. 3 illustrates how the aperture angle θ and the azimuth angle α are defined. For the (100)-lens of FIG. 3, the z-axis points in the <100>-direction of the crystal structure, and the x-axis points in the direction that is obtained by projecting the <110>-direction into the {100}-plane of the crystal structure. The z-axis in this case runs parallel to the lens axis and the x-axis runs parallel to the reference direction, with the origin of the coordinate system lying on the light ray.

It is known from the previously referenced internet publication that a birefringence value of (6.5±0.4) nm/cm was measured for light with a wavelength λ=156.1 nm traveling in the <110>-direction in calcium fluoride. Using this measured value as a normalizing quantity, the birefringence distribution Δn(θ,α) of a calcium fluoride lens can be calculated theoretically for different crystal orientations. The calculation can be based on the known formalisms that are used in the field of crystal optics for the calculation of index ellipsoids as a function of the direction of a light ray. The theoretical concepts may be found, e.g., in "Lexikon der Optik", Spektrum Akademischer Verlag Heidelberg Berlin, 1999 under the key word "Kristalloptik".

In more recent measurements made by Carl Zeiss Semiconductor Manufacturing Technologies AG, a birefringence value of 11 nm/cm was found for light with a wavelength λ=156.1 nm traveling in the <110>-direction in calcium fluoride. The conclusions made herein for a normalization based on $\Delta n_{max}$=6.5 nm/cm can be converted without difficulty to a normalization based on $\Delta n_{max}$=11 nm/cm.

Figure 4A:
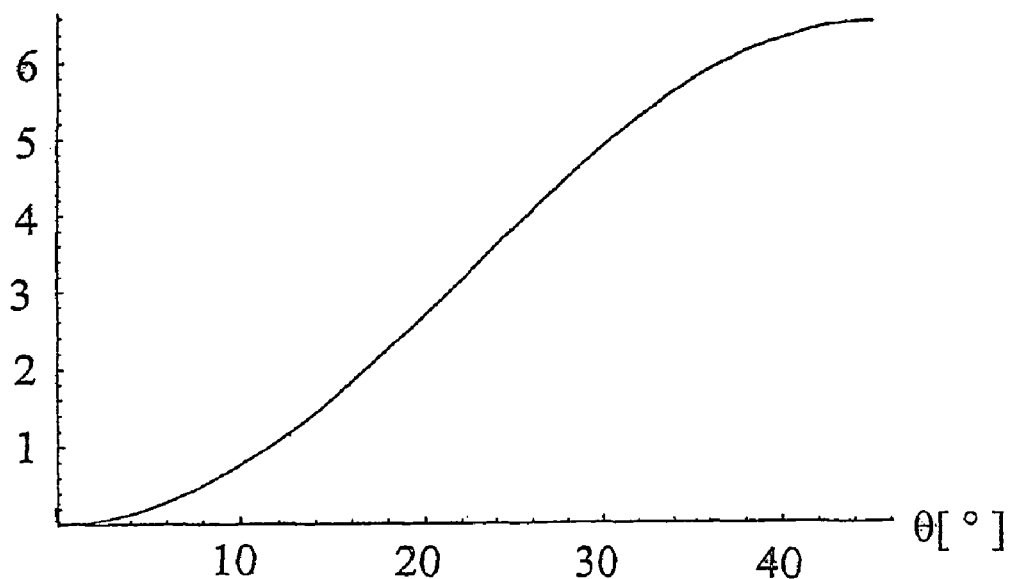
FIGS. 4A–F illustrate the birefringence distribution of (100)-lenses in different representations, as well as the birefringence distribution for two (100)-lenses that are rotated by an angle of 45° relative to each other.

The graph of FIG. 4A represents the amount of the intrinsic birefringence as a function of the aperture angle θ for an azimuth angle α=0° in a (100)-lens. The value of 6.5 nm/cm for the intrinsic birefringence at an aperture angle of θ=45° is based on the measured value. The curve profile between 0° and 45° was determined based on formulas that are known in the field of crystal optics.

Figure 4B:
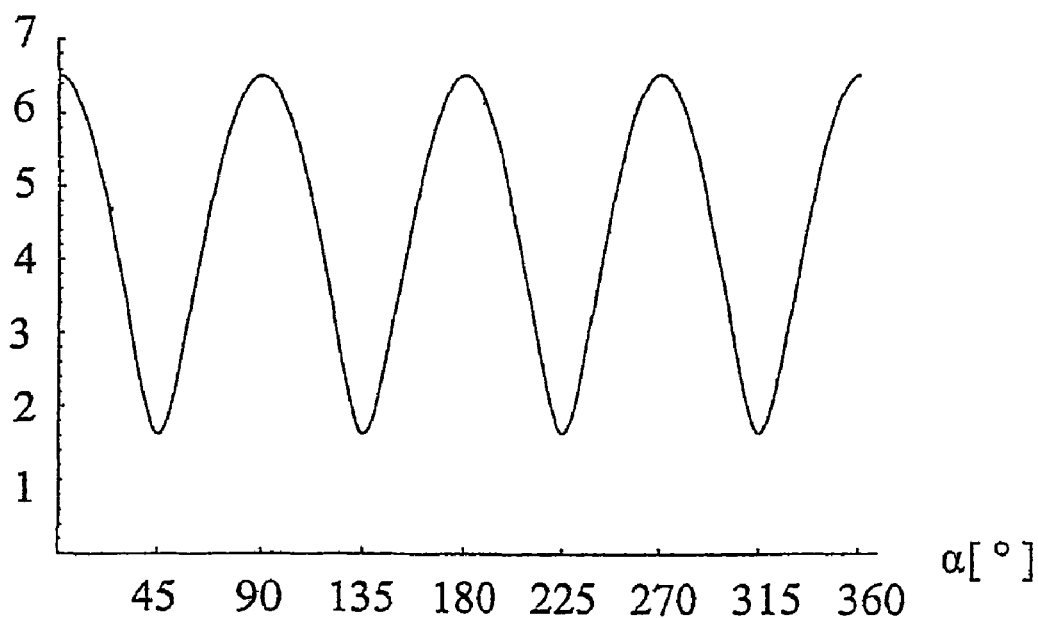

The graph of FIG. 4B represents the amount of the intrinsic birefringence as a function of the azimuth angle α at an aperture angle of θ=45° for a (100)-lens. The fourfold azimuthal symmetry is readily apparent.

Figure 4C:
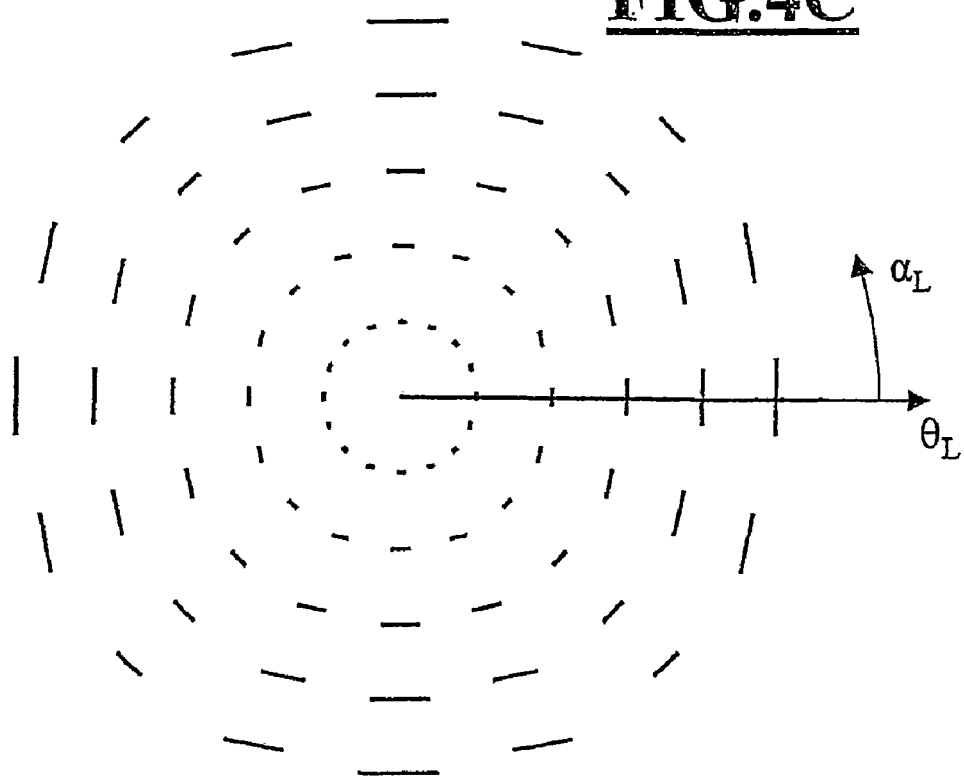

The diagram of FIG. 4C represents the birefringence distribution Δn(θ,α) for individual light ray directions in a (θ,α)-coordinate system for a (100)-lens. Each of the lines is representative of the magnitude and direction of the birefringence for a light ray defined by its aperture angle θ and azimuth angle α. The length of each line is in proportion to the amount of the birefringence as represented by the difference between the principal axes of the intersecting ellipse, while the direction of each line indicates the orientation of the longer of the two principal axes of the intersecting ellipse. The intersecting ellipse is obtained as the intersection between the index ellipsoid for a light ray in the direction (θ,α) and a plane that contains the center point of the ellipsoid and is orthogonal to the light ray direction. The directions as well as the lengths of the lines are indicative of a four-fold symmetry of the distribution. The length of the lines, and thus the amount of the birefringence, is largest at the azimuth angles of 0°, 90°, 180° and 270°.

Figure 4D:
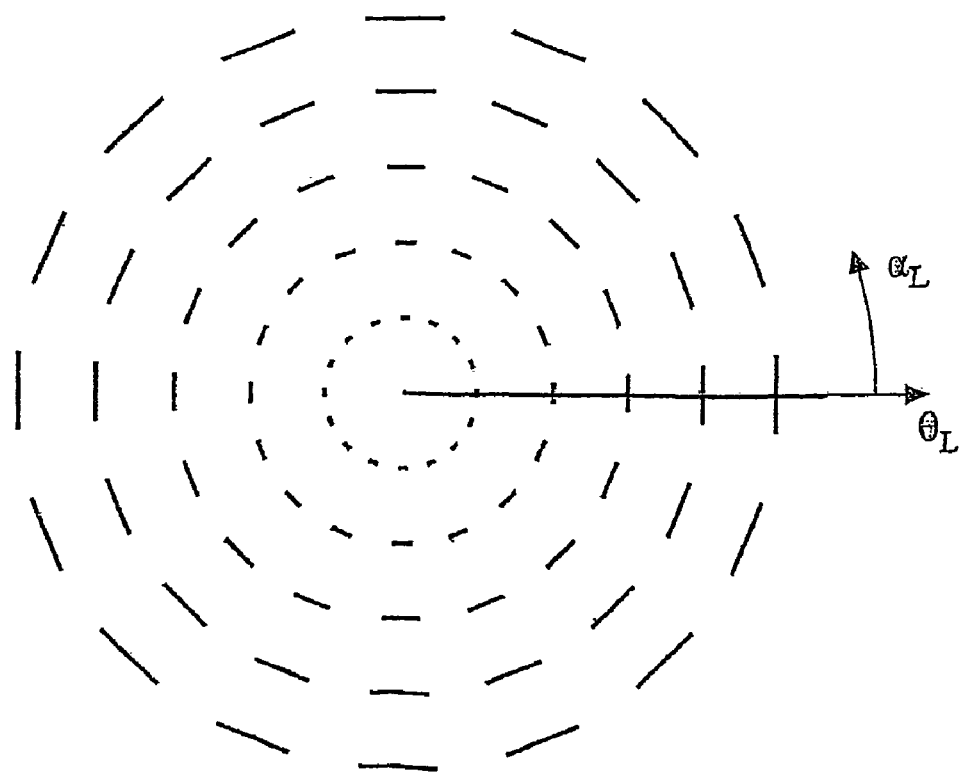

FIG. 4D, using the same graphical format as FIG. 4C, represents the effective birefringence distribution Δn(θ,α) that is obtained if two adjacent planar-parallel (100)-lenses of equal thickness are arranged with a 45° rotation relative to each other. The resultant effective birefringence distribution Δn(θ,α) is independent of the azimuth angle α. The longer principal axes of the intersecting ellipses run in the tangential direction. The resultant optical path differences for two mutually orthogonal states of polarization are obtained by multiplying the effective birefringence values with the physical path lengths traveled by the light rays inside the planar-parallel (100)-lenses. Rotationally symmetric effective birefringence distributions are obtained likewise by arranging a number n of planar-parallel (100)-lenses of equal thickness in such a manner that the rotation angle β between any two of the lenses conforms to the equation $$\beta = \frac{90°}{n} + m \cdot 90° \pm 5°,$$

wherein n stands for the number of the planar-parallel (100)-lenses and m is an integer. Compared to a uniform, non-rotated orientation of the lenses, the mutually rotated arrangement of the lenses leads to a reduction of the maximum birefringence value of 30% at an aperture angle of θ=30°. Approximate rotational symmetry in the distribution of the optical path differences for two mutually orthogonal states of linear polarization is also obtained with lenses of an arbitrary shape if all rays of a bundle have angles of similar magnitude and cover light paths of similar length inside the lenses. The lenses should therefore be assembled into groups in such a manner that the foregoing condition is approximated as much as possible within each group.

Figure 4E:
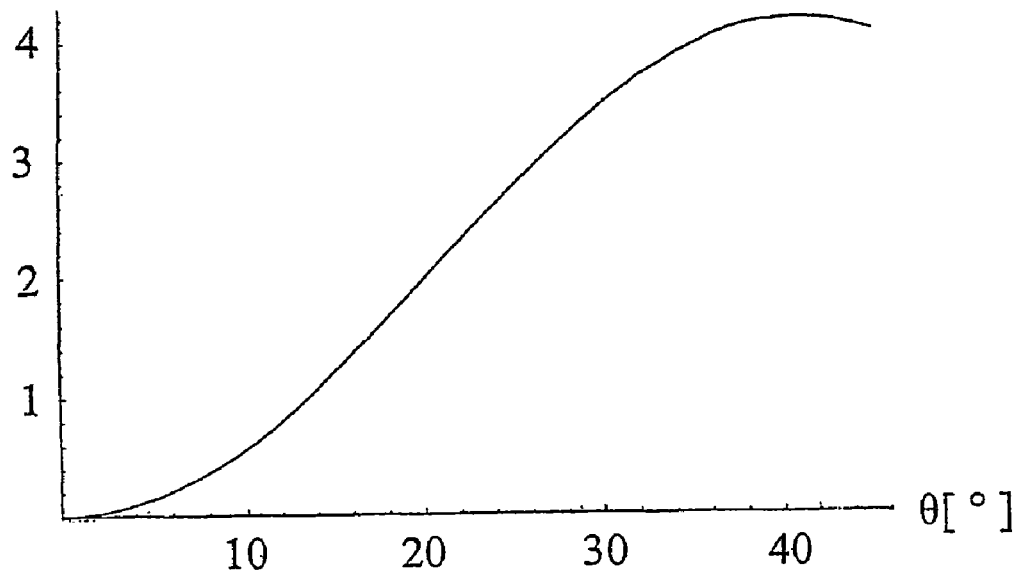

The graph of FIG. 4E shows the amount of the effective intrinsic birefringence for the two adjacent planar-parallel (100)-lenses of equal thickness of FIG. 4D as a function of the aperture angle θ at a fixed azimuth angle of α=0°. The maximum value of 4.2 nm/cm of the effective intrinsic birefringence at an aperture angle θ=41° represents a 35% reduction compared to the maximum value of 6.5 nm/cm in FIG. 4A.

Figure 4F:
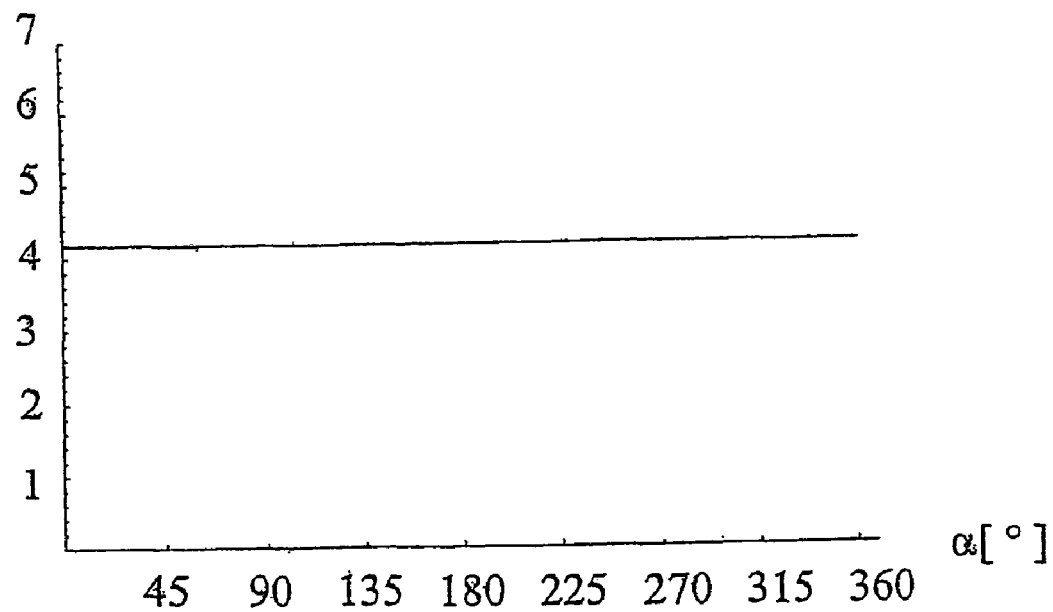

The graph of FIG. 4F shows the amount of the effective intrinsic birefringence for the two adjacent planar-parallel (100)-lenses of equal thickness of FIG. 4D as a function of the azimuth angle at a fixed aperture angle of θ=41°. The effective intrinsic birefringence values are in this case independent of the azimuth angle α.

Figure 5A:
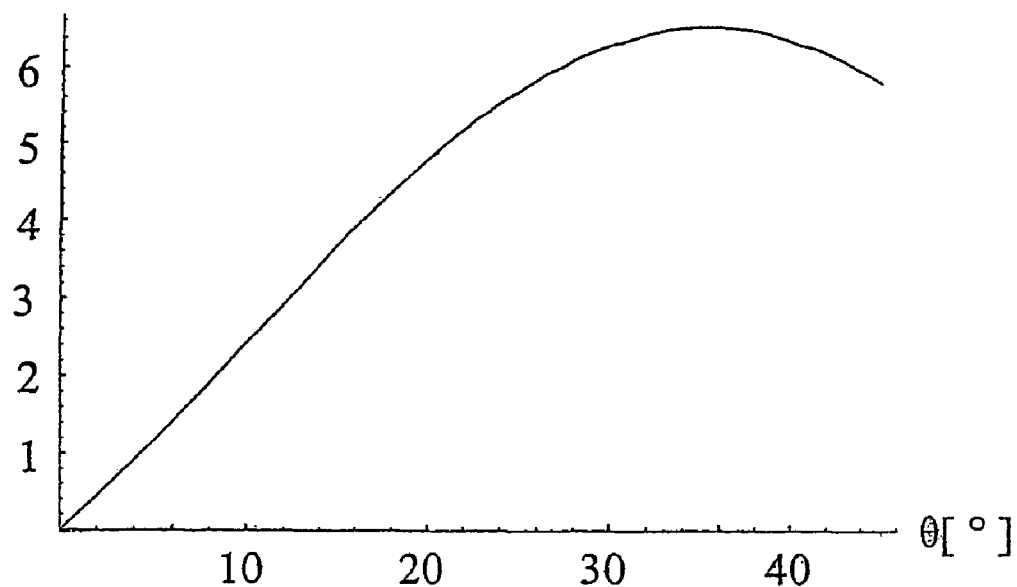
FIGS. 5A–F illustrate the birefringence distribution of (111)-lenses in different representations, as well as the birefringence distribution for two (111)-lenses that are rotated by an angle of 60° relative to each other.

The graph of FIG. 5A represents the amount of the intrinsic birefringence as a function of the aperture angle θ for an azimuth angle α=0° in a (111)-lens. The value of 6.5 nm/cm for the intrinsic birefringence at an aperture angle of θ=35° is based on the measured value. The curve profile was determined based on formulas that are known in the field of crystal optics.

Figure 5B:
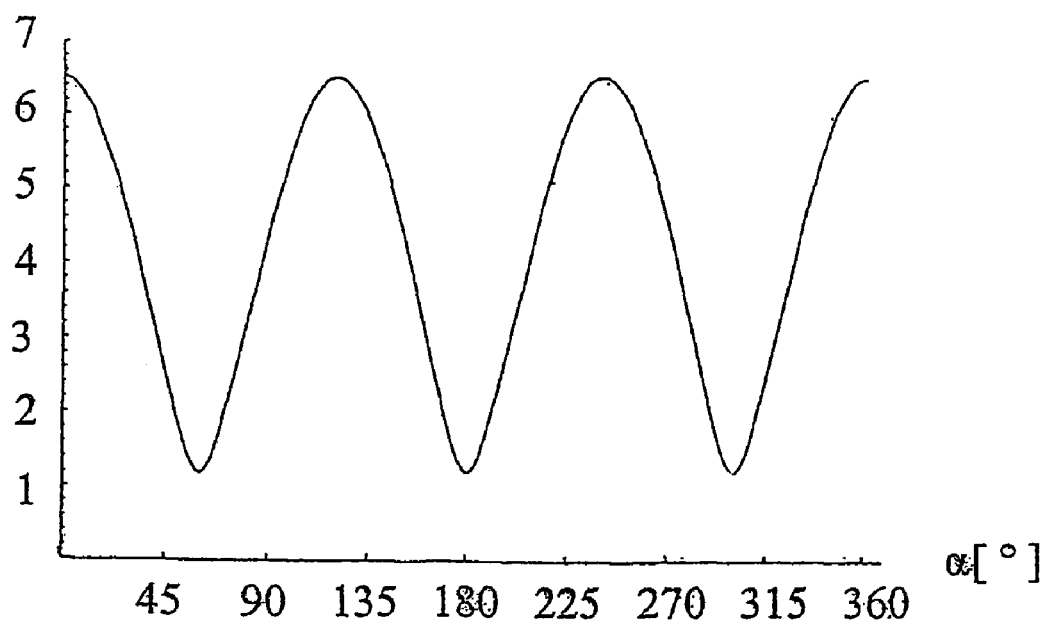

The graph of FIG. 5B represents the amount of the intrinsic birefringence as a function of the azimuth angle α at an aperture angle of θ=35° for a (111)-lens. The threefold azimuthal symmetry is readily apparent.

Figure 5C:
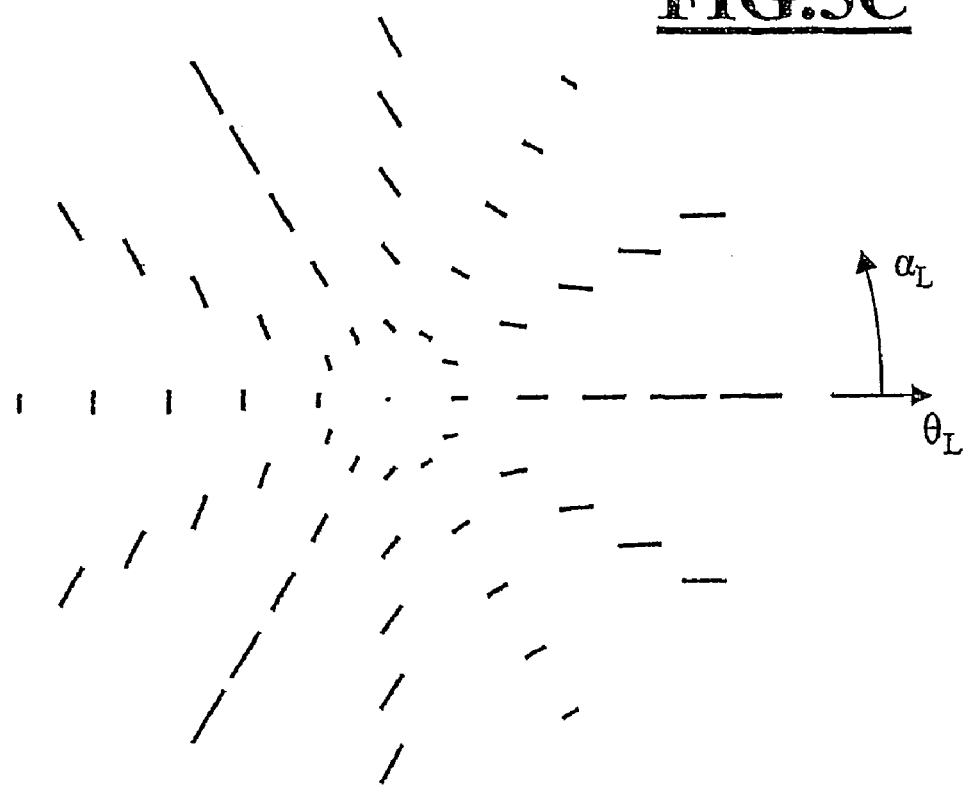

The diagram of FIG. 5C represents the birefringence distribution Δn(θ,α) for individual light ray directions in a (θ,α)-coordinate system for a (111)-lens in the same format that was introduced above in FIG. 4C. The directions as well as the lengths of the lines are indicative of a threefold symmetry of the distribution. The length of the lines, and thus the amount of the birefringence, is largest at the azimuth angles of 0°, 120°, and 240°. In contrast to a (100)-lens, the orientation of the birefringence turns by 90° when a light ray traverses a lens at an azimuth angle of 180° instead of 0°. Thus, the birefringence can be compensated, e.g., with two (111)-lenses of the same orientation, if the rays of a bundle reverse the signs of their angles between the two lenses. This condition applies in particular in all cases where a light bundle originating from an object point on the optical axis has a diameter maximum or minimum between the two equally oriented lenses. Refractive projection objectives have a plurality of lens groups of positive and negative refractive power. In particular, a maximum of the bundle diameter is often located in lens groups of positive refractive power, and a minimum of the bundle diameter is often located in lens groups of negative refractive power. A typical microlithography projection objective has, e.g., a first lens group of positive refractive power, a second lens group of negative refractive power, a third lens group of positive refractive power, a fourth lens group of negative refractive power, and a fifth lens group of positive refractive power. The light bundle has a diameter maximum inside the first group, a minimum in the second group, a maximum in the third group, a minimum in the fourth group, and a maximum in the fifth group. It is therefore advantageous to arrange equally oriented (111)-lenses before and after a position where the light bundle has a diameter maximum or minimum or more precisely, (111)-lenses oriented relative to each other at an angle of rotation $\gamma=l\cdot 120°\pm 10°$, wherein l is any integer number. Because of the threefold symmetry of the birefringence distribution of (111)-lenses, a rotation of $\gamma=l\cdot 120°$ has no influence on the birefringent effect of a (111)-lens. A ray with an almost unchanged aperture angle, but whose azimuth angle changes by 180° between the equally oriented (111)-lenses, is subject to an at least partial compensation of the optical path difference for two mutually orthogonal states of linear polarization.

Figure 5D:
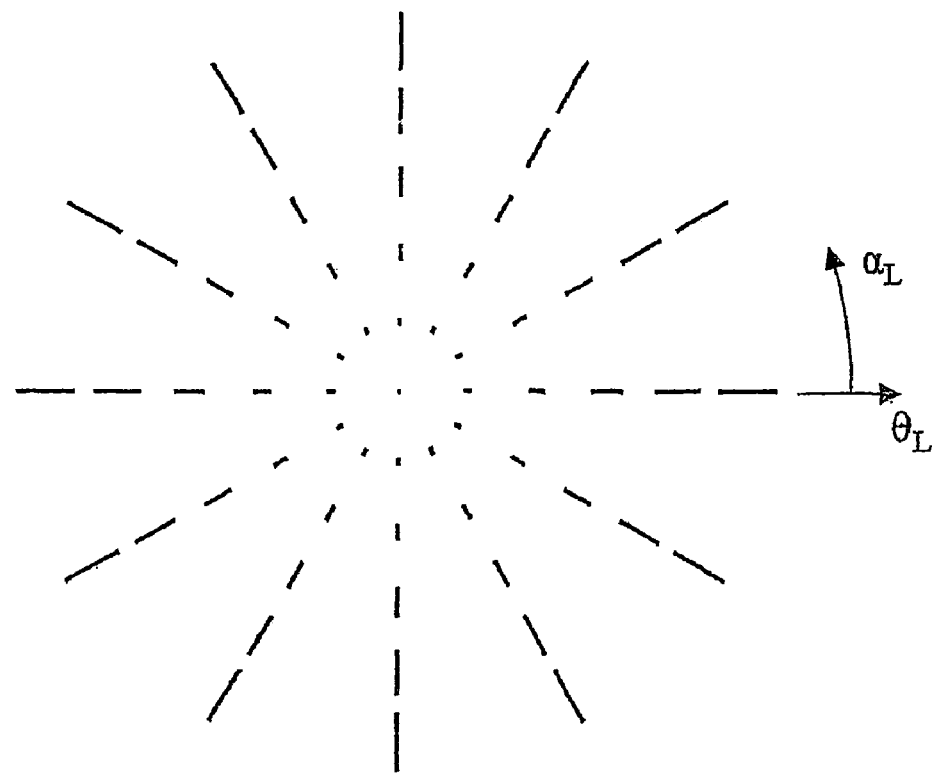

FIG. 5D represents the effective birefringence distribution $\Delta n(\theta,\alpha)$ that is obtained if two adjacent planar-parallel (111)-lenses of equal thickness are arranged with a 60° rotation relative to each other. The resultant effective birefringence distribution $\Delta n(\theta,\alpha)$ is independent of the azimuth angle $\alpha$. However, in contrast to FIG. 4D, the longer principal axes of the intersecting ellipses run in the radial direction. The resultant optical path differences for two mutually orthogonal states of polarization are obtained by multiplying the effective birefringence values with the physical path lengths traveled by the light rays inside the planar-parallel (111)-lenses. Rotationally symmetric effective birefringence distributions are obtained likewise by arranging a number n of planar-parallel (111)-lenses of equal thickness in such a manner that the rotation angle β between any two of the lenses conforms to the equation $$\gamma = \frac{120°}{n} + l \cdot 120° \pm 5°,$$

wherein n stands for the number of the planar-parallel (111)-lenses and l is an integer. Compared to a uniform orientation of the lenses in one direction, the mutually rotated arrangement of the lenses leads to a reduction of the maximum birefringence value of 68% at an aperture angle of $\theta=30°$. Approximate rotational symmetry in the distribution of the optical path differences for two mutually orthogonal states of linear polarization is also obtained with lenses of an arbitrary shape if all rays of a bundle have angles of similar magnitude and cover light paths of similar length inside the lenses. The lenses should therefore be assembled into groups in such a manner that the foregoing condition is approximated as much as possible within each group.

Figure 5E:
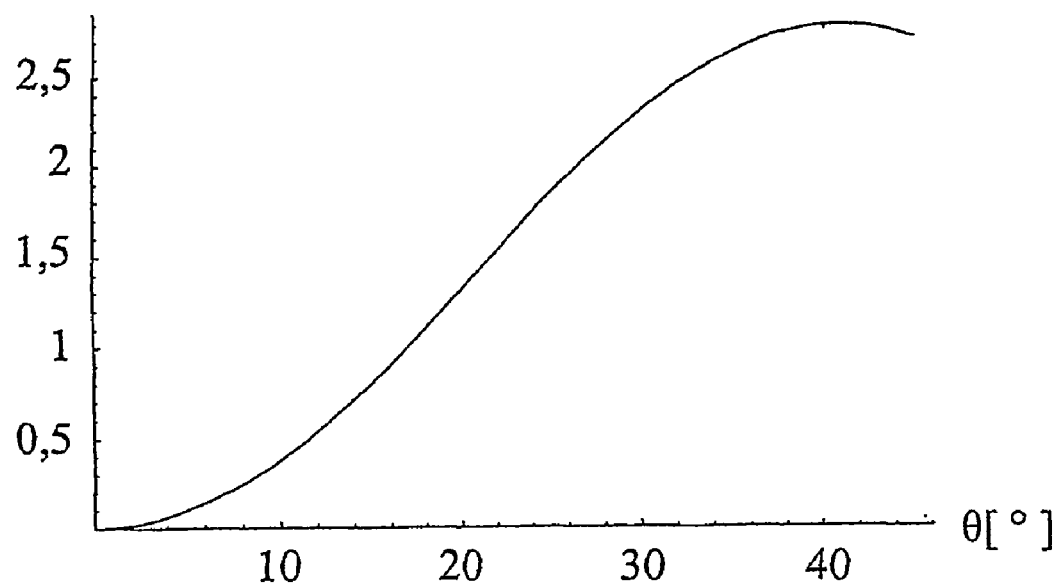

The graph of FIG. 5E shows the amount of the effective intrinsic birefringence for the two adjacent planar-parallel (111)-lenses of equal thickness of FIG. 5D as a function of the aperture angle θ at a fixed azimuth angle of $\alpha=0°$. The maximum value of 2.8 nm/cm of the effective intrinsic birefringence at an aperture angle $\theta=41°$ represents a 57% reduction compared to the maximum value of 6.5 nm/cm in FIG. 5A.

Figure 5F:
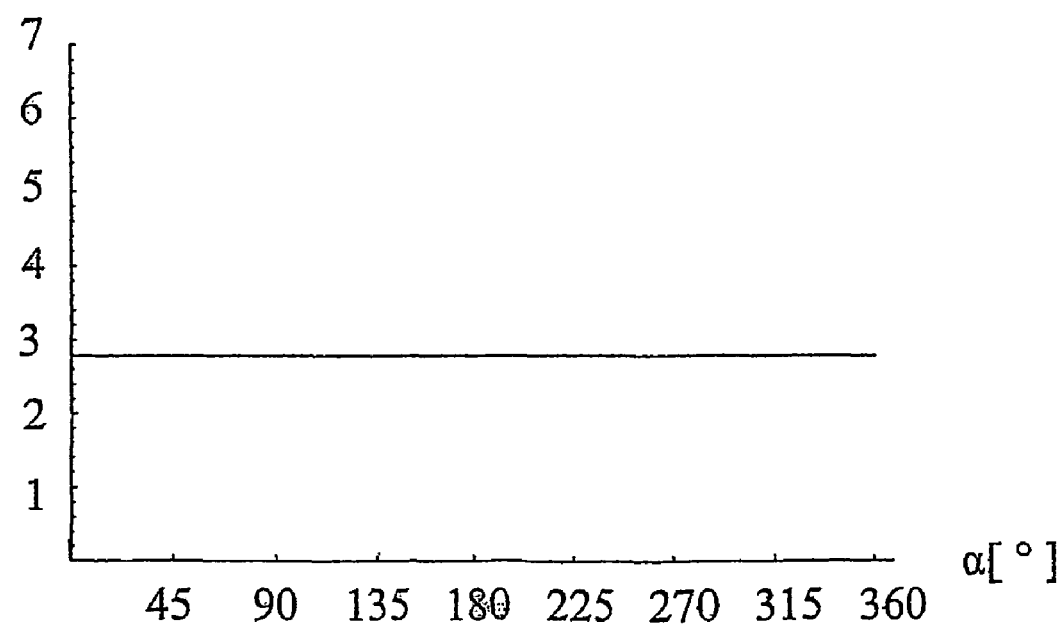

The graph of FIG. 5F shows the amount of the intrinsic birefringence for the two adjacent planar-parallel (111)-lenses of equal thickness of FIG. 5D as a function of the azimuth angle at a fixed aperture angle of $\theta=41°$. The effective intrinsic birefringence value is in this case independent of the azimuth angle $\alpha$.

By combining groups of (100)-lenses with groups of (111)-lenses within a projection objective, the optical path differences contributed by the individual lenses for two mutually orthogonal states of linear polarization can be compensated to a large extent. This requires that an approximate rotational symmetry in the distribution of the optical path differences is first obtained within each of the groups by rotating the lenses relative to each other. By combining a group of (100)-lenses with a group of (111)-lenses, the two distributions of optical path differences are then compensated against each other. The compensation takes advantage of the fact that the longer principal axes of the intersecting ellipses for the effective birefringence distribution of a group of rotated (100)-lenses are oriented perpendicular to the longer principal axes of the intersecting ellipses for the effective birefringence distribution of a group of rotated (111)-lenses, as can be seen in FIGS. 4D and 5D. It is of importance that on the one hand each of the individual groups generates a distribution of the optical path differences with approximate rotational symmetry, and on the other hand that the sum of the contributions of the groups of (100)-lenses is of approximately equal absolute magnitude as the sum of the contributions of the groups of (111)-lenses.

Figure 6A:
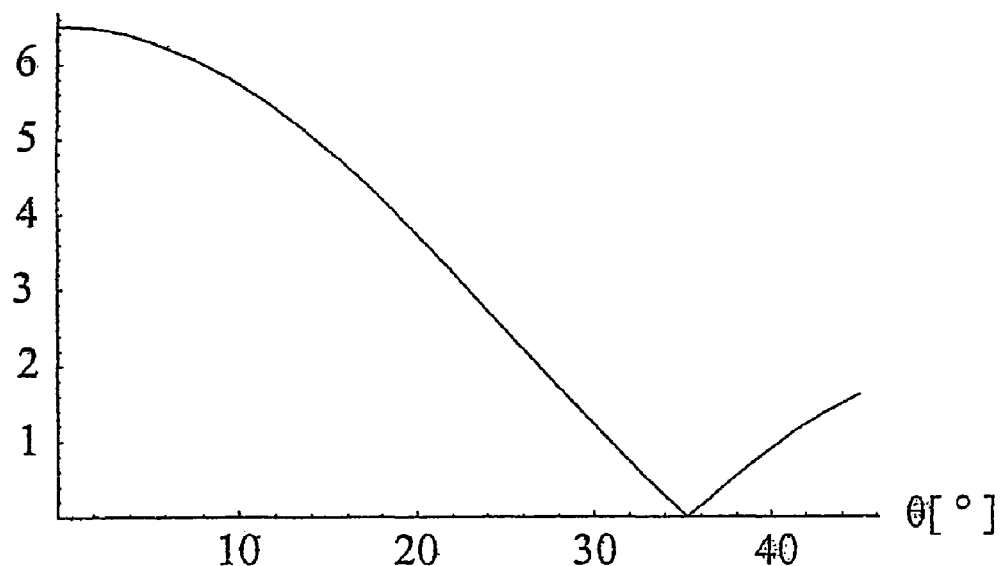
FIGS. 6A–G illustrate the birefringence distribution of (110)-lenses in different representations, as well as the birefringence distribution for two (110)-lenses that are rotated by an angle of 90° relative to each other, and the birefringence distribution for four (110)-lenses that are rotated by an angle of 45° relative to each other.

The graph of FIG. 6A represents the amount of the intrinsic birefringence as a function of the aperture angle θ for an azimuth angle $\alpha=0°$ in a (110)-lens. The value of 6.5 nm/cm for the intrinsic birefringence at an aperture angle of $\theta=35°$ is based on the measured value. The curve profile was determined based on formulas that are known in the field of crystal optics.

Figure 6B:
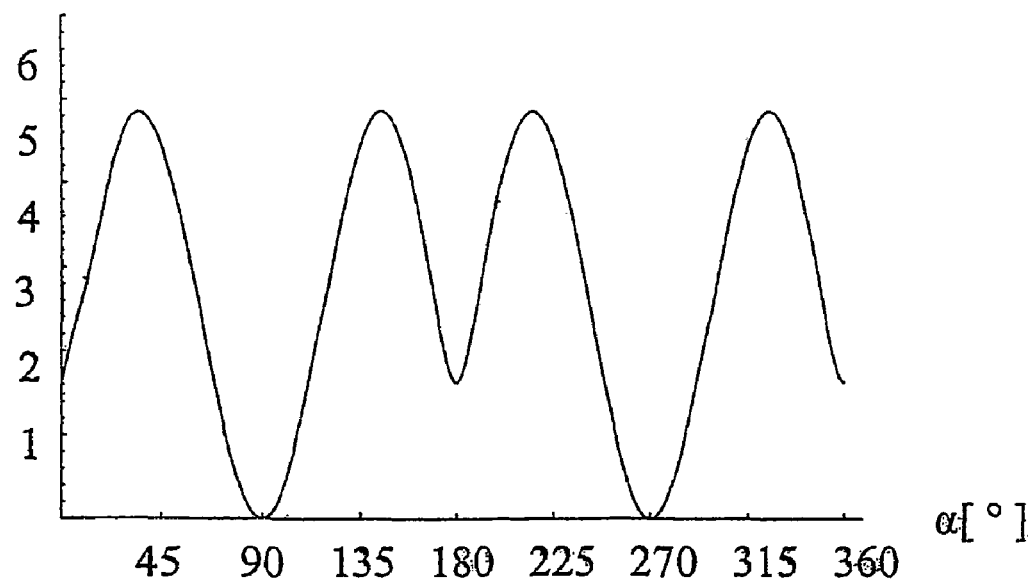

The graph of FIG. 6B represents the amount of the intrinsic birefringence as a function of the azimuth angle α at an aperture angle of $\theta=35°$ for a (110)-lens. The twofold azimuthal symmetry is readily apparent.

Figure 6C:
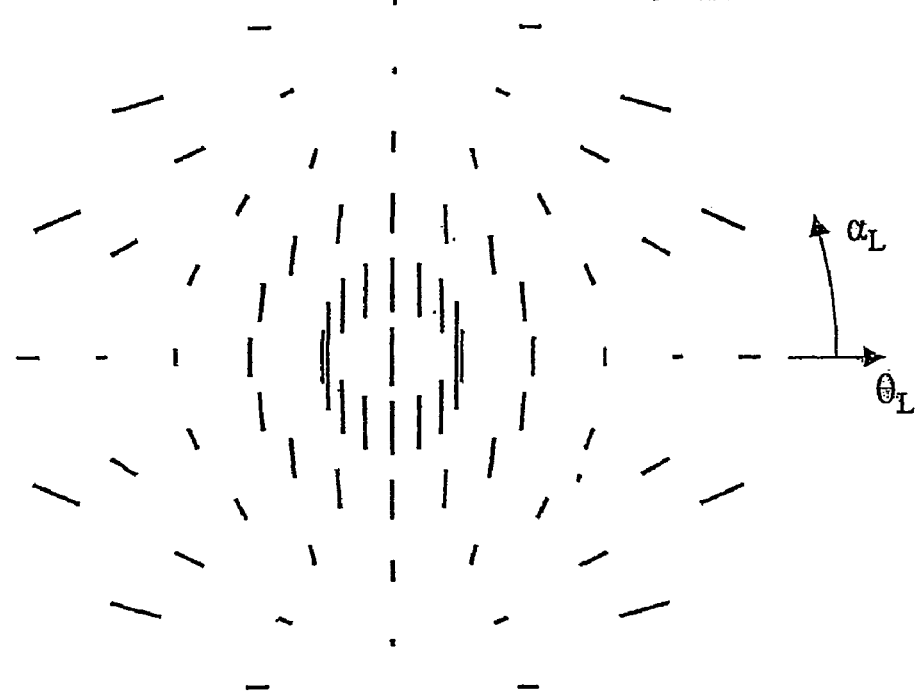

The diagram of FIG. 6C represents the birefringence distribution $\Delta n(\theta,\alpha)$ for individual light ray directions in a $(\theta,\alpha)$-coordinate system for a (110)-lens in the same format that was introduced above in FIG. 4C. The directions as well as the lengths of the lines are indicative of a twofold symmetry of the distribution. The length of the lines, and thus the amount of the birefringence, is largest at an aperture angle of $\theta=0°$.

Figure 6D:
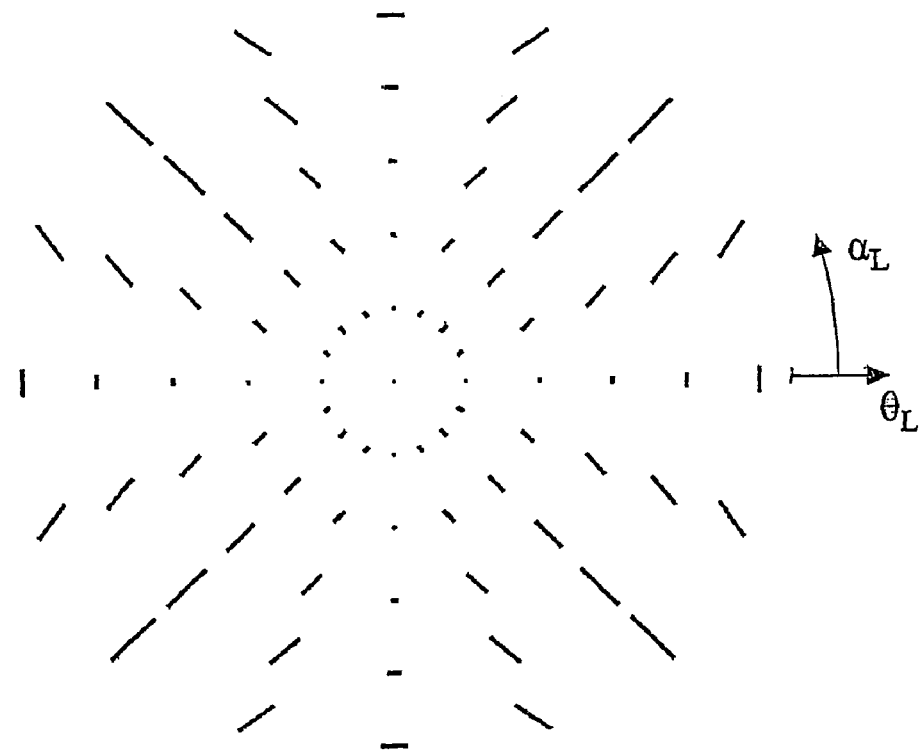

FIG. 6D represents the effective birefringence distribution $\Delta n(\theta,\alpha)$ that is obtained if two adjacent planar-parallel (110)-lenses of equal thickness are arranged with a 90° rotation relative to each other. The resultant effective birefringence distribution $\Delta n(\theta,\alpha)$ has a fourfold azimuthal symmetry. The maximum effective birefringence values occur at the azimuth angles of $\alpha=45°, 135°, 225°$ and $315°$, with a value of 2.6 nm/cm at $\theta=40°$.

Figure 6E:
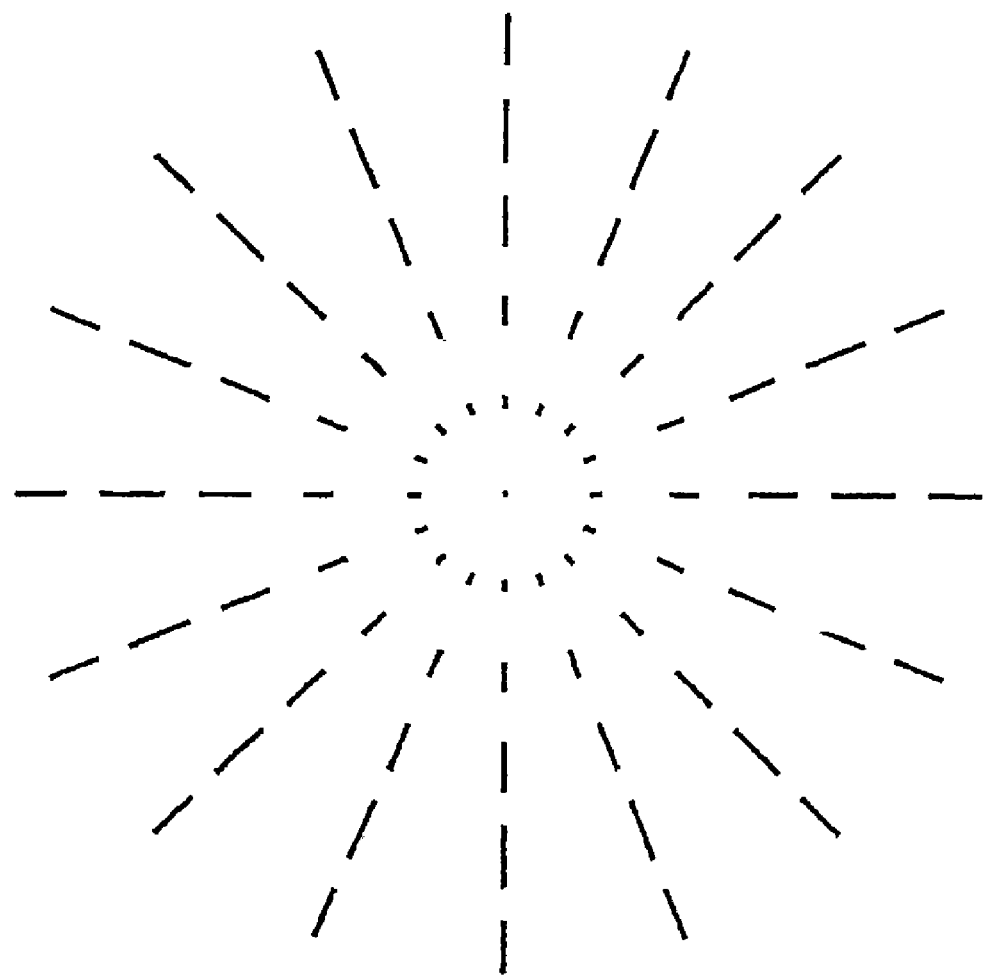

The graph of FIG. 6E illustrates the effective birefringence distribution $\Delta n(\theta,\alpha)$ that is obtained when the two adjacent planar-parallel (110)-lenses of equal thickness of FIG. 6D are combined with two further planar-parallel (110)-lenses of equal thickness. The angle of rotation between any two of the (110)-lenses is 45°. The resultant effective birefringence distribution $\Delta n(\theta,\alpha)$ is independent of the azimuth angle $\alpha$. However, in contrast to FIG. 4C, the longer principal axes of the intersecting ellipses extend in the radial direction, similar to the distribution of FIG. 5C. The resultant optical path differences for two mutually orthogonal states of polarization are obtained by multiplying the effective birefringence values with the physical path lengths traveled by the light rays inside the (110)-lenses. Rotationally symmetric effective birefringence distributions are likewise obtained by arranging a number 4·n of planar-parallel (110)-lenses of equal thickness in such a manner that the rotation angle $\beta$ between any two of the lenses conforms to the equation $$\beta = \frac{45°}{n} + m \cdot 90° \pm 5°,$$

wherein the number of the planar-parallel (110)-lenses is 4·n and m is an integer. Approximate rotational symmetry in the distribution of the optical path differences for two mutually orthogonal states of linear polarization is also obtained with lenses of an arbitrary shape if all rays of a bundle have angles of similar magnitude and cover light paths of similar length inside the lenses. The lenses should therefore be assembled into groups in such a manner that the foregoing condition is approximated as much as possible within each group.

Figure 6F:
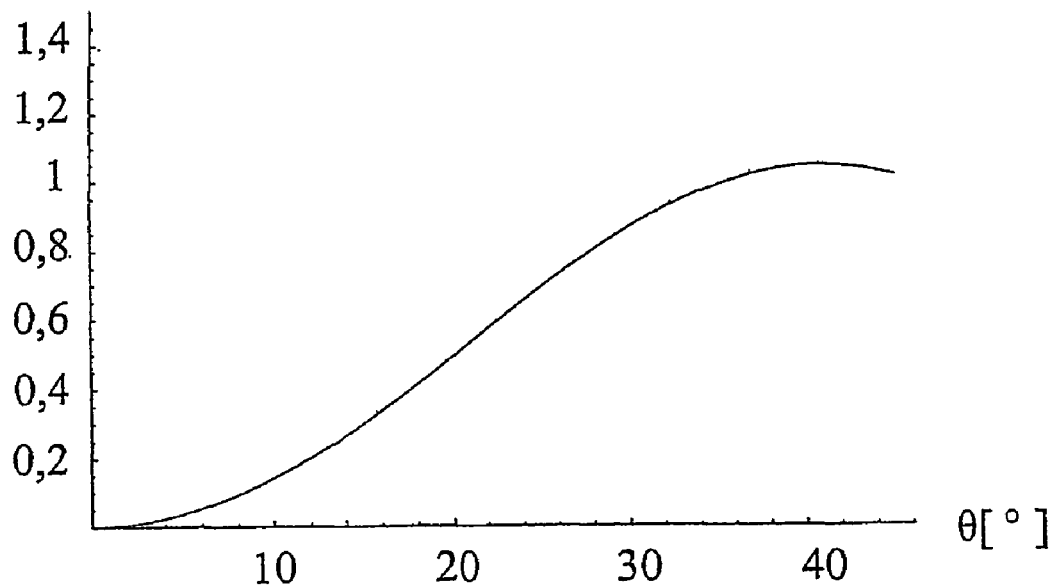

The graph of FIG. 6F shows the amount of the intrinsic effective birefringence for the four adjacent planar-parallel (110)-lenses of equal thickness of FIG. 6E as a function of the aperture angle $\theta$ at a fixed azimuth angle of $\alpha=0°$. The effective intrinsic birefringence value at an aperture angle of $\theta=41°$ is in this case 1.0 nm/cm and is thus reduced by 84% in comparison to the maximum value of 6.5 nm/cm in FIG. 5A.

Figure 6G:
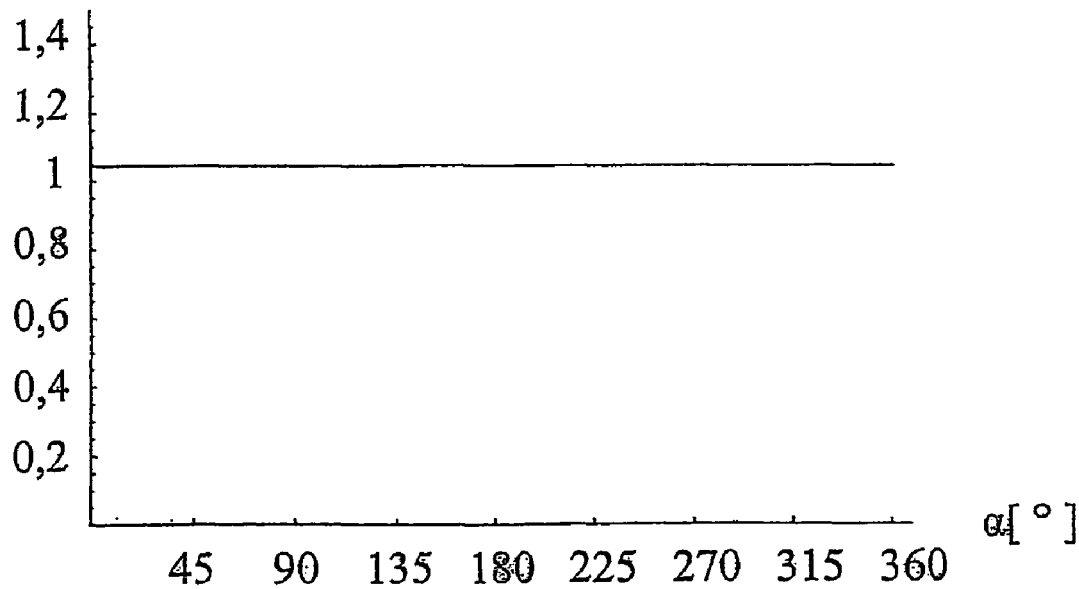

The graph of FIG. 6G illustrates the amount of the effective intrinsic birefringence for the four adjacent planar-parallel (110)-lenses of equal thickness of FIG. 6E as a function of the azimuth angle $\alpha$ at a fixed aperture angle of $\theta=41°$. The effective intrinsic birefringence is independent of the azimuth angle $\alpha$.

By combining groups of (110)-lenses with groups of (100)-lenses within a projection objective, the optical path differences contributed by the individual lenses for two mutually orthogonal states of linear polarization can be compensated to a large extent. This requires that an approximate rotational symmetry in the distribution of the optical path differences is first obtained within each of the groups by rotating the lenses relative to each other. By combining a group of (110)-lenses with a group of (100)-lenses, the two distributions of optical path differences are then compensated against each other. The compensation takes advantage of the fact that the longer principal axes of the intersecting ellipses for the effective birefringence distribution of a group of rotated (110)-lenses are oriented perpendicular to the longer principal axes of the intersecting ellipses for the effective birefringence distribution of a group of rotated (100)-lenses, as can be seen in FIGS. 4D and 6E. It is of importance that on the one hand each of the individual groups generates a distribution of the optical path differences with approximate rotational symmetry, and on the other hand that the sum of the contributions of the groups of (110)-lenses is of approximately equal absolute magnitude as the sum of the contributions of the groups of (100)-lenses.

Figure 7:
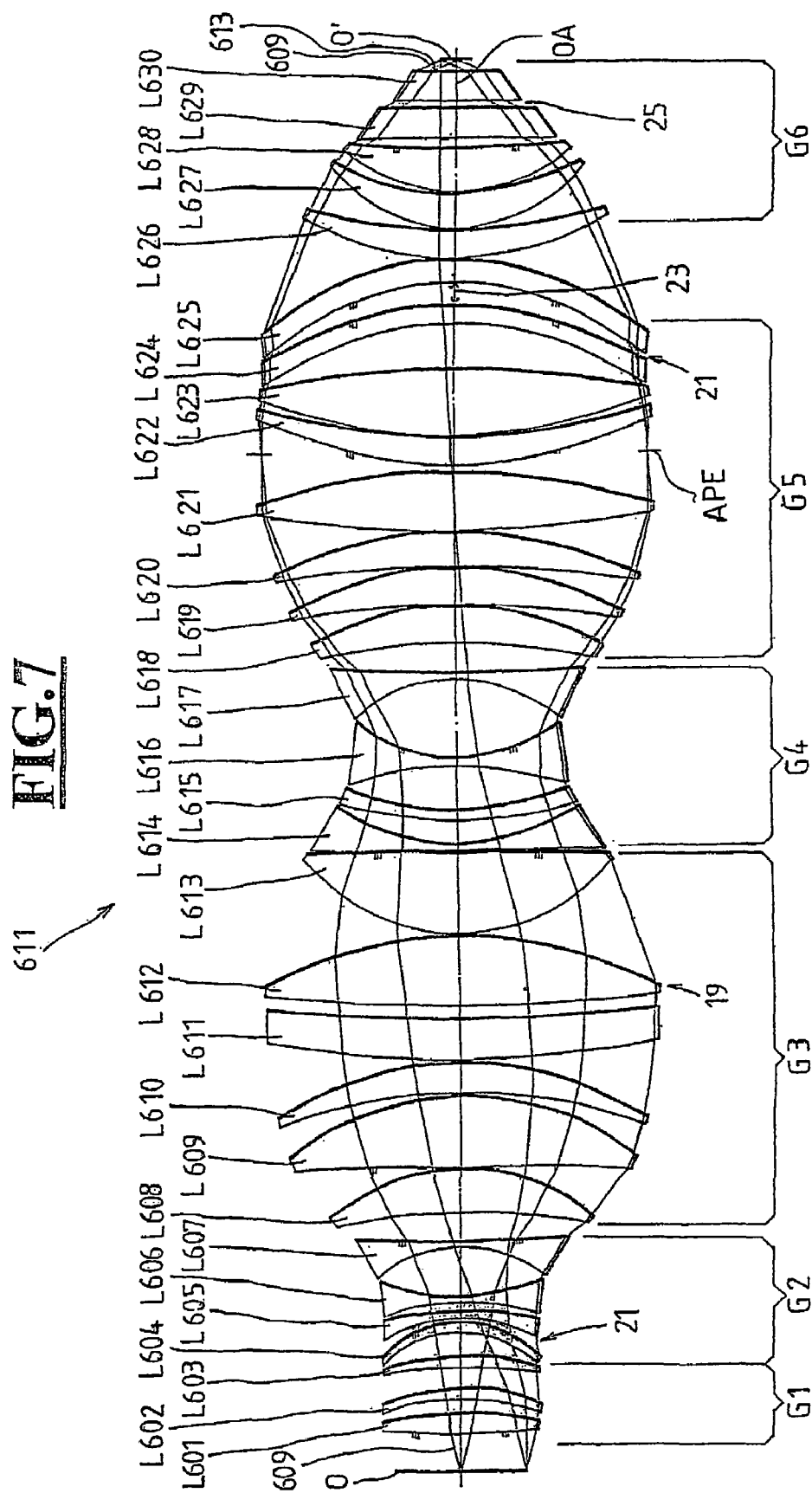
FIG. 7 shows a sectional view of the lenses of a refractive projection objective.

FIG. 7 represents a sectional lens view of the lenses of a refractive projection objective 611 for the wavelength of 157 nm. The optical data for this objective are listed in Table 1. This example is borrowed from the patent application PCT/EP00/13148 (WO 150171 A1) owned by the same assignee as the present invention, where the same objective is shown in FIG. 7 and specified in Table 6. For a detailed functional description of the objective, the reader is referred to the patent application PCT/EP00/13148 (WO 150171 A1). All lenses of this objective consist of calcium fluoride crystal. The numerical aperture on the image side of the objective is 0.9. The imaging performance of this objective is compensated to such a high degree that the wavefront deviation from an ideal spherical wave is smaller than 1.8 thousandths of a wavelength for light of 157 nm wavelength. Especially in high-performance objectives of this type, it is necessary to compensate the detrimental effects of intrinsic birefringence as much as possible.

In the example of FIG. 7, the aperture angles 74 and path lengths $RL_L$ were calculated for the outermost aperture ray 609 in the individual lenses L601 to L630. The outermost aperture ray 609 originates from the object point at the coordinates x=0 mm and y=0 mm and its angle in the image plane relative to the optical axis corresponds to the numerical aperture on the image side of the objective. The outermost aperture ray 609 is of special interest because its aperture angle inside each lens is close to the maximum aperture angle for any ray passing through the lens.

TABLE 2

Optical path differences for an outermost aperture ray traveling through the objective of FIG. 7

| Lens | Aperture angle $\theta$ [°] | Path length $RL_L$ [mm] | Optical path difference (111) - lens $\alpha_L = 0°$ [nm] | Optical path difference (111) - lens $\alpha_L = 60°$ [nm] | Optical path difference (100) - lens $\alpha_L = 0°$ [nm] | Optical path difference (100) - lens $\alpha_L = 45°$ [nm] | Optical path difference (110) - lens $\alpha_L = 0°$ [nm] | Optical path difference (110) - lens $\alpha_L = 45°$ [nm] | Optical path difference (110) - lens $\alpha_L = 90°$ [nm] | Optical path difference (110) - lens $\alpha_L = 135°$ [nm] |
|---|---|---|---|---|---|---|---|---|---|---|
| L601 | 8.1 | 15.1 | 2.9 | −2.2 | −0.8 | −0.4 | −9.0 | −9.0 | −9.1 | −9.0 |
| L602 | 8.7 | 8.2 | 1.7 | −1.2 | −0.5 | −0.2 | −4.9 | −4.8 | −4.9 | −4.8 |
| L603 | 7.8 | 9.5 | 1.7 | −1.3 | −0.4 | −0.2 | −5.7 | −5.7 | −5.7 | −5.7 |
| L604 | 10.7 | 7.2 | 1.9 | −1.3 | −0.6 | −0.3 | −4.1 | −4.1 | −4.1 | −4.1 |
| L605 | 9.4 | 6.5 | 1.5 | −1.0 | −0.4 | −0.2 | −3.8 | −3.8 | −3.8 | −3.8 |
| L606 | 10.3 | 8.5 | 2.1 | −1.4 | −0.7 | −0.3 | −4.8 | −4.8 | −4.8 | −4.8 |
| L607 | 21.8 | 12.7 | 6.6 | −2.7 | −3.9 | −1.8 | −4.2 | −4.2 | −4.3 | −4.2 |

TABLE 2-continued

Optical path differences for an outermost aperture ray traveling through the objective of FIG. 7

| Lens | Aperture angle θ [°] | Path length $RL_L$ [mm] | Optical path difference (111) - lens $α_L = 0°$ [nm] | Optical path difference (111) - lens $α_L = 60°$ [nm] | Optical path difference (100) - lens $α_L = 0°$ [nm] | Optical path difference (100) - lens $α_L = 45°$ [nm] | Optical path difference (110) - lens $α_L = 0°$ [nm] | Optical path difference (110) - lens $α_L = 45°$ [nm] | Optical path difference (110) - lens $α_L = 90°$ [nm] | Optical path difference (110) - lens $α_L = 135°$ [nm] |
|---|---|---|---|---|---|---|---|---|---|---|
| L608 | 25.4 | 22.2 | 12.8 | −4.4 | −8.7 | −3.9 | −5.3 | −5.7 | −5.8 | −5.7 |
| L609 | 16.3 | 36.1 | 14.3 | −7.6 | −6.8 | −3.3 | −16.5 | −16.5 | −16.7 | −16.5 |
| L610 | 12.2 | 15.2 | 4.5 | −2.9 | −1.7 | −0.8 | −8.2 | −8.2 | −8.2 | −8.2 |
| L611 | 2.3 | 26.6 | 1.4 | −1.3 | −0.1 | −0.1 | −17.2 | −17.2 | −17.2 | −17.2 |
| L612 | 2.3 | 32.2 | 1.6 | −1.5 | −0.1 | −0.1 | −20.8 | −20.8 | −20.8 | −20.8 |
| L613 | −18.3 | 30.4 | −6.6 | 13.5 | −7.0 | −3.3 | −12.5 | −12.6 | −12.7 | −12.6 |
| L614 | −18.7 | 22.0 | −4.8 | 10.0 | −5.3 | −2.5 | −8.9 | −8.9 | −9.0 | −8.9 |
| L615 | −14.0 | 10.2 | −2.0 | 3.5 | −1.5 | −0.7 | −5.1 | −5.1 | −5.2 | −5.1 |
| L616 | −1.3 | 29.8 | −0.8 | 0.9 | 0.0 | 0.0 | −19.3 | −19.3 | −19.3 | −19.3 |
| L617 | 26.4 | 31.6 | 18.6 | −6.1 | −13.0 | −5.7 | −6.7 | −7.6 | −7.5 | −7.6 |
| L618 | 33.5 | 14.3 | 9.3 | −2.0 | −7.9 | −3.1 | −0.6 | 3.2 | −1.4 | 3.2 |
| L619 | 26.5 | 7.5 | 4.4 | −1.4 | −3.1 | −1.4 | −1.6 | −1.8 | −1.8 | −1.8 |
| L620 | 19.3 | 6.4 | 3.0 | −1.4 | −1.6 | −0.8 | −2.5 | −2.5 | −2.5 | −2.5 |
| L621 | 6.7 | 8.0 | 1.3 | −1.0 | −0.3 | −0.1 | −4.9 | −4.9 | −4.9 | −4.9 |
| L622 | −10.3 | 7.7 | −1.3 | 1.9 | −0.6 | −0.3 | −4.4 | −4.4 | −4.4 | −4.4 |
| L623 | −11.9 | 9.6 | −1.8 | 2.8 | −1.0 | −0.5 | −5.2 | −5.2 | −5.2 | −5.2 |
| L624 | 0.3 | 17.8 | 0.1 | −0.1 | 0.0 | 0.0 | −11.6 | −11.6 | −11.6 | −11.6 |
| L625 | 6.0 | 16.3 | 2.3 | −1.8 | −0.5 | −0.2 | −9.9 | −9.9 | −10.0 | −9.9 |
| L626 | −24.0 | 9.0 | −1.9 | 5.0 | −3.2 | −1.5 | −2.5 | −2.6 | −2.6 | −2.6 |
| L627 | −35.6 | 8.0 | −0.9 | 5.2 | −4.7 | −1.7 | 0.1 | 2.1 | −0.5 | 2.1 |
| L628 | −39.4 | 12.0 | −1.0 | 7.6 | −7.5 | −2.5 | 1.0 | 4.0 | −0.3 | 4.0 |
| L629 | −35.3 | 27.3 | −3.3 | 17.7 | −15.7 | −5.9 | 0.5 | 6.9 | −1.9 | 6.9 |
| L630 | −35.3 | 26.0 | −3.1 | 16.9 | −15.0 | −5.6 | 0.4 | 6.5 | −1.9 | 6.5 |
| Sum | | | 64.5 | 42.3 | 112.9 | 47.4 | −198.2 | −178.7 | −208.0 | −178.8 |

Table 2 lists the aperture angles θ and optical path lengths $RL_L$ for the outermost aperture ray in each of the lenses. The further columns indicate the optical path differences for two mutually orthogonal states of linear polarization, stating for each lens the different values that are obtained with different lens orientations. The respective optical path differences are listed for (111)-lenses traversed by the outermost aperture ray at azimuth angles of 0° and 60°, for (100)-lenses traversed by the outermost aperture ray at azimuth angles of 0° and 45°, and for (110)-lenses traversed by the outermost aperture ray at azimuth angles of 0°, 45°, 90°, and 135°.

According to Table 2, the aperture angle θ for the lenses L608, L617, L618, L619, L627, L628, L629 and L630 is larger than 25°, exceeding even 30° for the lenses L618, L627, L628, L629 and L630. Large aperture angles occur in particular in the lenses L627 to L630 which are closest to the image plane.

The design of the projection objective produced the result that the maximum among the aperture angles of all light rays is less than 45°. The largest aperture angle of the outermost aperture ray is 39.4° in the lens L628. It also proved helpful to use two thick planar lenses L629 and L630 immediately before the image plane.

Between the lenses L621 and L622, there is a diaphragm with a diameter of 270 mm. The lens L618 has a diameter of 207 mm, and the diameters of all of the lenses L627 to L630 are smaller than 190 mm. Thus the diameters of these lenses, which have large aperture angles, are smaller than 80% of the diaphragm diameter.

As can be concluded from Table 2, it is advantageous if individual lenses with large aperture angles have (100)-orientation, because the birefringence values are lower overall. This is due to the fact that the angle at which the birefringent effect of the <110>-direction begins to be noticeable is larger in (100)-lenses than in (111)-lenses. For example in the lenses L608, L609 and L617, the optical path differences are more than 30% lower.

The two planar-parallel lenses L629 and L630 are a good example to show how the magnitude of the birefringence can be significantly reduced by rotating the lenses relative to each other. Both lenses have equal aperture angles of 35.3° for the outermost aperture ray, with similar optical path lengths of 27.3 mm and 26.0 mm, respectively. If the two lenses were (100)-lenses and installed with equal orientation, they would produce a combined optical path difference of 30.7 nm. In contrast, if the two (100)-lenses are rotated relative to each other by 45°, the optical path difference is reduced to 20.9 nm, representing a reduction of 32%. If the two lenses were (111)-lenses and installed with equal orientation, they would produce a combined optical path difference of 34.6 nm. In contrast, if the two (111)-lenses are rotated relative to each other by 60°, the optical path difference is reduced to 13.6 nm, representing a reduction of 61%.

A near-perfect compensation of the optical path differences due to the intrinsic birefringence in the lenses L629 and L630 for two mutually orthogonal states of linear polarization can be achieved by splitting the lens L629 into the lenses L6291, L6292, and splitting the lens L630 into the lenses L6301 and L6302, wherein the lens L6291 is a (100)-lens with a thickness of 9.15 mm, the lens L6292 is a (111)-lens with a thickness of 13.11 mm, the lens L6301 is a (100)-lens with a thickness of 8.33 mm, and the lens L6302 is a (111)-lens with a thickness of 12.9 mm. The lenses L6291 and L6301 are rotated relative to each other by 45°; the lenses L6292 and L6302 are rotated relative to each other by 60°. As a result, the maximum of the optical path differences is 0.2 nm. The lenses L6291 and L6292 as well as the lenses L6301 and L6302 can be joined in an optically seamless manner, e.g. by means of a wringing fit.

The same principle can also be applied if the projection objective contains only one crystal lens. The one crystal lens in this case is split into at least two lenses that are arranged in rotated orientations relative to each other. The lenses can be joined together by wringing. As another possibility, one could first produce an optically seamless combination of individual plates that have the desired crystal orientation and then form the lens from the plate compound in a further process step.

As a further possibility, the detrimental effect of the intrinsic birefringence of the lenses L629 and L630 can also be reduced by splitting the lens L629 into the lenses L6293, L6294 and splitting the lens L630 into the lenses L6303, L6304, wherein the lens L6293 is a (110)-lens with a thickness of 11.13 mm, the lens L6294 is a (110)-lens with a thickness of 11.13 mm, the lens L6303 is a (110)-lens with a thickness of 10.62 mm, and the lens L6304 is a (110)-lens with a thickness of 10.62 mm. The lenses L6293 and L6294, as well as the lenses L6303 and L6304 are rotated relative to each other by 90°, and the angle of rotation between the lenses L6293 and L6303 is set to 45°. As a result, the maximum of the optical path differences is 4.2 nm. The lenses L6293 and L6294 as well as the lenses L6303 and L6304 can be joined as lens parts in an optically seamless manner, e.g. by means of a wringing fit.

A near-perfect compensation of the optical path differences for two mutually orthogonal states of linear polarization in the lenses L629 and L630 which have large aperture angles can be achieved by splitting the lens L629 into the three lenses L6295, L6296, L6297, and splitting the lens L630 into the three lenses L6305, L6306, L6307, wherein the lens L6295 is a (100)-lens with a thickness of 4.45 mm, the lenses L6296 and 6297 are (110)-lenses with a thickness of 8.9 mm, the lens L6305 is a (100)-lens with a thickness of 4.25 mm, and the lenses L6306 and L6307 are (110)-lenses with a thickness of 8.49 mm. The lenses L6295 and L6305 are rotated relative to each other by 45°; any two of the lenses L6296, L6297, L6306, and L6307 are rotated relative to each other by 45°. As a result, the maximum of the optical path differences is 0.1 nm. The lenses L6295 to L6297 as well as the lenses L6305 to L6307 can be joined in an optically seamless manner, e.g. by means of a wringing fit.

As a further possibility, the detrimental effect of the intrinsic birefringence of the lenses L629 and L630 can also be reduced by combining two (110)-lenses with a (100)-lens. The two (110)-lenses are installed with a 90° rotation relative to each other, while the angle of rotation between the (100)-lens and the (110)-lenses is 45°+m·90°, where m represents an integer number. The foregoing lens combination is obtained by splitting the lens L629 into the lenses L6298, L6299 and splitting the lens L630 into the lenses L6308, L6309, wherein the lens L6298 is a (110)-lens with a thickness of 17.40 mm, the lens L6299 is a (110)-lens with a thickness of 4.87 mm, the lens L6308 is a (110)-lens with a thickness of 12.53 mm, and the lens L6309 is a (100)-lens with a thickness of 8.7 mm. As a result, the maximum of the optical path differences is 3.1 nm. The lenses L6298 and L6299 as well as the lenses L6308 and L6309 can be joined as lens parts in an optically seamless manner, e.g. by means of a wringing fit.

Figure 8:
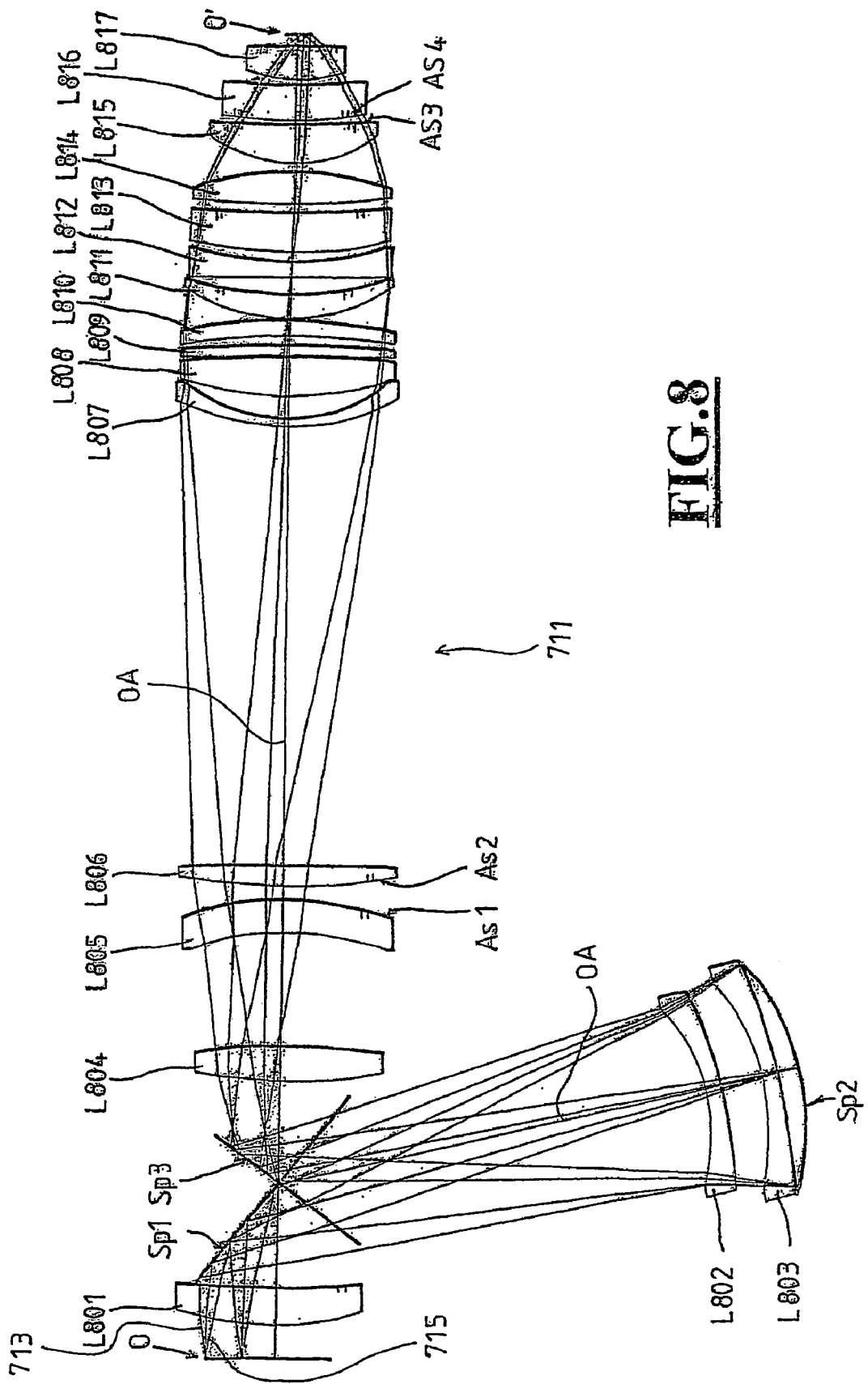
FIG. 8 shows a sectional view of the lenses of a catadioptric projection objective.
Figure 9:
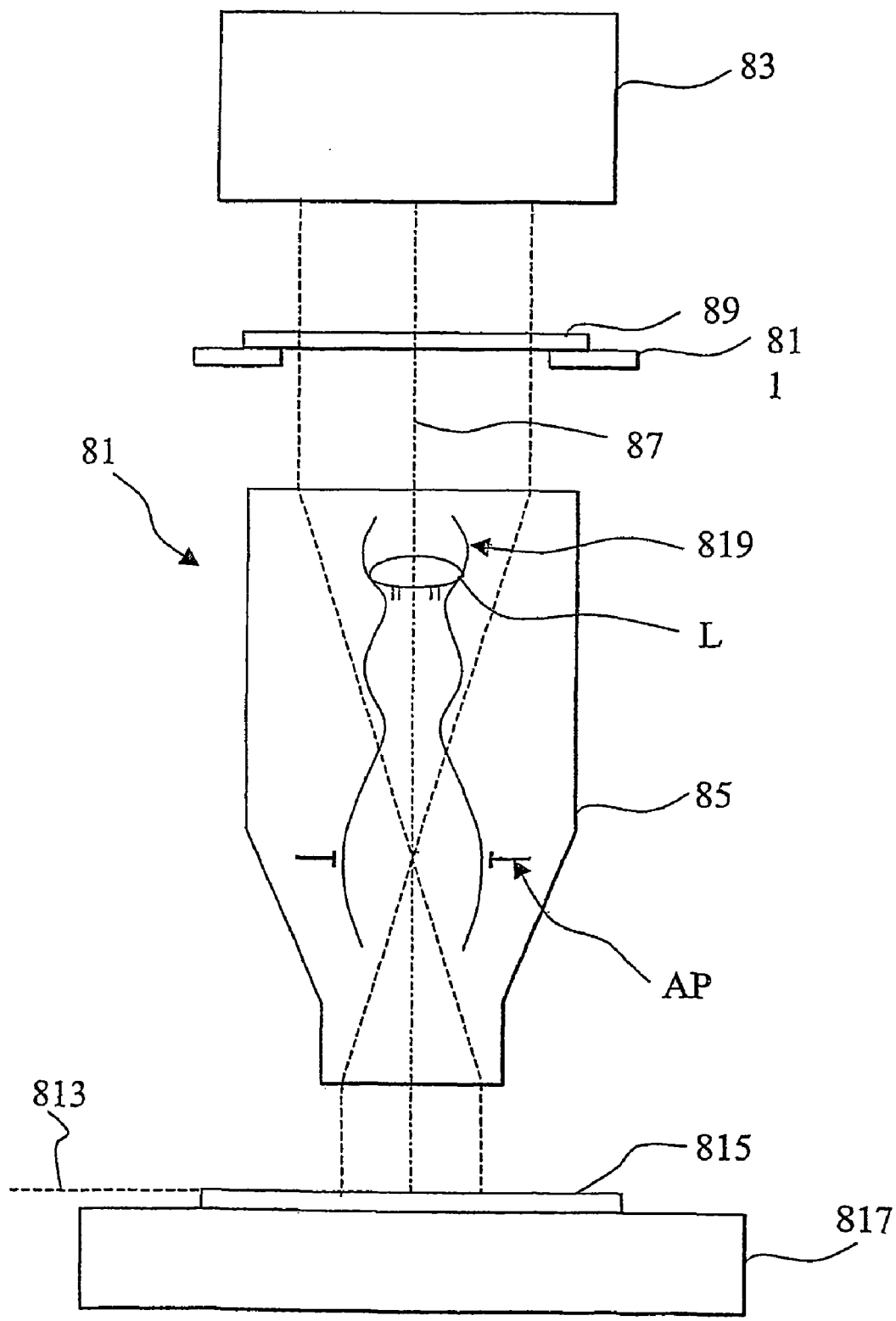
FIG. 9 illustrates a microlithography projection system in a schematic representation.

FIG. 8 represents a sectional lens view of the lenses of a catadioptric projection objective 711 for the wavelength of 157 nm. The optical specifications for this objective are listed in Table 3. This example is borrowed from the patent application PCT/EP00/13148 (WO 150171 A1) owned by the same assignee as the present invention, where the same objective is shown in FIG. 9 and specified in Table 8. For a detailed functional description of the objective, the reader is referred to the patent application PCT/EP00/13148 (WO 150171 A1). All lenses of this objective consist of calcium fluoride crystal. The numerical aperture on the image side of the objective is 0.8.

In the example of FIG. 8, the aperture angles θ and path lengths $RL_L$ were calculated for the upper outermost aperture ray 713 and the lower outermost aperture ray 715 in the individual lenses L801 to L817. The outermost aperture rays 713 and 715 originate from the object point at the coordinates x=0 mm and y=−82.15 mm and their angles in the image plane relative to the optical axis correspond to the numerical aperture on the image side of the objective. The upper and lower outermost aperture rays were analyzed in this case because the object field is located outside of the optical axis and therefore, unlike the outermost aperture ray in the example of FIG. 7, the upper and lower outermost aperture rays in the example of FIG. 8 are not symmetric to the optical axis.

Table 4 lists the aperture angles θ and optical path lengths $RL_L$ for the upper outermost aperture ray, and Table 5 lists the aperture angles θ and optical path lengths $RL_L$ for the lower outermost aperture in each of the lenses. The further columns in Tables 4 and 5 indicate the optical path differences for two mutually orthogonal states of linear polarization, stating for each lens the different values that are obtained with different lens orientations. The respective optical path differences are listed for (111)-lenses traversed by the outermost aperture ray at azimuth angles of 0° and 60°, for (100)-lenses traversed by the outermost aperture ray at azimuth angles of 0° and 45°, and for (110)-lenses traversed by the outermost aperture ray at azimuth angles of 0°, 45°, 90°, and 135°.

In accordance with Table 4 and Table 5, the aperture angles θ for the lenses L815 to L817 are larger than 250. In this embodiment, again, the lenses L815 to L817 which are closest to the image plane have large aperture angles.

Based on the design choices made for the lenses L815 to L817, the maximum for the aperture angle does not exceed $$\arcsin\left(\frac{NA}{n_{FK}}\right) = \arcsin\left(\frac{0.8}{1.5597}\right) = 30.9°.$$

The maximum value for the outermost aperture ray, 30.8°, occurs in the lens L817.

TABLE 4

Optical path differences for an uppermost aperture ray traveling through the objective of FIG. 8

| Lens | Aperture angle θ [°] | Path length $RL_L$ [mm] | Optical path difference (111) - lens $\alpha_L = 0°$ [nm] | Optical path difference (111) - lens $\alpha_L = 60°$ [nm] | Optical path difference (100) - lens $\alpha_L = 0°$ [nm] | Optical path difference (100) - lens $\alpha_L = 45°$ [nm] | Optical path difference (110) - lens $\alpha_L = 0°$ [nm] | Optical path difference (110) - lens $\alpha_L = 45°$ [nm] | Optical path difference (110) - lens $\alpha_L = 90°$ [nm] | Optical path difference (110) - lens $\alpha_L = 135°$ [nm] |
|---|---|---|---|---|---|---|---|---|---|---|
| L801 | 1.4 | 28.1 | 0.8 | -0.8 | 0.0 | 0.0 | -18.2 | -18.2 | -18.2 | -18.2 |
| L802 | -10.8 | 30.7 | -5.3 | 8.0 | -2.7 | -1.3 | -17.2 | -17.2 | -17.3 | -17.2 |
| L803 | -15.6 | 32.4 | -6.8 | 12.4 | -5.7 | -2.7 | -15.3 | -15.3 | -15.4 | -15.3 |
| L803 | -24.4 | 31.8 | -6.5 | 17.8 | -11.7 | -5.2 | -8.4 | -8.8 | -9.0 | -8.8 |
| L802 | -19.5 | 26.6 | -5.8 | 12.4 | -6.8 | -3.2 | -10.2 | -10.3 | -10.4 | -10.3 |
| L804 | 6.4 | 20.1 | 3.0 | -2.4 | -0.6 | -0.3 | -12.4 | -12.4 | -12.4 | -12.4 |
| L805 | 10.8 | 34.4 | 9.0 | -6.0 | -3.0 | -1.5 | -19.3 | -19.3 | -19.3 | -19.3 |
| L806 | 0.2 | 10.0 | 0.1 | -0.1 | 0.0 | 0.0 | -6.5 | -6.5 | -6.5 | -6.5 |
| L807 | -11.1 | 22.0 | -3.9 | 5.9 | -2.1 | -1.0 | -12.2 | -12.2 | -12.3 | -12.2 |
| L808 | 0.1 | 18.5 | 0.0 | 0.0 | 0.0 | 0.0 | -12.0 | -12.0 | -12.0 | -12.0 |
| L809 | -0.8 | 9.0 | -0.1 | 0.2 | 0.0 | 0.0 | -5.8 | -5.8 | -5.8 | -5.8 |
| L810 | 1.1 | 12.4 | 0.3 | -0.3 | 0.0 | 0.0 | -8.0 | -8.0 | -8.0 | -8.0 |
| L811 | -16.8 | 9.4 | -2.0 | 3.8 | -1.9 | -0.9 | -4.2 | -4.2 | -4.2 | -4.2 |
| L812 | -10.4 | 29.8 | -5.0 | 7.5 | -2.4 | -1.2 | -16.9 | -16.9 | -16.9 | -16.9 |
| L813 | -8.8 | 34.7 | -5.2 | 7.3 | -2.1 | -1.0 | -20.5 | -20.5 | -20.5 | -20.5 |
| L814 | -9.4 | 17.5 | -2.8 | 4.0 | -1.2 | -0.6 | -10.2 | -10.2 | -10.2 | -10.2 |
| L815 | -27.4 | 28.1 | -5.3 | 16.9 | -12.2 | -5.3 | -5.2 | -6.4 | -6.1 | -6.4 |
| L816 | -28.7 | 40.2 | -7.1 | 24.8 | -18.6 | -7.9 | -6.2 | -8.5 | -7.6 | -8.5 |
| L817 | -30.8 | 39.0 | -6.3 | 24.7 | -19.6 | -8.1 | -3.9 | -8.0 | -5.7 | -8.0 |
| Sum | | | -48.9 | 136.1 | -90.9 | -40.3 | -212.9 | -220.9 | -218.0 | -220.9 |

The diameter of the diaphragm which is interposed between the lenses L811 and L812 is 193 mm. The diameters of all of the lenses L815 to L817 are smaller than 162 mm. Thus, the diameters of the lenses L815 to L817 which have large aperture angles is smaller than 85% of the diaphragm diameter.

values for (100)-lenses are smaller than for (111)-lenses. For example, in the lenses L815 to L817, the optical path differences are more than 20% lower than they would be for the same lenses with (111)-orientation.

Based on the embodiment of FIG. 8, the following discussion will demonstrate how the intrinsic birefringence

TABLE 5

Optical path differences for an lowermost aperture ray traveling through the objective of FIG. 8

| Lens | Aperture angle θ [°] | Path length $RL_L$ [mm] | Optical path difference (111) - lens $\alpha_L = 0°$ [nm] | Optical path difference (111) - lens $\alpha_L = 60°$ [nm] | Optical path difference (100) - lens $\alpha_L = 0°$ [nm] | Optical path difference (100) - lens $\alpha_L = 45°$ [nm] | Optical path difference (110) - lens $\alpha_L = 0°$ [nm] | Optical path difference (110) - lens $\alpha_L = 45°$ [nm] | Optical path difference (110) - lens $\alpha_L = 90°$ [nm] | Optical path difference (110) - lens $\alpha_L = 135°$ [nm] |
|---|---|---|---|---|---|---|---|---|---|---|
| L801 | -11.6 | 32.1 | -5.8 | 9.0 | -3.2 | -1.6 | -17.6 | -17.6 | -17.6 | -17.6 |
| L802 | 19.5 | 28.3 | 13.3 | -6.1 | -7.3 | -3.4 | -10.9 | -10.9 | -11.1 | -10.9 |
| L803 | 24.7 | 33.8 | 19.1 | -6.9 | -12.7 | -5.7 | -8.6 | -9.2 | -9.3 | -9.2 |
| L803 | 17.7 | 34.3 | 14.7 | -7.4 | -7.5 | -3.6 | -14.6 | -14.6 | -14.8 | -14.6 |
| L802 | 12.7 | 31.6 | 9.7 | -6.0 | -3.8 | -1.8 | -16.7 | -16.7 | -16.8 | -16.7 |
| L804 | -5.2 | 27.7 | -2.7 | 3.3 | -0.6 | -0.3 | -17.4 | -17.4 | -17.4 | -17.4 |
| L805 | -4.5 | 34.6 | -3.0 | 3.5 | -0.5 | -0.3 | -21.9 | -21.9 | -21.9 | -21.9 |
| L806 | -8.6 | 19.5 | -2.9 | 4.0 | -1.1 | -0.6 | -11.6 | -11.6 | -11.6 | -11.6 |
| L807 | -0.5 | 16.5 | -0.2 | 0.2 | 0.0 | 0.0 | -10.7 | -10.7 | -10.7 | -10.7 |
| L808 | -8.2 | 25.6 | -3.7 | 5.0 | -1.3 | -0.7 | -15.3 | -15.3 | -15.3 | -15.3 |
| L809 | -7.5 | 10.1 | -1.3 | 1.8 | -0.4 | -0.2 | -6.1 | -6.1 | -6.1 | -6.1 |
| L810 | -9.1 | 13.1 | -2.0 | 2.9 | -0.8 | -0.4 | -7.7 | -7.7 | -7.7 | -7.7 |
| L811 | 9.0 | 9.9 | 2.1 | -1.5 | -0.6 | -0.3 | -5.8 | -5.8 | -5.8 | -5.8 |
| L812 | 2.6 | 30.7 | 1.8 | -1.6 | -0.2 | -0.1 | -19.8 | -19.8 | -19.8 | -19.8 |
| L813 | 0.9 | 34.0 | 0.6 | -0.6 | 0.0 | 0.0 | -22.1 | -22.1 | -22.1 | -22.1 |
| L814 | 1.3 | 10.4 | 0.3 | -0.3 | 0.0 | 0.0 | -6.7 | -6.7 | -6.7 | -6.7 |
| L815 | 23.5 | 16.3 | 8.9 | -3.4 | -5.7 | -2.6 | -4.7 | -4.8 | -4.9 | -4.8 |
| L816 | 24.6 | 37.2 | 21.0 | -7.6 | -13.9 | -6.2 | -9.6 | -10.2 | -10.3 | -10.2 |
| L817 | 29.4 | 29.6 | 18.5 | -5.1 | -14.1 | -5.9 | -4.0 | -6.2 | -5.2 | -6.2 |
| Sum | | | 88.3 | -16.8 | -73.7 | -33.5 | -231.9 | -235.4 | -235.2 | -235.4 |

As can be concluded from Table 4 and Table 5, it is advantageous to select the (100)-orientation for lenses with large aperture angles because overall, the birefringence can to a large extent be compensated by using groups of mutually rotated (100)-lenses in parallel with groups of mutually rotated (111)-lenses.

In a preliminary stage of assembling the objective, all calcium fluoride lenses of (111)-orientation are installed without rotating the (111)-lenses relative to each other. In this case, the resulting maximum value of the optical path difference for two mutually orthogonal states of linear polarization is 136 nm. By rotating the (111)-lenses, the maximum for the optical path difference can be reduced to approximately 38 nm. For the rotation, the lenses L801 and L804 are assigned to a group, and the lenses L802 and L803 are assigned to a further group, where the angle of rotation between the lenses within each group is 60°. The lenses L808, L809 and L810 are combined into a group of three lenses, as are the lenses L815, L816 and L817, where the angle between any two lenses within each group is 400. The lenses L811, L812, L813 and L814 are combined into a group of four lenses with an angle of mutual rotation of 30°.

If all calcium fluoride lenses of (100)-orientation are installed without rotating the (100)-lenses relative to each other, the resulting maximum value of the optical path difference for two mutually orthogonal states of linear polarization is 90.6 nm. By rotating the (100)-lenses, the maximum for the optical path difference can be reduced to approximately 40 nm. For the rotation, the lenses L801 and L804 are assigned to a group, and the lenses L802 and L803 are assigned to a further group, where the angle of rotation between the lenses within each group is 45°. The lenses L808, L809 and L810 are combined into a group of three lenses, as are the lenses L815, L816 and L817, where the angle between any two lenses within each group is 300. The lenses L811, L812, L813 and L814 are combined into a group of four lenses with an angle of mutual rotation of 22.5°.

A maximum of only 7 nm in the optical path difference between two mutually orthogonal states of linear polarization is achieved by combining groups of (100)-lenses with groups of (111)-lenses, as follows: The lenses L801 and L804 are assigned to a group of (111)-lenses with an angle of rotation of 60° between the lenses. The lenses L802 and L803 are assigned to a group of (100)-lenses with an angle of rotation of 45° between the lenses. The lenses L808, L809 and L810 are combined into a group of three (100)-lenses with an angle of rotation of 300 between the lenses. The lenses L815, L816, L817 are combined into a group of three (111)-lenses with an angle of rotation of 400 between the lenses. The lenses L811, L812, L813 and L814 are combined into a group of four (100)-lenses with an angle of mutual rotation of 22.5°. The lens axes of the lenses L805 and L807 which are not assigned to a group are oriented in the <111>-direction, while the lens axis of the lens L806 is oriented in the <100>-direction of the crystallographic structure. Each group can be rotated relative to any other group by an arbitrary angle. The angles of rotation from one group to another represent degrees of freedom that can be used for the compensation of aberrations from the rotational symmetry which can originate, e.g., from the lens mounts.

A further process of assigning lenses to groups will now be described, encompassing groups of (100)-, (111)-, or (110)-lenses. At the outset, one has an objective of a known optical design. Several lenses of the objective consist of a birefringent fluoride crystal material, with the birefringent properties of the lenses representing likewise a known quantity, meaning for example that the influence of the intrinsic birefringence on a light ray can be theoretically predicted as a function of the aperture angle and the azimuth angle. However, the birefringence properties may also be known from measurements that were made on the lenses. With the birefringent properties of the lenses being known, the optical path difference for two mutually orthogonal states of linear polarization that occurs in a light ray inside the objective is likewise known. In the following process, the optical path difference occurring in a light ray represents the quantity that is to be optimized, meaning that its absolute value is to be minimized. Analogously, the optimization can also be extended to an entire bundle of individual light rays. Possible degrees of freedom that are available for this optimization are the angles of rotation of the individual lenses relative to each other and the orientation of the lens axes in relation to the principal crystallographic directions. In accordance with the principles described above, it is advantageous if on the one hand, the lens axes are oriented in the principal crystallographic directions and on the other hand, the angles of rotation relative to each other take on only certain discrete values that depend on the lens-axis orientation of the respective lens.

Three degrees of freedom are available for the orientation of the lens axis, i.e., the lens axes can be oriented in the (100)-, (111)- or (110)-direction of the crystallographic structure.

Lenses whose lens axes are oriented in the same principal crystallographic direction or in equivalent crystallographic directions are combined in individual groups, where each group has at least two lenses.

The discrete angles of rotation of the lenses of a group depend on the orientation of the lens axes.

If a group has a number n of (100)-lenses, the angles of rotation are to be specified as $$\gamma = \frac{90°}{n} + m \cdot 90° \pm 10°,$$

where m means an arbitrary integer. Accordingly, if the group is composed of two (100)-lenses, the angle of rotation between the two lenses is ideally 45° or 135°, 225° . . .

If a group has a number n of (111)-lenses, the angles of rotation are to be specified as $$\gamma = \frac{120°}{n} + m \cdot 120° \pm 10°,$$

where m means an arbitrary integer.

If a group has a number n of (110)-lenses, the angles of rotation are to be specified as $$\gamma = \frac{180°}{n} + m \cdot 180° \pm 10°,$$

where m means an arbitrary integer.

Thus, the available degrees of freedom are the discrete angles of rotation of the lenses relative to each other, and the discrete crystallographic orientations of the lenses.

Within this parameter universe, one faces the task of finding the specific combination of angles of rotation and crystallographic orientations for the individual lenses where the optimization quantity takes on a minimum value, or finding a combination where the optimization quantity falls below a given threshold value.

For every objective, there is an optimal solution where the optical path differences for two mutually orthogonal states of linear polarization for an entire bundle of light rays take on minimal values.

However, it is an extremely large undertaking to solve the problem of finding the true optimum, particularly if the objective has a large number of lenses, as is the case for the objective of FIG. 7 or the objective of FIG. 8.

On the other hand, there are optimization methods available that may not necessarily deliver the true optimum, but will at least lead to a solution that is adequate in view of the practical application that the objective is intended for. A closely related problem in the mathematical literature is known as "the problem of the traveling salesman" where the shortest possible route has to be found to visit a given set of cities on a geographical map.

The optimization may be accomplished by one of the following methods, which are known from the literature under the terms:

1. Monte Carlo method,
2. Simulated Annealing
3. Threshold Accepting
4. Simulated annealing with reheating
5. Genetic algorithm In a first embodiment of the method outlined above for compensating the detrimental effect of intrinsic birefringence, there are four degrees of freedom (DOF) available for each lens:

DOF 1: (111)-lens with angle of rotation 0°
DOF 2: (111)-lens with angle of rotation 60°
DOF 3: (100)-lens with angle of rotation 0°
DOF 4: (100)-lens with angle of rotation 45°

The angles of rotation are defined in relation to a fixed reference direction in the object plane.

In the case of the projection objective 711 of FIG. 8, the Monte Carlo search method was used with the four given degrees of freedom DOF1 to DOF4 to find the optimum combination of the crystallographic lens-axis orientations and of the angles of rotation $\beta_L$ of the lenses relative to a fixed reference direction in the object plane. The crystallographic orientation of the lenses and their angles of rotation $\beta_L$ are listed in Table 6. Also shown for each lens is the optical path difference for two mutually orthogonal states of linear polarization for the highest and lowest outermost aperture rays. The maximum optical path difference for the objective as a whole is 5 nm.

TABLE 6

Lens data for the objective of FIG. 8

| Lens | Orientation of lens axis | Angle of rotation $\beta_L$ [°] | Optical path difference for the highest outermost aperture ray [nm] | Optical path difference for the lowest outermost aperture ray [nm] |
| --- | --- | --- | --- | --- |
| L801 | <100> | 45 | 0.0 | −3.1 |
| L802 | <111> | 60 | −13.0 | 29.7 |
| L803 | <100> | 0 | −15.1 | −27.6 |
| L803 | <100> | 0 | −26.0 | −19.2 |
| L802 | <111> | 60 | 28.3 | −14.2 |
| L804 | <111> | 0 | −7.6 | 9.8 |
| L805 | <100> | 45 | −3.1 | −1.0 |
| L806 | <100> | 0 | 0.0 | −2.1 |
| L807 | <111> | 60 | −7.8 | 1.0 |
| L808 | <100> | 45 | 0.0 | −1.1 |
| L809 | <100> | 0 | 0.0 | −0.7 |
| L810 | <100> | 0 | −0.1 | −1.5 |
| L811 | <100> | 0 | −3.9 | −1.7 |
| L812 | <111> | 0 | 15.4 | −5.0 |
| L813 | <100> | 0 | −3.7 | −0.2 |
| L814 | <100> | 0 | −2.1 | −0.1 |
| L815 | <100> | 45 | −11.4 | −6.6 |
| L816 | <111> | 60 | −16.8 | 49.6 |
| L817 | <111> | 0 | 55.7 | −12.2 |
| sum | | | −5.0 | −2.7 |

Additional degrees of freedom for the optimization are available for assigning the lenses to individual groups. The lens axes of the lenses within a group are oriented in the same principal crystallographic direction. The lenses within a group are arranged with a rotation relative to each other, so that the resulting distribution of the optical path differences caused by the group for two mutually orthogonal states of linear polarization is close to rotational symmetry. The groups themselves can now be rotated at arbitrary angles to each other, which represents additional degrees of freedom that can be used to correct aberrations that may be for example be due to the manufacturing process.

In the embodiment of Table 6, the lenses L801 and L814 are assigned to a first group of (100)-lenses. The two lenses are arranged with a 45° rotation relative to each other.

The lenses L802, L804, L807 and L812 are assigned to a second group with (111)-lenses and are divided into two subgroups, i.e., a subgroup with the lenses L802, L807 and another subgroup with the lenses L804, L812. The lenses of a subgroup are not rotated relative to each other, or at most they may be arranged at an angle of $\gamma=l\cdot 120°\pm 10°$, where l represents an integer. The two subgroups are arranged with a rotation 60° relative to each other, so that the angle between two lenses of different subgroups is $\gamma=60°+m\cdot 120°\pm 10°$, where m represents an integer.

The lenses L803, L805 and L815 are assigned to a third group with (100)-lenses and are divided into two subgroups, i.e., a subgroup with the lens L803 and another subgroup with the lenses L805, L815. The lenses of a subgroup are not rotated relative to each other, or at most they may be arranged at an angle of $\gamma=l\cdot 90°\pm 10°$, where l represents an integer. The two subgroups are arranged with a rotation 45° relative to each other, so that the angle between two lenses of different subgroups is $\gamma=45°+m\cdot 90°\pm 10°$, where m represents an integer.

The lenses L808, L809 and L811 are assigned to a fourth group with (100)-lenses and are divided into two subgroups, i.e., a subgroup with the lens L808 and another subgroup with the lenses L809, L811. The lenses of a subgroup are not rotated relative to each other, or at most they may be arranged at an angle of $\gamma=l\cdot\pi°\pm 10°$, where l represents an integer. The two subgroups are arranged with a rotation 45° relative to each other, so that the angle between two lenses of different subgroups is $\gamma=45°+m\cdot 90°\pm 10°$, where m represents an integer.

The lenses L816 und L817 are assigned to a fifth group with (111)-lenses, where the two lenses are arranged with a rotation of 60° relative to each other.

In a second embodiment, there are eight degrees of freedom available for each lens:
DOF 1: (111)-lens with angle of rotation 0°
DOF 2: (111)-lens with angle of rotation 60°
DOF 3: (100)-lens with angle of rotation 0°
DOF 4: (100)-lens with angle of rotation 45°
DOF 5: (110)-lens with angle of rotation 0°
DOF 6: (110)-lens with angle of rotation 90°
DOF 7: (110)-lens with angle of rotation 45°
DOF 8: (110)-lens with angle of rotation 135°

The result of the optimization process improves with the number of degrees of freedom, but the volume of the task expands exponentially. Further degrees of freedom are available by using a smaller step size between the discrete angles of rotation.

It is further possible to also consider measurement data related to stress-induced birefringence, surface shape data of the lenses or mirrors and/or inhomogeneities in the lens material. In this manner, all possible factors that interfere with the performance of the objective are taken into account, and the available degrees of freedom are used to find a parameter constellation for the objective which will result in a good overall image quality.

Following is a description of the individual steps of the optimization process:

As a first step, a target function is calculated for an objective in which the birefringent properties of the lenses are known. The target function represents a measure for the detrimental effect of the birefringence. For example, the optical path difference in an outermost aperture ray for two mutually orthogonal states of linear polarization can serve as a target function. Another possibility is to define the target function as the maximum or mean value of a distribution of optical path differences of a bundle of light rays. The angles of rotation and the crystallographic orientations as well as the value of the target function for the current parameter constellation of the objective are stored in memory. A threshold value is prescribed for the target function, meaning that the detrimental effect of the birefringence is tolerable if the target function falls below the threshold.

As a second step, the target function is evaluated as to whether it falls below the threshold value. If the target function is found below the threshold value, the process is terminated. If the target function fails to meet the threshold criterion, the process continues with step three.

In the third step, the angles of rotation of the lenses relative to each other and the crystallographic orientations of the lenses are changed within the constraints of the given degrees of freedom, using one of the aforedescribed methods, for example the Monte Carlo method.

Following the third step, the process loops back to step one, keeping count of the number of loops completed. If the number of loops exceeds a given maximum limit, the process is likewise terminated.

According to this cycle of steps, the process is terminated if either the target function falls below a given threshold or a maximum number of loops has been exceeded. If the maximum number of loops is exceeded, the result could be presented, e.g., in the form of a ranking list for the parameter constellations that were tried out and the values of the target function that were found for each constellation.

As another possibility, the detrimental effect of birefringence can be significantly reduced by applying a coating to an optical element, as will be shown through the example of the refractive objective 611 which includes a compensation coating 613 on one of the optical elements only the contributions from the lenses L629 and L630 to the birefringence of the objective will be considered here, as these two lenses consist of calcium fluoride and are therefore intrinsically birefringent. In the embodiment under consideration, the two lenses have a (111)-orientation and are rotated by 60° relative to each other. This leads to a distribution of the optical path differences $\Delta OPL$ that is close to rotational symmetry. The maximum of the optical path differences for an outermost aperture ray is between 13.6 nm and 14.6 nm, depending on the azimuth angle $\alpha_R$. A compensation coating 613 as specified in Table 7 is now applied to the optical surface of the lens L630 that faces towards the image plane O'. The compensation coating 613 consists of 15 individual layers of the materials magnesium fluoride ($MgF_2$) and lanthanum fluoride ($LaF_3$). The data under n and k in Table 7 represent the real part and the imaginary part of the refractive index. The thickness of each layer is homogeneous, i.e., it does not vary across the optical surface of the lens L630. The vapor-deposition angles during the coating process are perpendicular to the optical surface of the lens L630. The resultant optical path difference for the two lenses L629 and L630 including the compensation coating is 1.1 nm, which represents a significant reduction in comparison to an objective without compensation coating.

TABLE 7

Specifications for coating 613 on lens 630

| Layer | Thickness [nm] | Material |
| --- | --- | --- |
| Substrate | | CaF2 |
| 1 | 103.54 | MgF2 |
| 2 | 41.54 | LaF3 |
| 3 | 33.35 | MgF2 |
| 4 | 30.8 | LaF3 |
| 5 | 39.53 | MgF2 |
| 6 | 35.34 | LaF3 |
| 7 | 32.05 | MgF2 |
| 8 | 27.25 | LaF3 |
| 9 | 28.57 | MgF2 |
| 10 | 26.48 | LaF3 |
| 11 | 27.64 | MgF2 |
| 12 | 26.17 | LaF3 |
| 13 | 27.36 | MgF2 |
| 14 | 26.11 | LaF3 |
| 15 | 8.66 | MgF2 |
| Coating Material | n | k |
| LaF3 | 1.760026 | 0.00118471 |
| MgF2 | 1.506675 | 0.00305275 |

An analogous procedure can also be used when the entire objective is considered rather than only the two last lenses. Instead of correcting the birefringence with only one element with a compensation coating, it is also possible to provide a plurality of optical elements with compensation coatings.

The procedure can also be used for an overall compensation of an entire system, where the sources of the birefringence may be stress-induced birefringence, intrinsic birefringence, and birefringence caused by the other coatings.

Following the final adjustment of a system, the distribution of the optical path differences $\Delta OPL$ in the image plane is determined for one or more bundle of rays. The required compensation coating is then calculated by means of a program for coating optimization, and the coating is applied, e.g., to the optical system surface closest to the image plane. It is advantageous if the optical element closest to the image plane is interchangeable. The provides the possibility of correcting birefringence effects that occur only with the actual use of the objective.

In order to compensate the birefringence of crystals in the ultraviolet range, one can use an arrangement where crystalline elements with different orientations of the crystallographic axes follow each other, as described above. However, if lenses with different crystallographic orientations are arranged in series, the problem occurs that lenses are often traversed by light rays under different angles, so that only a limited degree of compensation may be possible. In optical systems that contain only one crystalline lens, a compensation according to the foregoing description is not feasible at all. As a possible solution, a lens could be designed as a composite of two mutually rotated parts that are joined by wringing. In practice, this concept has the drawback that stresses deform the joining surface and that the two halves have to be positioned at a micrometer level of accuracy relative to the lateral direction.

It is proposed to manufacture blanks from individual plates that are wrung together and rotated relative to the orientation of their crystallographic axes, and then make the blanks into lenses by grinding and polishing. Everything said above about crystal orientations applies likewise to lenses made in this manner. In addition to the method of wringing, which is a classical manufacturing process in the field of optics, any other joining technique that provides intimate contact and introduces a minimal amount of stress can be used and is considered to be encompassed by the present invention. The wringing can be facilitated in particular by coatings of, e.g., quartz glass. It is important to have no refraction or reflection at the joining surface as this would interfere with the intended function.

The orientation of the axes follows the selection criteria described above.

As an example of an embodiment, the lens L816 of the projection objective of FIG. 8 may be manufactured from a blank according to the foregoing description. The lens L816 has a convex aspheric front surface with a vertex curvature radius of 342.13 mm and a concave spherical rear surface with a vertex curvature radius of 449.26 mm. The axial thickness is 37.3 mm. The lens material is calcium fluoride. The lens diameter is 141 mm. The blank from which the lens is to be manufactured requires an overall thickness of at least 45 mm and a diameter of 150 mm. A suitable blank may consist of two (100)-plates of 9.0 mm thickness that are rotated by 45° relative to each other and two (111)-plates of 13.5 mm thickness that are rotated by 60° relative to each other. All four plates have to be seamlessly joined together. The (100)-plates should be adjoining each other, and the (111)-plates should likewise be adjoining each other.

In a further embodiment, six (100)-plates of 3.0 mm thickness that are rotated relative to each other by 45° are combined with six (111)-plates of 4.5 mm thickness that are rotated relative to each other by 60°, alternating between pairs of (100)-plates and pairs of (111)-plates, with all of the plates seamlessly joined together.

In a further embodiment, four (110)-plates of 9.0 mm thickness that are rotated relative to each other by 45° are combined with two (100)-plates of 4.5 mm thickness that are rotated relative to each other by 45°, with the pair of (100)-plates following the four (110)-plates.

In a further embodiment, eight (110)-plates of 4.5 mm thickness that are rotated relative to each other by 45° are combined with four (100)-plates of 2.25 mm thickness that are rotated relative to each other by 45°, in a sequence of four (110)-plates and two (100)-plates followed by another four (110)-plates and two (100)-plates.

To allow a controlled setting of the angles of rotation between the lenses or lens parts, the lenses or lens parts or their mounting elements are provided with marks which can be applied in accordance with one of the following methods. As an exemplary embodiment of a method, the manufacture of calcium fluoride lenses with a <111>-orientation of the lens axis will be described. However, the methods are also applicable to the manufacture of lenses of other crystalline materials of a cubic crystallographic structure, such as barium fluoride or strontium fluoride. Furthermore, the lens axes can also have <100>- or <110>-orientation. The method is suitable for the manufacture of planar-parallel as well as curved lenses or lens parts.

In a first step, the orientation of the <111>-direction is determined in a raw optical blank, in this case a calcium fluoride disc. This may be accomplished with a high degree of accuracy through crystallographic methods such as, e.g., by a determination of fault surfaces or by generating etching craters. Better results in the determination of crystallographic directions are obtained with X-ray diffractometry. A suitable instrument for this technique is a goniometer arrangement used with monochromatic X-rays. The occurrence of a Bragg reflection for the {111}-planes of the crystal lattice is determined with the help of tabulated literature values. The tabulated values show the required angles of incidence for the different reflection indices. To perform the measurement, the calcium fluoride disc is rotated about an axis that is perpendicular to the calcium fluoride disc. As a result, one obtains the deviation of the <111>-direction from the normal vector of the calcium fluoride disc for different angles of rotation. It is advantageous if the deviation is determined for at least two rotary positions. In the present example, the measurements are made at 0° and 90°. Additional measurements can be performed at 180° and 270° to enhance the measuring accuracy.

In a second step, the calcium fluoride disc is worked into a shape where the normal vector of the calcium fluoride disc is parallel to the <111>-direction of the crystal lattice. The deviation measured in the first step serves as a basis for a controlled correction, i.e., a specifically defined reshaping of the calcium fluoride disc by sawing or grinding. Following this processing step, the normal vector of the calcium fluoride disc is oriented in the <111>-direction within a tolerance of less than 5°.

In a third step, a reference direction is defined in the calcium fluoride disc. If the normal vector of the calcium fluoride disc is oriented in the <111>-direction, it is advantageous if one of the three crystallographic directions <110>, <011> and <101> or one of the directions <100>, <010> and <001> is known, which are grouped in threefold symmetry relative to the <111>-direction. This is of interest because the intrinsic birefringence causes a maximum optical path difference in a light ray for two mutually orthogonal states of linear polarization, if the light ray travels in the <110>-direction or a <110>-equivalent direction in a calcium fluoride lens. No optical path difference occurs if the light ray travels in the <100>-direction or a <100>-equivalent direction. Each of the three crystallographic directions <110>, <011> and <101> is angled at 350 to the <111>-direction, and each of the directions <100>, <010> and <001> is angled at 550 to the <111>-direction. For reasons that have a physical explanation, the X-ray reflections of (110)- or (100)-planes of the crystal lattice are not measurable. If is therefore necessary to use the Bragg reflections of other crystallographic planes that have a defined relationship to the (100)- and (110)-planes. For example, it is possible to use a (331)-Bragg reflection. Each of the three crystallographic directions <331>, <133> and <313> runs at an angle of 220 to the <111>-direction. The (331) Bragg reflection for monochromatic copper Kα-radiation (8048 eV) in calcium fluoride is found at 380. Thus, the reflection is found with an angle of incidence of 16° and a detector angle of 60° relative to the reference plane that is defined by the surface of the calcium fluoride disc. In the course of a 360°-rotation of the disc about its normal vector axis, Bragg reflections will be observed at three angular positions. Each of the Bragg reflections indicates a position where one of the directional vectors of the three targeted (331)-planes lies in the plane of incidence of the Bragg measurement. The projections of the three (331)-directions onto the disc surface are parallel to the projections of the three crystallographic directions <110>, <011> and <101>. Thus, by determining the crystallographic directions <331>, <133> and <313>, the directions of the projections of the <110>-, <011>- and <101>-directions are determined at the same time. If the normal vector of the disc surface deviates from the <111>-direction, the position settings for the source and the detector have to be adjusted accordingly.

Alternatively, the crystallographic orientations can also be determined from a Laue pattern. In contrast to the aforedescribed measurements of Bragg reflections of monochromatic X-ray light, the Laue method works with "white" light, i.e., X-ray light with a broad band of wavelengths. With white X-ray light, one obtains Bragg reflections of different families of crystallographic planes generating a Laue pattern that is characteristic for the material. If the <111>-direction is parallel to the direction of the incident light, a Laue pattern of threefold symmetry is produced. If the <111>-direction deviates by a few degrees from the normal vector of the disc, the pattern will be slightly distorted. The exact analysis of the Laue pattern, e.g. with an appropriate software program, can be used to determine the deviation of the <111>-direction from the normal vector of the disc. By evaluating the pattern, it is further possible to identify the triplets of crystallographic directions <110>, <011>, <101> or <100>, <010>, <001> and thereby determine the orientation of the disc.

In a fourth step, at least one mark is applied on the calcium fluoride disc, indicating the direction of one of the projected crystallographic directions <110>, <011> and <101>, or <100>, <010> and <001>. The marking can be made, e.g., by engraving, etching, or with a writing instrument. The cylindrical border of the calcium fluoride disc suggests itself as a natural location for applying the mark. Alternatively, the mark can also be applied on a mounting element that has a fixed connection to the calcium fluoride disc.

In a fifth step, a lens is produced from the calcium fluoride disc in such a manner that the lens axis comes out parallel to the <111>-direction of the crystal structure of the lens. This processing step does not destroy the marking that was applied to the calcium fluoride disc as described above, because many machining operations such as grinding and polishing apply only to the top and bottom of the lens but not to the cylindrical circumference. However, if the circumference is to be machined also, for example in a turning operation, the marking will have to be transferred with sufficient accuracy to the mounting device of the calcium fluoride disc and reapplied to the cylindrical border after the machining operation.

In the following example, a lens is manufactured from a calcium fluoride disc whose normal vector is already oriented in the <111>-direction. In this embodiment, the marking is applied after the lens has been finished.

In a first step, the lens is made out of the calcium fluoride disc in such a manner that the lens axis is oriented in the <111>-direction.

The reference direction is determined as a next-following step. The procedures used for this determination are the same as described above for the calcium fluoride disc. However, it is important to precisely adjust the height of the point of incidence of the X-ray on the lens surface. The support surface for the lens is therefore height-adjustable. This makes it possible to follow the curved profile of the lens if different points on the curved lens surface are to be measured. It further needs to be noted that the curvature can cause a shade-out of the incident or outgoing ray. Shade-outs can be avoided by selecting a suitable Bragg reflection in combination with the appropriate geometrical arrangement for the measurements.

In the case of planar-parallel plates, the foregoing procedure can be used with a goniometer arrangement at any point of the surface.

In the machining process of the optical blanks and lenses, it needs to be taken into account that the irradiation of calcium fluoride with X-rays can lead to the formation of color centers. The penetration depth of copper-Kα-radiation in calcium fluoride is approximately 30 μm. In order to avoid the possible existence of color centers in the material, it is advantageous if the X-ray analysis is performed only on calcium fluoride blanks or lenses in which a sufficient amount of surface material will be removed in subsequent processing steps. In the case of a Cu—Kα-irradiation, this means that the surface material should be removed to a depth of approximately 30 μm.

FIG. 9 illustrates in principle the arrangement of a microlithography projection system. The projection system 81 has an illumination device 83 and a projection objective 85. The projection objective 85 includes a lens arrangement 819 with an aperture diaphragm AP and has an optical axis 87 defined by the lens arrangement 819. The lens arrangement 819 could be configured in accordance with one of the examples shown in FIGS. 7 and 8. A mask 89, held in place by a mask holder 811, is arranged in the light path between the illumination device 83 and the projection objective 85. A mask 89 of the type used in microlithography carries a design structure with details in the micrometer- to nanometer range. A reduced image, e.g. four to five times smaller than the structure on the mask, is projected by the projection objective into an image plane 813. A light-sensitive substrate 815, specifically a wafer, is held in position in the image plane 813 by a substrate holder 817.

The limit of detail resolution in the projection of fine structures depends on the wavelength λ of the light used for the illumination and on the numerical aperture on the image side of the projection objective 85. The capability of the projection system 81 to resolve small details increases with shorter wavelengths of the illumination device 83 and with a larger numerical aperture of the projection objective 85. With the embodiments illustrated in FIGS. 7 and 8, it is possible to achieve a resolution of structural details smaller than 150 nm. It is therefore essential to reduce the effect of phenomena such as intrinsic birefringence. The invention has been successful in reducing the detrimental effects of intrinsic birefringence particularly in projection objectives with a large numerical aperture on the image side.

TABLE 1

| LENS | RADII | THICKNESSES | MATERIAL | REFRACTIVE INDEX AT 157.629 nm | ½ FREE DIAMETER |
|---|---|---|---|---|---|
| 0 | 0.000000000 | 27.171475840 | N2 | 1.00031429 | 46.200 |
|  | 0.000000000 | 0.602670797 | N2 | 1.00031429 | 52.673 |
| L601 | 900.198243311AS | 15.151284556 | CaF2 | 1.55929035 | 53.454 |
|  | −235.121108435 | 9.531971079 | N2 | 1.00031429 | 54.049 |
| L602 | −167.185917779 | 8.294716452 | CaF2 | 1.55929035 | 54.178 |
|  | −132.673519510 | 14.020355779 | N2 | 1.00031429 | 54.901 |
| L603 | −333.194588652 | 9.893809820 | CaF2 | 1.55929035 | 53.988 |
|  | −155.450516203 | 15.930502944 | N2 | 1.00031429 | 54.132 |
| L604 | −73.572316296 | 7.641977580 | CaF2 | 1.55929035 | 53.748 |
|  | −68.248613899AS | 2.881720302 | N2 | 1.00031429 | 55.167 |
| L605 | −86.993585564AS | 5.094651720 | CaF2 | 1.55929035 | 52.580 |
|  | −238.150965327 | 5.379130780 | N2 | 1.00031429 | 53.729 |
| L606 | −165.613920870 | 5.094651720 | CaF2 | 1.55929035 | 53.730 |
|  | 153.417884485 | 34.150169591 | N2 | 1.00031429 | 56.762 |
| L607 | −92.061009990 | 5.094651720 | CaF2 | 1.55929035 | 58.081 |
|  | 8491.086261873AS | 19.673523795 | N2 | 1.00031429 | 74.689 |
| L608 | −407.131300451 | 30.380807138 | CaF2 | 1.55929035 | 87.291 |
|  | −140.620317156 | 0.761662684 | N2 | 1.00031429 | 91.858 |
| L609 | −4831.804853654AS | 50.269660218 | CaF2 | 1.55929035 | 117.436 |
|  | −192.197373609 | 1.688916911 | N2 | 1.00031429 | 121.408 |
| L610 | −367.718684892 | 21.227715500 | CaF2 | 1.55929035 | 127.704 |
|  | −233.628547894 | 2.224071019 | N2 | 1.00031429 | 129.305 |
| L611 | 709.585855080 | 28.736922725 | CaF2 | 1.55929035 | 137.016 |
|  | 1238.859445357 | 9.120684720 | N2 | 1.00031429 | 137.428 |
| L612 | 1205.457051945 | 49.281218258 | CaF2 | 1.55929035 | 138.288 |
|  | −285.321880705 | 1.625271224 | N2 | 1.00031429 | 138.379 |
| L613 | 137.549591710 | 56.718543740 | CaF2 | 1.55929035 | 108.652 |
|  | −4380.301012978AS | 0.623523902 | N2 | 1.00031429 | 106.138 |
| L614 | 2663.880214408 | 6.792868960 | CaF2 | 1.55929035 | 103.602 |
|  | 149.184979730 | 15.779049257 | N2 | 1.00031429 | 84.589 |
| L615 | 281.093108064 | 6.792868960 | CaF2 | 1.55929035 | 83.373 |
|  | 184.030288413 | 32.341552355 | N2 | 1.00031429 | 77.968 |
| L616 | −222.157416308 | 5.094651720 | CaF2 | 1.55929035 | 77.463 |
|  | 101.254238115AS | 56.792834221 | N2 | 1.00031429 | 71.826 |
| L617 | −106.980638018 | 5.094651720 | CaF2 | 1.55929035 | 72.237 |
|  | 1612.305471130 | 20.581065398 | N2 | 1.00031429 | 89.760 |
| L618 | −415.596135628 | 26.398111993 | CaF2 | 1.55929035 | 96.803 |
|  | −204.680044631 | 0.713343960 | N2 | 1.00031429 | 103.409 |
| L619 | −646.696622394 | 25.867340760 | CaF2 | 1.55929035 | 116.636 |
|  | −231.917626896 | 0.766268682 | N2 | 1.00031429 | 118.569 |
| L620 | −790.657607677 | 23.400482872 | CaF2 | 1.55929035 | 128.806 |
|  | −294.872053725 | 0.721402031 | N2 | 1.00031429 | 130.074 |
| L621 | 786.625567756 | 40.932308205 | CaF2 | 1.55929035 | 141.705 |
|  | −431.247283013 | 12.736629300 | N2 | 1.00031429 | 142.089 |
|  | 0.000000000 | −8.491086200 | N2 | 1.00031429 | 134.586 |
| L622 | 295.022653593AS | 20.185109438 | CaF2 | 1.55929035 | 139.341 |
|  | 449.912291916 | 0.619840486 | N2 | 1.00031429 | 137.916 |
| L623 | 358.934076212 | 48.662890509 | CaF2 | 1.55929035 | 136.936 |
|  | −622.662988878 | 30.955714157 | N2 | 1.00031429 | 135.288 |
| L624 | −224.404889753 | 12.736629300 | CaF2 | 1.55929035 | 134.760 |
|  | −251.154571510AS | 16.079850229 | N2 | 1.00031429 | 134.853 |
| L625 | −193.582989843AS | 16.510083506 | CaF2 | 1.55929035 | 134.101 |
|  | −198.077570749 | 0.880353872 | N2 | 1.00031429 | 136.109 |
| L626 | 206.241795157 | 19.927993542 | CaF2 | 1.55929035 | 101.240 |
|  | 338.140581666 | 0.925956949 | N2 | 1.00031429 | 97.594 |
| L627 | 111.017549581 | 24.580089962 | CaF2 | 1.55929035 | 85.023 |
|  | 169.576109839 | 0.777849447 | N2 | 1.00031429 | 81.164 |
| L628 | 117.982165264 | 31.161065630 | CaF2 | 1.55929035 | 75.464 |
|  | 921.219058213AS | 6.934980174 | N2 | 1.00031429 | 69.501 |
| L629 | 0.000000000 | 22.260797322 | CaF2 | 1.55929035 | 63.637 |
|  | 0.000000000 | 4.245543100 | N2 | 1.00031429 | 48.606 |
| L630 | 0.000000000 | 21.227715500 | CaF2 | 1.55929035 | 41.032 |
|  | 0.000000000 | 8.491086200 | N2 | 1.00031429 | 26.698 |
|  | 0.000000000 | 0.000000000 |  | 1.00000000 | 11.550 |

Wavelength and refractive index are stated relative to vacuum.

| ASPHERICAL CONSTANTS | | | | | |
|---|---|---|---|---|---|
| Asphere of lens L601 | | Asphere of lens L604 | | Asphere of lens L605 | |
| K | 0.0000 | K | −1.3312 | K | −1.1417 |
| C1 | 1.28594437e−007 | C1 | −4.03355456e−007 | C1 | 1.33637337e−007 |
| C2 | 8.50731836e−013 | C2 | 2.25776586e−011 | C2 | 1.56787758e−011 |
| C3 | 1.16375620e−016 | C3 | −2.19259878e−014 | C3 | −1.64362484e−014 |
| C4 | 2.28674275e−019 | C4 | 4.32573397e−018 | C4 | 3.59793786e−018 |
| C5 | −1.23202729e−022 | C5 | −7.92477159e−022 | C5 | −5.11312568e−022 |
| C6 | 3.32056239e−026 | C6 | 7.57618874e−026 | C6 | 1.70636633e−026 |
| C7 | −4.28323389e−030 | C7 | −7.14962797e−030 | C7 | 1.82384731e−030 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |
| Asphere of lens L607 | | Asphere of lens L609 | | Asphere of lens L613 | |
| K | 0.0000 | K | 0.0000 | K | 0.0000 |
| C1 | 1.34745120e−007 | C1 | 6.85760526e−009 | C1 | 2.24737416e−008 |
| C2 | −2.19807543e−011 | C2 | −4.84524868e−013 | C2 | −4.45043770e−013 |
| C3 | 1.20275881e−015 | C3 | −6.28751350e−018 | C3 | −4.10272049e−017 |
| C4 | 4.39597377e−020 | C4 | −3.72607209e−022 | C4 | 4.31632628e−021 |
| C5 | −2.37132819e−023 | C5 | 3.25276841e−026 | C5 | −3.27538237e−025 |
| C6 | 2.87510939e−027 | C6 | −4.05509974e−033 | C6 | 1.44053025e−029 |
| C7 | −1.42065162e−031 | C7 | −3.98843079e−035 | C7 | −2.76858490e−034 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |
| Asphere of lens L616 | | Asphere of lens L622 | | Asphere of lens L624 | |
| K | 0.0000 | K | 0.0421 | K | 0.0000 |
| C1 | −2.83553693e−008 | C1 | 7.07310826e−010 | C1 | 3.02835805e−010 |
| C2 | −1.12122261e−011 | C2 | −2.00157185e−014 | C2 | −2.40484062e−014 |
| C3 | −2.05192812e−016 | C3 | −9.33825109e−020 | C3 | −3.22339189e−019 |
| C4 | −1.55525080e−020 | C4 | 1.27125854e−024 | C4 | 1.64516979e−022 |
| C5 | −4.77093112e−024 | C5 | 1.94008709e−027 | C5 | −8.51268614e−027 |
| C6 | 8.39331135e−028 | C6 | −6.11989858e−032 | C6 | 2.09276792e−031 |
| C7 | −8.97313681e−032 | C7 | 2.92367322e−036 | C7 | −4.74605669e−036 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |
| Asphere of lens L625 | | Asphere of lens L628 | | | |
| K | 0.0000 | K | 0.0000 | | |
| C1 | −3.99248993e−010 | C1 | 4.40737732e−008 | | |
| C2 | 5.79276562e−014 | C2 | 1.52385268e−012 | | |
| C3 | 3.53241478e−018 | C3 | −5.44510329e−016 | | |
| C4 | −4.57872308e−023 | C4 | 6.32549789e−020 | | |
| C5 | −6.29695208e−027 | C5 | −4.58358203e−024 | | |
| C6 | 1.57844931e−031 | C6 | 1.92230388e−028 | | |
| C7 | −2.19266130e−036 | C7 | −3.11311258e−033 | | |
| C8 | 0.00000000e+000 | C8 | 0.00000000e+000 | | |
| C9 | 0.00000000e+000 | C9 | 0.00000000e+000 | | |

TABLE 3

| LENS | RADII | THICKNESSES | MATERIAL | REFRACTIVE INDEX AT 157.629 nm | ½ FREE DIAMETER |
|---|---|---|---|---|---|
| 0 | 0.000000000 | 34.000000000 | | 1.00000000 | 82.150 |
| | 0.000000000 | 0.100000000 | | 1.00000000 | 87.654 |
| L801 | 276.724757380 | 40.000000000 | CaF2 | 1.55970990 | 90.112 |
| | 1413.944109416AS | 95.000000000 | | 1.00000000 | 89.442 |
| SP1 | 0.000000000 | 11.000000000 | | 1.00000000 | 90.034 |
| | 0.000000000 | 433.237005445 | | 1.00000000 | 90.104 |
| L802 | −195.924336384 | 17.295305525 | CaF2 | 1.55970990 | 92.746 |
| | −467.658808527 | 40.841112468 | | 1.00000000 | 98.732 |
| L803 | −241.385736441 | 15.977235467 | CaF2 | 1.55970990 | 105.512 |
| | −857.211727400AS | 21.649331094 | | 1.00000000 | 118.786 |
| SP2 | 0.000000000 | 0.000010000 | | 1.00000000 | 139.325 |
| | 253.074839896 | 21.649331094 | | 1.00000000 | 119.350 |
| L803' | 857.211727400AS | 15.977235467 | CaF2 | 1.55970990 | 118.986 |
| | 241.385736441 | 40.841112468 | | 1.00000000 | 108.546 |
| L802' | 467.658808527 | 17.295305525 | CaF2 | 1.55970990 | 102.615 |
| | 195.924336384 | 419.981357165 | | 1.00000000 | 95.689 |
| SP3 | 0.000000000 | 6.255658280 | | 1.00000000 | 76.370 |
| | 0.000000000 | 42.609155219 | | 1.00000000 | 76.064 |
| Z1 | 0.000000000 | 67.449547115 | | 1.00000000 | 73.981 |

TABLE 3-continued

| LENS | RADII | THICKNESSES | MATERIAL | REFRACTIVE INDEX AT 157.629 nm | ½ FREE DIAMETER |
|---|---|---|---|---|---|
| L804 | 432.544479547 | 37.784311058 | CaF2 | 1.55970990 | 90.274 |
| | −522.188532471 | 113.756133662 | | 1.00000000 | 92.507 |
| L805 | −263.167605725 | 33.768525968 | CaF2 | 1.55970990 | 100.053 |
| | −291.940616829AS | 14.536591424 | | 1.00000000 | 106.516 |
| L806 | 589.642961222AS | 20.449887046 | CaF2 | 1.55970990 | 110.482 |
| | −5539.698828792 | 443.944079795 | | 1.00000000 | 110.523 |
| L807 | 221.780582003 | 9.000000000 | CaF2 | 1.55970990 | 108.311 |
| | 153.071443064 | 22.790060084 | | 1.00000000 | 104.062 |
| L808 | 309.446967518 | 38.542735318 | CaF2 | 1.55970990 | 104.062 |
| | −2660.227900099 | 0.100022286 | | 1.00000000 | 104.098 |
| L809 | 23655.354584194 | 12.899131182 | CaF2 | 1.55970990 | 104.054 |
| | −1473.189213176 | 9.318886362 | | 1.00000000 | 103.931 |
| L810 | −652.136459374 | 16.359499814 | CaF2 | 1.55970990 | 103.644 |
| | −446.489459129 | 0.100000000 | | 1.00000000 | 103.877 |
| L811 | 174.593507050 | 25.900313780 | CaF2 | 1.55970990 | 99.267 |
| | 392.239615259AS | 14.064505431 | | 1.00000000 | 96.610 |
| | 0.000000000 | 2.045119392 | | 1.00000000 | 96.552 |
| L812 | 7497.306838492 | 16.759051656 | CaF2 | 1.55970990 | 96.383 |
| | 318.210831711 | 8.891640764 | | 1.00000000 | 94.998 |
| L813 | 428.724465129 | 41.295806263 | CaF2 | 1.55970990 | 95.548 |
| | 3290.097860119AS | 7.377912006 | | 1.00000000 | 95.040 |
| L814 | 721.012739719 | 33.927118706 | CaF2 | 1.55970990 | 95.443 |
| | −272.650872353 | 6.871397517 | | 1.00000000 | 95.207 |
| L815 | 131.257556743 | 38.826450065 | CaF2 | 1.55970990 | 81.345 |
| | 632.112566477AS | 4.409527396 | | 1.00000000 | 74.847 |
| L816 | 342.127616157AS | 37.346293509 | CaF2 | 1.55970990 | 70.394 |
| | 449.261078744 | 4.859754445 | | 1.00000000 | 54.895 |
| L817 | 144.034814702 | 34.792179308 | CaF2 | 1.55970990 | 48.040 |
| | −751.263321098AS | 11.999872684 | | 1.00000000 | 33.475 |
| 0' | 0.000000000 | 0.000127776 | | 1.00000000 | 16.430 |

| ASPHERICAL CONSTANTS | | | | | |
|---|---|---|---|---|---|
| Asphere of lens L801 | | Asphere of lens L803 | | Asphere of lens L803' | |
| K | 0.0000 | K | 0.0000 | K | 0.0000 |
| C1 | 4.90231706e−009 | C1 | −5.33460884e−009 | C1 | 5.33460884e−009 |
| C2 | 3.08634889e−014 | C2 | 9.73867225e−014 | C2 | −9.73867225e−014 |
| C3 | −9.53005325e−019 | C3 | −3.28422058e−018 | C3 | 3.28422058e−018 |
| C4 | −6.06316417e−024 | C4 | 1.50550421e−022 | C4 | −1.50550421e−022 |
| C5 | 6.11462814e−028 | C5 | 0.00000000e+000 | C5 | 0.00000000e+000 |
| C6 | −8.64346302e−032 | C6 | 0.00000000e+000 | C6 | 0.00000000e+000 |
| C7 | 0.00000000e+000 | C7 | 0.00000000e+000 | C7 | 0.00000000e+000 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |
| Asphere of lens L805 | | Asphere of lens L806 | | Asphere of lens L811 | |
| K | 0.0000 | K | 0.0000 | K | 0.0000 |
| C1 | 2.42569449e−009 | C1 | −6.74111232e−009 | C1 | 2.28889624e−008 |
| C2 | 3.96137865e−014 | C2 | −2.57289693e−014 | C2 | −1.88390559e−014 |
| C3 | −2.47855149e−018 | C3 | −2.81309020e−018 | C3 | 2.86010656e−017 |
| C4 | 7.95092779e−023 | C4 | 6.70057831e−023 | C4 | −3.18575336e−021 |
| C5 | 0.00000000e+000 | C5 | 5.06272344e−028 | C5 | 1.45886017e−025 |
| C6 | 0.00000000e+000 | C6 | −4.81282974e−032 | C6 | 1.08492931e−029 |
| C7 | 0.00000000e+000 | C7 | 0.00000000e+000 | C7 | 0.00000000e+000 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |
| Asphere of lens L813 | | Asphere of lens L815 | | Asphere of lens L816 | |
| K | 0.0000 | K | 0.0000 | K | 0.0000 |
| C1 | 3.40212872e−008 | C1 | −3.15395039e−008 | C1 | −2.16574623e−008 |
| C2 | −1.08008877e−012 | C2 | 4.30010133e−012 | C2 | −6.67182801e−013 |
| C3 | 4.33814531e−017 | C3 | 3.11663337e−016 | C3 | 4.46519932e−016 |
| C4 | −7.40125614e−021 | C4 | −3.64089769e−020 | C4 | −3.71571535e−020 |
| C5 | 5.66856812e−025 | C5 | 1.06073268e−024 | C5 | 0.00000000e+000 |
| C6 | 0.00000000e+000 | C6 | 0.00000000e+000 | C6 | 0.00000000e+000 |
| C7 | 0.00000000e+000 | C7 | 0.00000000e+000 | C7 | 0.00000000e+000 |
| C8 | 0.00000000e+000 | C8 | 0.00000000e+000 | C8 | 0.00000000e+000 |
| C9 | 0.00000000e+000 | C9 | 0.00000000e+000 | C9 | 0.00000000e+000 |

-continued

ASPHERICAL CONSTANTS

Asphere of lens L817

K    0.0000
C1   2.15121397e−008
C2   −1.65301726e−011
C3   −5.03883747e−015
C4   1.03441815e−017
C5   −6.29122773e−021
C6   1.44097714e−024
C7   0.00000000e+000
C8   0.00000000e+000
C9   0.00000000e+000

What is claimed is:

1. An objective comprising a plurality of lenses, wherein at least two lenses consist of fluoride crystal material with a cubic lattice structure and wherein said fluoride crystal lenses are (111)-lenses each having a lens axis oriented approximately perpendicular to the {111}-planes or to crystallographic planes that are equivalent to the {111}-planes of the fluoride crystal, wherein an image point in an image plane is formed at a convergence of a bundle of light rays each of which has an azimuth angle $\alpha_R$, an aperture angle $\theta_R$ and an optical path difference $\Delta OPL$ for two mutually orthogonal states of linear polarization, wherein said (111)-lenses are arranged with a rotation relative to each other about the lens axes in such a manner that a distribution $\Delta OPL(\alpha_R, \theta_R)$ of the optical path differences as a function of the azimuth angle $\alpha_R$ and the aperture angle $\theta_R$ has significantly reduced values of $\Delta OPL$ in comparison to an arrangement where said (111)-lenses are not arranged with said rotation relative to each other.

2. The objective of claim 1, wherein the values of the distribution $\Delta OPL(\alpha_R, \theta_R)$ of the optical path differences as a function of the azimuth angle $\alpha_R$ at a fixed aperture angle $\theta_0$ vary by less than 20%, said percentage being relative to a maximum value of the distribution $\Delta OPL(\alpha_R, \theta_R)$ of the optical path differences.

3. The objective of claim 1, wherein said (111)-lenses are arranged with an angle of rotation $\gamma$ relative to each other about the lens axes, wherein a number n of (111)-lenses form a group and the angle of rotation $\gamma$ between two of the (111)-lenses of said group conforms to the equation $$\gamma = \frac{120°}{n} + m \cdot 120° \pm 8°$$

with m representing an integer.

4. The objective of claim 3, wherein an outermost aperture ray of the bundle of light rays has a lens-specific aperture angle $\theta_L$ within each of the (111)-lenses, and wherein said lens-specific aperture angle $\theta_L$ varies for the (111)-lenses of said group by no more than 30%, said percentage being relative to a maximum aperture angle among all (111)-lenses of said group.

5. The objective of claim 3, wherein an outermost aperture ray of the bundle of light rays travels a lens-specific path length $RL_L$ within each of the (111)-lenses, and wherein said lens-specific path length $RL_L$ varies for the (111)-lenses of said group by no more than 30%, said percentage being relative to a maximum path length among all (111)-lenses of said group.

6. The objective of claim 3, wherein an outermost aperture ray of the bundle of light rays is subject to a lens-specific optical path difference $\Delta OPL$ within each of the (111)-lenses which is determined for non-rotated (111)-lenses, and wherein said lens-specific optical path difference $\Delta OPL$ varies for the (111)-lenses of said group by no more than 30%, said percentage being relative to a maximum optical path difference among all (111)-lenses of said group.

7. The objective of claim 3, comprising at least two groups of (111)-lenses, wherein the (111)-lenses within each of the at least two groups are rotated relative to each other.

8. An objective comprising a plurality of lenses, wherein at least two lenses consist of fluoride crystal material with a cubic lattice structure and wherein said fluoride crystal lenses are (100)-lenses each having a lens axis oriented approximately perpendicular to the {100}-planes or to crystallographic planes that are equivalent to the {100}-planes of the fluoride crystal, wherein an image point in an image plane is formed at a convergence of a bundle of light rays each of which has an azimuth angle $\alpha_R$, an aperture angle $\theta_R$ and an optical path difference $\Delta OPL$ for two mutually orthogonal states of linear polarization, wherein said (100)-lenses are arranged with a rotation relative to each other about the lens axes in such a manner that a distribution $\Delta OPL(\alpha_R, \theta_R)$ of the optical path differences as a function of the azimuth angle $\alpha_R$ and the aperture angle $\theta_R$ has significantly reduced values of $\Delta OPL$ in comparison to an arrangement where said (100)-lenses are not arranged with said rotation relative to each other.

9. The objective of claim 8, wherein the values of the distribution $\Delta OPL(\alpha_R, \theta_R)$ of the optical path differences as a function of the azimuth angle $\alpha_R$ at a fixed aperture angle $\theta_0$ vary by less than 20%, said percentage being relative to a maximum values of the distribution $\Delta OPL(\alpha_R, \theta_R)$ of the optical path differences.

10. The objective of claim 8, wherein said (100)-lenses are arranged with an angle of rotation $\gamma$ relative to each other about the lens axes, wherein a number n of (100)-lenses form a group and the angle of rotation $\gamma$ between two of the (100)-lenses of said group conforms to the equation $$\gamma = \frac{90°}{n} + m \cdot 90° \pm 5°$$

with m representing an integer.

11. The objective of claim 10, wherein an outermost aperture ray of the bundle of light rays has a lens-specific aperture angle $\theta_L$ within each of the (100)-lenses, and wherein said lens-specific aperture angle $\theta_L$ varies for the (100)-lenses of said group by no more than 30%, said percentage being relative to a maximum aperture angle among all (100)-lenses of said group.

12. The objective of claim 10, wherein an outermost aperture ray of the bundle of light rays travels a lens-specific path length $RL_L$ within each of the (100)-lenses, and wherein said lens-specific path length $RL_L$ varies for the (100)-lenses of said group by no more than 30%, said percentage being relative to a maximum path length among all (100)-lenses of said group.

13. The objective of claim 10, wherein an outermost aperture ray of the bundle of light rays is subject to a lens-specific optical path difference $\Delta OPL$ within each of the (100)-lenses which is determined for non-rotated (100)-lenses, and wherein said lens-specific optical path difference $\Delta OPL$ varies for the (100)-lenses of said group by no more than 30%, said percentage being relative to a maximum optical path difference among all (100)-lenses of said group.

14. The objective of claim 10, comprising at least two groups of (100)-lenses, wherein the (100)-lenses within each of the at least two groups are rotated relative to each other.

15. A method of manufacturing objectives that comprise at least two fluoride crystal lenses, wherein the term lenses means lenses as well as lens parts, wherein said fluoride crystal lenses are (100)-lenses each having a lens axis oriented approximately perpendicular to the $\{100\}$-planes or to crystallographic planes that are equivalent to the $\{100\}$-planes of the fluoride crystal, the method comprising the steps of:
 a) determining a distribution function $\Delta OPL(\alpha_R, \theta_R)$ of optical path differences $\Delta OPL$ for light rays belonging to a bundle of rays traveling through the objective, wherein $\alpha_R$ represents an azimuth angle, $\theta_R$ represents an aperture angle, and $\Delta OPL$ represents an optical path difference of each light ray for two mutually orthogonal states of linear polarization in an image plane of the objective, and
 b) arranging the (100)-lenses in rotated positions relative to each other about the lens axes in such a manner that a remaining distribution function $\Delta OPL(\alpha_R, \theta_R)$ is significantly reduced in magnitude compared to an arrangement where the (100)-lenses are not arranged in said rotated positions.

16. A method of manufacturing objectives that comprises a plurality of lenses, wherein at least two lenses of at least one first group consist of fluoride crystal material with a cubic lattice structure and wherein said fluoride crystal lenses are (111)-lenses each having a lens axis oriented approximately perpendicular to the $\{111\}$-planes or to crystallographic planes that are equivalent to the $\{111\}$-planes of the fluoride crystal,
 and wherein at least two lenses of at least one second group consist of fluoride crystal material with a cubic lattice structure and wherein said fluoride crystal lenses are (100)-lenses each having a lens axis oriented approximately perpendicular to the $\{100\}$-planes or to crystallographic planes that are equivalent to the $\{100\}$-planes of the fluoride crystal, the method comprising the steps of:
 a) determining a distribution function $\Delta OPL(\alpha_R, \theta_R)$ of optical path differences $\Delta OPL$ for light rays belonging to a bundle of rays traveling through the objective, wherein $\alpha_R$ represents an azimuth angle, $\theta_R$ represents an aperture angle, and $\Delta OPL$ represents an optical path difference of each light ray for two mutually orthogonal states of linear polarization in an image plane of the objective, and
 b) arranging said (111)-lenses of said first group and said (100)-lenses of said second group with a rotation relative to each other about the lens axes in such a manner that a remaining distribution function $\Delta OPL(\alpha_R, \theta_R)$ is significantly reduced in magnitude compared to an arrangement where said (111)-lenses of said first group and said (100)-lenses of said second group are not arranged with said rotation relative to each other.

17. An objective comprising at least two lenses consisting of fluoride crystal material, wherein the term lenses means lenses as well as lens parts, wherein said lenses have lens axes oriented substantially in a principal crystallographic direction, wherein an image point in an image plane (O') is formed at a convergence of a bundle of light rays each of which has an azimuth angle $\alpha_R$, an aperture angle $\theta_R$ and an optical path difference $\Delta OPL$ for two mutually orthogonal states of linear polarization, wherein the lenses are arranged with a rotation relative to each other about the lens axes in such a manner that a distribution $\Delta OPL(\alpha_R, \theta_R)$ of the optical path differences as a function of the azimuth angle $\alpha_R$ and the aperture angle $\theta_R$ has significantly reduced values of $\Delta OPL$ in comparison to an arrangement where said lenses are likewise oriented in said principal crystallographic direction but are not arranged with said rotation relative to each other.

18. The objective of claim 17, wherein the values of the distribution $\Delta OPL(\alpha_R, \theta_R)$ of the optical path differences as a function of the azimuth angle $\alpha_R$ at a fixed aperture angle $\theta_0$ vary by less than 30% relative to a maximum value of $\Delta OPL(\alpha_R, \theta_R)$.

19. The objective of claim 17, wherein the lens axes are oriented in the crystallographic <111>-direction or a principal crystallographic direction equivalent to the <111>-direction.

20. The objective of claim 17, wherein the lens axes are oriented in the crystallographic <100>-direction or a principal crystallographic direction equivalent to the <100>-direction.

21. The objective of claim 17, wherein the lens axes are oriented in the crystallographic <110>-direction or a principal crystallographic direction equivalent to the <110>-direction.

22. The objective of claim 17, wherein the objective conforms to at least one of the criteria that:
 the objective has a numerical aperture NA larger than 0.7 on the image side,
 the objective has a numerical aperture NA larger than 0.8 on the image side,
 the objective is designed to operate with wavelengths shorter than 200 nanometers,
 the objective is designed to operate with wavelengths shorter than 160 nanometers,
 the objective is a refractive objective,
 the objective is a catadioptric objective with lenses and at least one mirror, and
 all lenses of the objective consist of calcium fluoride.

23. The optical element of claim 17, wherein the fluoride crystal material comprises one of a calcium fluoride crystal, a strontium fluoride crystal, and a barium fluoride crystal.

24. The objective of claim 17, comprising at least one first group of lenses whose lens axes are oriented in the crystallographic <100>-direction or a <100>-equivalent principal crystallographic direction, and further comprising at least one second group of lenses whose lens axes are oriented in one of a first or second different crystallographic direction in relation to said first group.

25. The objective of claim 24, wherein said first different crystallographic direction consists of the <111>-direction or a <111>-equivalent principal crystallographic direction, and said second different crystallographic direction consists of the <110>-direction or a <110>-equivalent principal crystallographic direction.

26. The objective of claim 25, wherein the at least one first group causes a first distribution of optical path differences $\Delta OPL_1(\alpha_R, \theta_R)$, the at least one second group causes a second distribution of optical path differences $\Delta OPL_2(\alpha_R, \theta_R)$, and the objective causes a resultant distribution of optical path differences $\Delta OPL(\alpha_R, \theta_R)$ representing the superposition of said first and second distributions, and wherein the first distribution has a first maximum value that differs by no more than 30% from a second maximum value of the second distribution, said percentage being relative to the larger of the first and second maximum values.

27. The objective of claim 17, wherein each of the lenses has a birefringence distribution $\Delta n(\alpha_L, \theta_L)$ whose values $\Delta n$ depend on aperture angles $\theta_L$ relative to the lens axis and on azimuth angles $\alpha_L$ relative to a reference direction that is perpendicular to the lens axis, wherein the birefringence distribution $\Delta n(\alpha_L, \theta_L)$ has a k-fold azimuthal symmetry, wherein angles of rotation $\gamma$ are defined between the reference directions of the individual lenses, wherein a number n of lenses form a group in which the lens axes are oriented in the same or equivalent crystallographic directions, and wherein in said group the birefringence distributions $\Delta n(\alpha_L, \theta_L)$ relative to the reference directions have the same azimuthal profiles and the angle of rotation $\gamma$ between two of the lenses conforms to the equation $$\gamma = \frac{360°}{k \cdot n} + m \cdot \frac{360°}{k} \pm 10°$$

with m representing an integer.

28. The objective of claim 27, wherein an outermost aperture ray of the bundle of light rays has a lens-specific aperture angle $\theta_L$ within each of the lenses, and wherein said lens-specific aperture angle $\theta_L$ varies for the lenses of the group by no more than 30%, said percentage being relative to a maximum aperture angle among all lenses of the group.

29. The objective of claim 27, wherein an outermost aperture ray of the bundle of light rays travels a lens-specific path length $RL_L$ within each of the lenses, and wherein said lens-specific path length $RL_L$ varies for the lenses of the group by no more than 30%, said percentage being relative to a maximum path length among all lenses of the group.

30. The objective of claim 27, wherein an outermost aperture ray of the bundle of light rays is subject to a lens-specific optical path difference $\Delta OPL$ within each of the lenses which is determined for non-rotated lenses, and wherein said lens-specific optical path difference $\Delta OPL$ varies for the lenses of the group by no more than 30%, said percentage being relative to a maximum optical path difference among all lenses of the group.

31. The objective of claim 27, wherein the group comprises two to four lenses.

32. The objective of claim 31, wherein the lenses of the group are arranged next to each other.

33. The objective of claim 32, wherein the lenses of the group comprise lens parts joined together by wringing.

34. The objective of claim 27, comprising at least two groups of lenses, wherein the lenses within each of the at least two groups are rotated relative to each other.

35. The objective of claim 27, wherein the lens axes are oriented in the crystallographic <111>-direction or a principal crystallographic direction equivalent to the <111>-direction, and wherein the birefringence distribution $\Delta n(\alpha_L, \theta_L)$ of the lenses has a threefold azimuthal symmetry.

36. The objective of claim 27, wherein the lens axes are oriented in the crystallographic <100>-direction or a principal crystallographic direction equivalent to the <100>-direction, and wherein the birefringence distribution $\Delta n(\alpha_L, \theta_L)$ of the lenses has a fourfold azimuthal symmetry.

37. The objective of claim 27, wherein the lens axes are oriented in the crystallographic <110>-direction or a principal crystallographic direction equivalent to the <110>-direction, and wherein the birefringence distribution $\Delta n(\alpha_L, \theta_L)$ of the lenses has a twofold azimuthal symmetry.

38. The objective of claim 27, wherein the objective conforms to at least one of the criteria that:
the objective has a numerical aperture NA larger than 0.7 on the image side,
the objective has a numerical aperture NA larger than 0.8 on the image side,
the objective is designed to operate with wavelengths shorter than 200 nanometers,
the objective is designed to operate with wavelengths shorter than 160 nanometers,
the objective is a refractive objective,
the objective is a catadioptric objective with lenses and at least one mirror, and
all lenses of the objective consist of calcium fluoride.

39. The objective of claim 27, comprising at least one first group of lenses whose lens axes are oriented in the crystallographic <100>-direction or a <100>-equivalent principal crystallographic direction, and further comprising at least one second group of lenses whose lens axes are oriented in one of a first or second different crystallographic direction in relation to said first group.

40. The objective of claim 39, wherein said first different crystallographic direction consists of the <111>-direction or a <111>-equivalent principal crystallographic direction, and said second different crystallographic direction consists of the <110>-direction or a <110>-equivalent principal crystallographic direction.

41. The objective of claim 40, wherein the at least one first group causes a first distribution of optical path differences $\Delta OPL_1(\alpha_R, \theta_R)$, the at least one second group causes a second distribution of optical path differences $\Delta OPL_2(\alpha_R, \theta_R)$, and the objective causes a resultant distribution of optical path differences $\Delta OPL(\alpha_R, \theta_R)$ representing the superposition of said first and second distributions, and wherein the first distribution has a first maximum value that differs by no more than 30% from a second maximum value of the second distribution, said percentage being relative to the larger of the first and second maximum values.

42. The objective of claim 17, wherein each of the lenses has a birefringence distribution $\Delta n(\alpha_L, \theta_L)$ whose values $\Delta n$ depend on aperture angles $\theta_L$ relative to the lens axis and on azimuth angles $\alpha_L$ relative to a reference direction that is perpendicular to the lens axis, wherein the birefringence distribution $\Delta n(\alpha_L, \theta_L)$ has a k-fold azimuthal symmetry, wherein angles of rotation $\gamma$ are defined between the reference directions of the individual lenses, wherein a number n of subgroups of lenses form a group in which the lens axes are oriented in the same or equivalent crystallographic directions, and wherein in said group the birefringence distributions $\Delta n(\alpha_L, \theta_L)$ relative to the reference directions have the same azimuthal profiles, wherein each of the n subgroups comprises at least one lens, wherein the angle of rotation γ between any two of the lenses within one of the subgroups conforms to the equation $$\gamma = 1 \cdot \frac{360°}{k} \pm 10°$$

and the angle of rotation γ between two lenses from different subgroups conforms to the equation $$\gamma = \frac{360°}{k \cdot n} + m \cdot \frac{360°}{k} \pm 10°$$

with 1 and m representing integer numbers.

43. The objective of claim 42, comprising at least two groups of lenses, wherein the lenses within each of the at least two groups are rotated relative to each other.

44. The objective of claim 42, wherein the lens axes are oriented in the crystallographic <111>-direction or a principal crystallographic direction equivalent to the <111>-direction, and wherein the birefringence distribution $\Delta n(\alpha_L, \theta_L)$ of the lenses has a threefold azimuthal symmetry.

45. The objective of claim 42, wherein the lens axes are oriented in the crystallographic <100>-direction or a principal crystallographic direction equivalent to the <100>-direction, and wherein the birefringence distribution $\Delta n(\alpha_L, \theta_L)$ of the lenses has a fourfold azimuthal symmetry.

46. The objective of claim 42, wherein the lens axes are oriented in the crystallographic <110>-direction or a principal crystallographic direction equivalent to the <110>-direction, and wherein the birefringence distribution $\Delta n(\alpha_L, \theta_L)$ of the lenses has a twofold azimuthal symmetry.

47. The objective of claim 42, wherein the objective conforms to at least one of the criteria that:
  the objective has a numerical aperture NA larger than 0.7 on the image side,
  the objective has a numerical aperture NA larger than 0.8 on the image side,
  the objective is designed to operate with wavelengths shorter than 200 nanometers,
  the objective is designed to operate with wavelengths shorter than 160 nanometers,
  the objective is a refractive objective,
  the objective is a catadioptric objective with lenses and at least one mirror, and
  all lenses of the objective consist of calcium fluoride.

48. The objective of claim 42, comprising at least one first group of lenses whose lens axes are oriented in the crystallographic <100>-direction or a <100>-equivalent principal crystallographic direction, and further comprising at least one second group of lenses whose lens axes are oriented in one of a first or second different crystallographic direction in relation to said first group.

49. The objective of claim 48, wherein said first different crystallographic direction consists of the <111>-direction or a <111>-equivalent principal crystallographic direction, and said second different crystallographic direction consists of the <110>-direction or a <110>-equivalent principal crystallographic direction.

50. The objective of claim 49, wherein the at least one first group causes a first distribution of optical path differences $\Delta OPL_1(\alpha_R, \theta_R)$, the at least one second group causes a second distribution of optical path differences $\Delta OPL_2(\alpha_R, \theta_R)$, and the objective causes a resultant distribution of optical path differences $\Delta OPL(\alpha_R, \theta_R)$ representing the superposition of said first and second distributions, and wherein the first distribution has a first maximum value that differs by no more than 30% from a second maximum value of the second distribution, said percentage being relative to the larger of the first and second maximum values.

51. A microlithography projection system, comprising an illumination system and further comprising the objective of claim 17, wherein the objective projects an image of a mask carrying a structure onto a light-sensitive substrate.

52. A method of manufacturing semiconductor components comprising a step in which the microlithography projection system of claim 51 is used.

53. A method of manufacturing objectives that comprise at least two fluoride crystal lenses, wherein the term lenses means lenses as well as lens parts, wherein said lenses have lens axes and each of said lens axes is oriented substantially in a principal crystallographic direction, the method comprising the steps of:
  a) determining a distribution function $\Delta OPL(\alpha_R, \theta_R)$ of optical path differences $\Delta OPL$ for light rays belonging to a bundle of rays traveling through the objective, wherein $\alpha_R$ represents an azimuth angle, $\theta_R$ represents an aperture angle, and $\Delta OPL$ represents an optical path difference of each light ray for two mutually orthogonal states of linear polarization in an image plane of the objective, and
  b) arranging the lenses in rotated positions relative to each other about the lens axes in such a manner that a remaining distribution function $\Delta OPL(\alpha_R, \theta_R)$ is significantly reduced in magnitude compared to an arrangement where each lens is oriented likewise in said principal crystallographic direction but where the lenses are not arranged in said rotated positions.

54. The method of claim 53, wherein the objective comprises at least one first group of lenses whose lens axes are oriented in the crystallographic <100>-direction or a <100>-equivalent principal crystallographic direction, and at least one second group of lenses whose lens axes are oriented in the crystallographic <111>-direction or a <111>-equivalent principal crystallographic direction.

55. The method of claim 53, wherein the objective comprises at least one first group of lenses whose lens axes are oriented in the crystallographic <100>-direction or a <100>-equivalent principal crystallographic direction, and at least one second group of lenses whose lens axes are oriented in the crystallographic <110>-direction or a <110>-equivalent principal crystallographic direction.

56. An objective comprising at least two lenses consisting of fluoride crystal material, wherein the term lenses means lenses as well as lens parts, wherein said lenses have lens axes oriented substantially in a principal crystallographic direction, wherein an image point in an image plane is formed at a convergence of a bundle of light rays each of which has an azimuth angle $\alpha_R$, an aperture angle $\theta_R$ and an optical path difference $\Delta OPL$ for two mutually orthogonal states of linear polarization, wherein the lenses are arranged with a rotation relative to each other about the lens axes in such a manner that a distribution $\Delta OPL(\alpha_R, \theta_R)$ of the optical path differences as a function of the azimuth angle $\alpha_R$ and the aperture angle $\theta_R$ has significantly reduced values of $\Delta OPL$ in comparison to an arrangement where said lenses are likewise oriented in said principal crystallographic direction but are not arranged with said rotation relative to each other, wherein said objective comprises a composite lens in which a plurality of plates consisting of crystal material are seamlessly joined together, said plates being crystallographically oriented at mutually rotated positions relative to a normal axis of each plate.

* * * * *